(12) United States Patent
Nielsen et al.

(10) Patent No.: US 11,475,052 B1
(45) Date of Patent: Oct. 18, 2022

US011475052B1

(54) USING VISUAL CUES TO VALIDATE OBJECT MODELS OF DATABASE TABLES

(71) Applicant: Tableau Software, Inc., Seattle, WA (US)

(72) Inventors: Britta Claire Nielsen, Seattle, WA (US); Jeffrey Jon Weir, Seattle, WA (US)

(73) Assignee: TABLEAU SOFTWARE, INC., Seattle, WA (US)

( * ) Notice: Subject to any disclaimer, the term of this patent is extended or adjusted under 35 U.S.C. 154(b) by 151 days.

(21) Appl. No.: 16/679,111

(22) Filed: Nov. 8, 2019

(51) Int. Cl.
*G06F 16/28* (2019.01)
*G06F 16/22* (2019.01)
*G06F 16/23* (2019.01)
*G06F 16/248* (2019.01)

(52) U.S. Cl.
CPC ........ *G06F 16/287* (2019.01); *G06F 16/2246* (2019.01); *G06F 16/2282* (2019.01); *G06F 16/23* (2019.01); *G06F 16/248* (2019.01)

(58) Field of Classification Search
CPC .... G06F 16/287; G06F 16/2246; G06F 16/23; G06F 16/2282; G06F 16/248
See application file for complete search history.

(56) References Cited

U.S. PATENT DOCUMENTS 5,966,126 A * 10/1999 Szabo ................ G06F 16/2428
715/762
6,052,687 A * 4/2000 Miura .................... G06F 16/94
9,619,115 B2 * 4/2017 Kim ....................... G09G 5/377
10,345,961 B1 * 7/2019 Smith ................... G06F 9/4843
10,573,407 B2 * 2/2020 Ginsburg ............ G06F 3/04842
10,685,283 B2 * 6/2020 Li ......................... G06F 16/248
10,698,594 B2 * 6/2020 Sanches .............. G06F 3/04817
10,719,527 B2 * 7/2020 Shankar .............. G06F 16/2455
10,997,217 B1 * 5/2021 Nielsen ................ G06F 16/287
2004/0002829 A1 * 1/2004 Iguchi .................... H01L 22/20
702/118
2004/0181543 A1 * 9/2004 Wu ........................ G06F 16/26
2005/0004911 A1 * 1/2005 Goldberg ............ G06F 16/2428
2007/0094060 A1 * 4/2007 Apps .................. G06F 16/2465
705/7.36
2008/0155440 A1 * 6/2008 Trevor .................. G06Q 30/02
715/769
2009/0012813 A1 * 1/2009 Berzansky ............ G16H 10/60
705/2
2011/0302551 A1 * 12/2011 Hummel, Jr. ....... G06F 3/04842
717/105

(Continued)

*Primary Examiner* — Michael Roswell
(74) *Attorney, Agent, or Firm* — Morgan, Lewis & Bockius LLP

(57) ABSTRACT

A computer displays data sources associated with tables of data. The computer also displays a tree of data object icons, each representing a logical combination of tables. While displaying the data sources and the data object icons, the computer detects a portion of an input on a candidate data object icon. In response, the computer determines linking fields corresponding to a neighboring data object icon and linking fields corresponding to the candidate object icon. The computer displays options for a user to select linking fields. In response to detecting selection of linking fields, the computer validates the selection and/or updates the tree of data object icons based on the selected linking fields.

18 Claims, 72 Drawing Sheets

(56) References Cited

U.S. PATENT DOCUMENTS

| | | | | |
|---|---|---|---|---|
| 2014/0108985 | A1* | 4/2014 | Scott | G06F 3/0484 715/771 |
| 2014/0173401 | A1* | 6/2014 | Oshlag | G06F 40/18 715/212 |
| 2015/0212717 | A1* | 7/2015 | Nair | G06F 9/451 715/769 |
| 2015/0286679 | A1* | 10/2015 | Dave | G06F 16/2282 707/718 |
| 2015/0347501 | A1* | 12/2015 | Goshen | G06F 16/248 707/722 |
| 2016/0070430 | A1* | 3/2016 | Kim | G06F 3/04817 715/769 |
| 2016/0070451 | A1* | 3/2016 | Kim | G06Q 10/06 715/765 |
| 2016/0246490 | A1* | 8/2016 | Cabral | G06F 3/0481 |
| 2017/0193036 | A1* | 7/2017 | Yueh | G06F 3/0482 |
| 2018/0129369 | A1* | 5/2018 | Kim | G06F 16/254 |
| 2018/0129374 | A1* | 5/2018 | Kim | G06F 16/26 |
| 2019/0108046 | A1* | 4/2019 | Spencer-Harper | G06F 9/451 |
| 2020/0167353 | A1* | 5/2020 | Kraus | G06F 16/2282 |

* cited by examiner

Figure 1B

Data Visualization User Interface 108

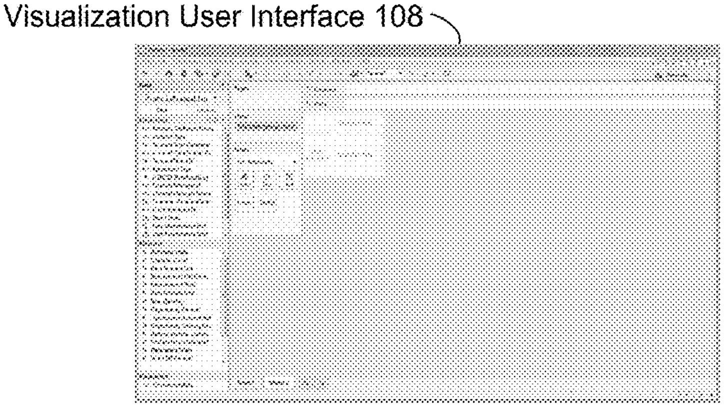

110

Visual Specification:
identifies the Data Sources;
identifies the data fields assigned to visual variables Object Model 106

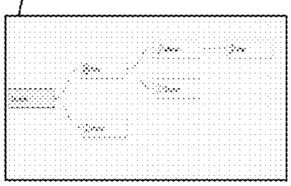

112

Group the data fields in the Visual Specification into one or more data field sets according to the Object Model of the Data Sources

114

Query the Data Sources for the first data field set

102

Data Source(s)

116

Query the Data Sources for the second data field set

...

Data Visualization 118

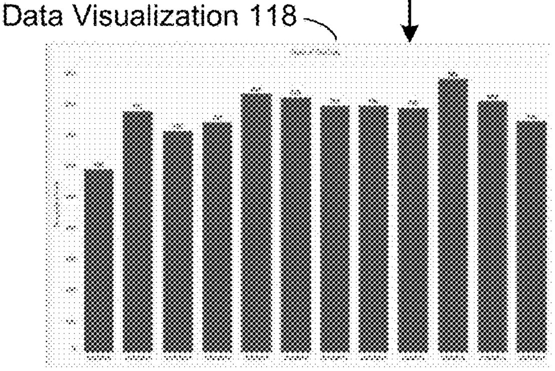

Data Visualization 120

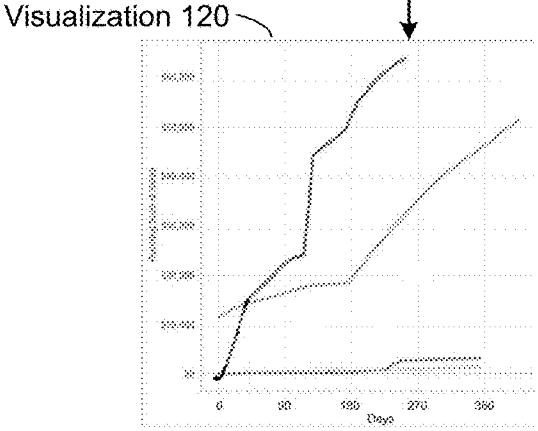

USING VISUAL CUES TO VALIDATE OBJECT MODELS OF DATABASE TABLES

RELATED APPLICATIONS

This application is related to U.S. patent application Ser. No. 16/572,506, filed Sep. 16, 2019, entitled "Systems and Methods for Visually Building an Object Model of Database Tables," which is incorporated by reference herein in its entirety.

This application is related to U.S. patent application Ser. No. 16/236,611, filed Dec. 30, 2018, entitled "Generating Data Visualizations According to an Object Model of Selected Data Sources," which claims priority to U.S. Provisional Patent Application No. 62/748,968, filed Oct. 22, 2018, entitled "Using an Object Model of Heterogeneous Data to Facilitate Building Data Visualizations," each of which is incorporated by reference herein in its entirety.

This application is related to U.S. patent application Ser. No. 16/236,612, filed Dec. 30, 2018, entitled "Generating Data Visualizations According to an Object Model of Selected Data Sources," which is incorporated by reference herein in its entirety.

This application is related to U.S. patent application Ser. No. 16/570,969, filed Sep. 13, 2019, entitled "Utilizing Appropriate Measure Aggregation for Generating Data Visualizations of Multi-fact Datasets," which is incorporated by reference herein in its entirety.

This application is related to U.S. patent application Ser. No. 15/911,026, filed Mar. 2, 2018, entitled "Using an Object Model of Heterogeneous Data to Facilitate Building Data Visualizations," which claims priority to U.S. Provisional Patent Application 62/569,976, filed Oct. 9, 2017, "Using an Object Model of Heterogeneous Data to Facilitate Building Data Visualizations," each of which is incorporated by reference herein in its entirety.

This application is related to U.S. patent application Ser. No. 14/801,750, filed Jul. 16, 2015, entitled "Systems and Methods for using Multiple Aggregation Levels in a Single Data Visualization," and U.S. patent application Ser. No. 15/497,130, filed Apr. 25, 2017, entitled "Blending and Visualizing Data from Multiple Data Sources," which is a continuation of U.S. patent application Ser. No. 14/054,803, filed Oct. 15, 2013, entitled "Blending and Visualizing Data from Multiple Data Sources," now U.S. Pat. No. 9,633,076, which claims priority to U.S. Provisional Patent Application No. 61/714,181, filed Oct. 15, 2012, entitled "Blending and Visualizing Data from Multiple Data Sources," each of which is incorporated by reference herein in its entirety.

TECHNICAL FIELD

The disclosed implementations relate generally to data visualization and more specifically to systems and methods that facilitate building and validating object models of a data source for generating data visualizations.

BACKGROUND

Data visualization applications enable a user to understand a data set visually, including distribution, trends, outliers, and other factors that are important to making business decisions. Some data visualization applications provide a user interface that enables users to build visualizations from a data source by selecting data fields and placing them into specific user interface regions to indirectly define a data visualization. However, when there are complex data sources and/or multiple data sources, it may be unclear what type of data visualization to generate (if any) based on a user's selections.

SUMMARY

In some cases, it can help to construct an object model of a data source before generating data visualizations. In some instances, one person is a particular expert on the data, and that person creates the object model. By storing the relationships in an object model, a data visualization application can leverage that information to assist all users who access the data, even if they are not experts. For example, other users can combine tables or augment an existing table or an object model.

An object is a collection of named attributes. An object often corresponds to a real-world object, event, or concept, such as a Store. The attributes are descriptions of the object that are conceptually at a 1:1 relationship with the object. Thus, a Store object may have a single [Manager Name] or [Employee Count] associated with it. At a physical level, an object is often stored as a row in a relational table, or as an object in JSON.

A class is a collection of objects that share the same attributes. It must be analytically meaningful to compare objects within a class and to aggregate over them. At a physical level, a class is often stored as a relational table, or as an array of objects in JSON.

An object model is a set of classes and a set of many-to-one relationships between them. Classes that are related by 1-to-1 relationships are conceptually treated as a single class, even if they are meaningfully distinct to a user. In addition, classes that are related by 1-to-1 relationships may be presented as distinct classes in the data visualization user interface. Many-to-many relationships are conceptually split into two many-to-one relationships by adding an associative table capturing the relationship.

Once a class model is constructed, a data visualization application can assist a user in various ways. In some implementations, based on data fields already selected and placed onto shelves in the user interface, the data visualization application can recommend additional fields or limit what actions can be taken to prevent unusable combinations. In some implementations, the data visualization application allows a user considerable freedom in selecting fields, and uses the object model to build one or more data visualizations according to what the user has selected.

In accordance with some implementations, a method facilitates visually building object models for data sources. The method is performed at a computer having one or more processors, a display, and memory. The memory stores one or more programs configured for execution by the one or more processors. The computer displays, in a connections region, a plurality of data sources. Each data source is associated with a respective one or more tables. The computer concurrently displays, in an object model visualization region, a tree having one or more data object icons. Each data object icon represents a logical combination of one or more tables. While concurrently displaying the tree of the one or more data object icons in the object model visualization region and the plurality of data sources in the connections region, the computer performs a sequence of operations. The computer detects, in the connections region, a first portion of an input on a first table associated with a first data source in the plurality of data sources. In response to detecting the first portion of the input on the first table, the computer generates a candidate data object icon corresponding to the first table. The computer also detects, in the connections region, a second portion of the input on the candidate data object icon. In response to detecting the second portion of the input on the candidate data object icon, the computer moves the candidate data object icon from the connections region to the object model visualization region. In response to moving the candidate data object icon to the object model visualization and while still detecting the input, the computer provides a visual cue to connect the candidate data object icon to a neighboring data object icon. The computer detects, in the object model visualization region, a third portion of the input on the candidate data object icon. In response to detecting the third portion of the input on the candidate data object icon, the computer displays a connection between the candidate data object icon and the neighboring data object icon, and updates the tree of the one or more data object icons to include the candidate data object icon.

In some implementations, prior to providing the visual cue, the computer performs a nearest object icon calculation that corresponds to the location of the candidate data object icon in the object model visualization region to identify the neighboring data object icon.

In some implementations, the computer provides the visual cue by displaying a Bézier curve between the candidate data object icon and the neighboring data object icon.

In some implementations, the computer detects, in the object model visualization region, a second input on a respective data object icon. In response to detecting the second input on the respective data object icon, the computer provides an affordance to edit the respective data object icon. In some implementations, the computer detects, in the object model visualization region, a selection of the affordance to edit the respective data object icon. In response to detecting the selection of the affordance to edit the respective data object icon, the computer displays, in the object model visualization region, a second set of one or more data object icons corresponding to the respective data object icon. In some implementations, the computer displays an affordance to revert to displaying a state of the object model visualization region prior to detecting the second input.

In some implementations, the computer displays a respective type icon corresponding to each data object icon. In some implementations, each type icon indicates whether the corresponding data object icon specifies a join, a union, or custom SQL statements. In some implementations, the computer detects an input on a first type icon and, in response to detecting the input on the first type icon, the computer displays an editor for editing the corresponding data object icon.

In some implementations, in response to detecting that the candidate data object icon is moved over a first data object icon in the object model visualization region, depending on a relative position of the first data object icon with respect to the candidate data object icon, the computer either replaces the first data object icon with the candidate data object icon or displays shortcuts to combine the first data object icon with the candidate data object icon.

In some implementations, in response to detecting the third portion of the input on the candidate data object icon, the computer displays one or more affordances to select linking fields that connect the candidate data object icon with the neighboring data object icon. The computer detects a selection input on a respective affordance of the one or more affordances, and, in response to detecting the selection input, the computer updates the tree of the one or more data object icons according to a linking field corresponding to the selection input. The updated tree is typically saved as a new or updated object model.

In some implementations, the input is a drag and drop operation.

In some implementations, the computer generates the candidate data object icon by displaying the candidate data object icon in the connections region by superimposing the candidate data object icon over the first table.

In some implementations, the computer concurrently displays, in a data grid region, data fields corresponding to one or more of the data object icons. In some implementations, in response to detecting the third portion of the input on the candidate data object icon, the computer updates the data grid region to include data fields corresponding to the candidate data object icon.

In some implementations, the computer detects, in the object model visualization region, an input to delete a first data object icon. In response to detecting the input to delete the first data object icon, the computer removes one or more connections between the first data object icon and other data object icons in the object model visualization region, and updates the tree of the one or more data object icons to omit the candidate data object icon.

In some implementations, the computer displays a data prep flow icon corresponding to a data object icon, and detects an input on the data prep flow icon. In response to detecting the input on the data prep flow icon, the computer displays one or more steps of the data prep flow that define a process for calculating data for the data object icon. In some implementations, the computer detects a prep flow edit input on a respective step of the one or more steps of the data prep flow. In response to detecting the prep flow edit input, the computer displays one or more options to edit the respective step of the data prep flow. In some implementations, the computer displays an affordance to revert to displaying a state of the object model visualization region prior to detecting the input on the data prep flow icon.

In another aspect, in accordance with some implementations, a method facilitates visually forming and validating object models for data sources. The method is performed at a computer having one or more processors, a display, and memory. The memory stores one or more programs configured for execution by the one or more processors. The computer displays, in a connections region, a plurality of data sources. Each data source is associated with a respective one or more tables. The computer concurrently displays, in an object model visualization region, a tree having one or more data object icons. Each data object icon represents a logical combination of one or more tables. While concurrently displaying the tree of the one or more data object icons in the object model visualization region and the plurality of data sources in the connections region, the computer detects, in the object model visualization region, a first portion of an input on a candidate data object icon. In response to detecting the first portion of the input on the candidate data object icon, the computer determines a first set of linking fields corresponding to a neighboring data object icon and a second set of linking fields corresponding to the candidate data object icon. The computer also displays a first one or more affordances to select a first one or more linking fields from the first set of linking fields and the second set of linking fields that connects the candidate data object icon with the neighboring data object icon. The computer detects a first selection input on a respective affordance of the first one or more affordances. In response to detecting the first selection input, the computer updates the tree of the one or more data object icons according to a linking field corresponding to the first selection input. In some implementations, an object model is created or updated according to the updated tree.

In some implementations, the computer displays an affordance to revert to displaying a state of the object model visualization region prior to detecting the input.

In some implementations, the input comprises a drag and drop operation.

In some implementations, the computer concurrently displays, in a data grid region, data fields corresponding to one or more data object icons. In some implementations, in response to detecting the first selection input, the computer updates the data grid region to include data fields corresponding to the candidate data object icon and the neighboring data object icon.

In some implementations, the one or more affordances include (i) a first affordance to select linking fields that are calculated using the first set of linking fields and (ii) a second affordance to select linking fields that are calculated using the second set of linking fields.

In some implementations, in response to detecting the first selection input and prior to updating the tree of the one or more data object icons, the computer displays a second one or more affordances to select a second one or more linking fields from the first set of linking fields and the second set of linking fields that connects the candidate data object icon with the neighboring data object icon. The computer also detects a second selection input on a respective affordance of the second one or more affordances. In response to detecting the second selection input, the computer updates the tree of the one or more data object icons according to a linking field corresponding to the second selection input. In some implementations, an object model is created or updated according to the updated tree.

In some implementations, in response to detecting the first selection input, the computer displays an indication of the number of records that match when using the linking field corresponding to the first selection input.

In some implementations, in response to detecting the first selection input, the computer displays an indication of the number of matching records that are unique and an indication of number of matching records that are duplicates when using the linking field corresponding to the first selection input.

In accordance with some implementations, a system for generating data visualizations includes one or more processors, memory, and one or more programs stored in the memory. The programs are configured for execution by the one or more processors. The programs include instructions for performing any of the methods described herein.

In accordance with some implementations, a non-transitory computer readable storage medium stores one or more programs configured for execution by a computer system having one or more processors and memory. The one or more programs include instructions for performing any of the methods described herein.

Thus, methods, systems, and graphical user interfaces are provided for forming object models for data sources.

BRIEF DESCRIPTION OF THE DRAWINGS

For a better understanding of the aforementioned implementations of the invention as well as additional implementations, reference should be made to the Description of Implementations below, in conjunction with the following drawings in which like reference numerals refer to corresponding parts throughout the figures.

FIG. 1B illustrates conceptually a process of building a data visualization based on an object model in accordance with some implementations.

Like reference numerals refer to corresponding parts throughout the drawings.

Reference will now be made in detail to implementations, examples of which are illustrated in the accompanying drawings. In the following detailed description, numerous specific details are set forth in order to provide a thorough understanding of the present invention. However, it will be apparent to one of ordinary skill in the art that the present invention may be practiced without these specific details.

DESCRIPTION OF IMPLEMENTATIONS

Figure 1A:
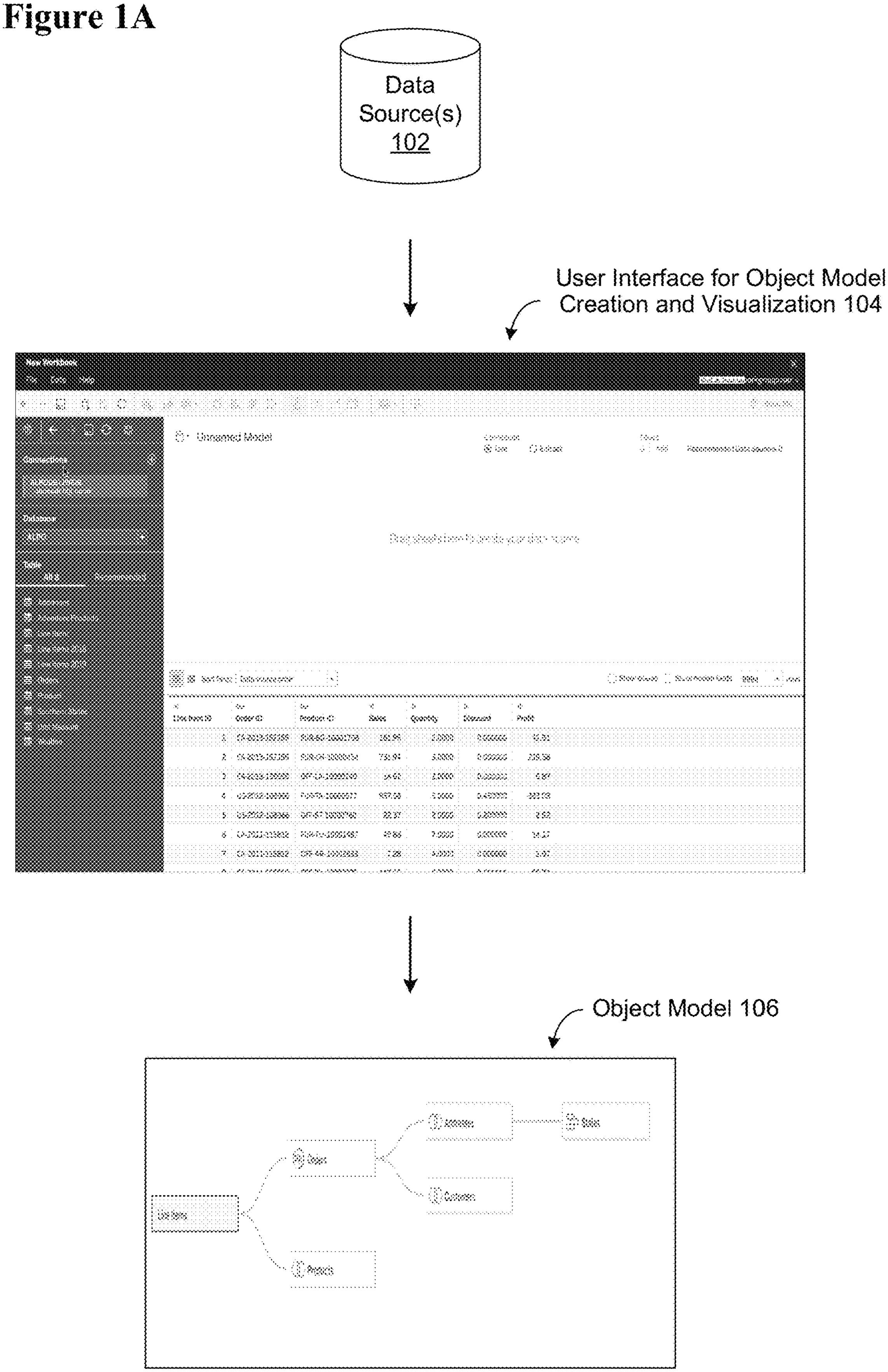
FIG. 1A illustrates conceptually a process of building an object model in accordance with some implementations.

FIG. 1A illustrates conceptually a process of building an object model 106 for data sources 102 using a graphical user interface 104, in accordance with some implementations. Some implementations use the object model to build appropriate data visualizations. In some instances, the object model 106 applies to one data source (e.g., one SQL database or one spreadsheet file), but the object model 106 may encompass two or more data sources. Typically, unrelated data sources have distinct object models. In some instances, the object model closely mimics the data model of the physical data sources (e.g., classes in the object model corresponding to tables in a SQL database). However, in some cases the object model 106 is more normalized (or less normalized) than the physical data sources. The object model 106 groups together attributes (e.g., data fields) that have a one-to-one relationship with each other to form classes, and identifies many-to-one relationships among the classes. In some illustrations below, the many-to-one relationships are illustrated with the "many" side of each relationship horizontally to the left of the "one" side of the relationship. In some implementations, the object model 106 identifies each of the data fields (attributes) as either a dimension or a measure. In the following, the letter "D" (or "d") is used to represent a dimension, whereas the latter "M" (or "m") is used to represent a measure. When the object model 106 is constructed, it can facilitate building data visualizations based on the data fields a user selects. Because a single data model can be used by an unlimited number of other people, building the object model for a data source is commonly delegated to a person who is a relative expert on the data source.

Some implementations allow a user to compose an object by combining multiple tables. Some implementations allow a user to expand an object via a join or a union with other objects. Some implementations provide drag-and-drop analytics to facilitate building an object model. Some implementations facilitate snapping and/or connecting objects or tables to an object model. These techniques and other related details are explained below in reference to FIGS. 3-14J, according to some implementations.

Some implementations of an interactive data visualization application use a data visualization user interface 108 to build a visual specification 110, as shown in FIG. 1B. The visual specification identifies one or more data sources 102, which may be stored locally (e.g., on the same device that is displaying the user interface 108) or may be stored externally (e.g., on a database server or in the cloud). The visual specification 110 also includes visual variables. The visual variables specify characteristics of the desired data visualization indirectly according to selected data fields from the data sources 102. In particular, a user assigns zero or more data fields to each of the visual variables, and the values of the data fields determine the data visualization that will be displayed.

In most instances, not all of the visual variables are used. In some instances, some of the visual variables have two or more assigned data fields. In this scenario, the order of the assigned data fields for the visual variable (e.g., the order in which the data fields were assigned to the visual variable by the user) typically affects how the data visualization is generated and displayed.

As a user adds data fields to the visual specification (e.g., indirectly by using the graphical user interface to place data fields onto shelves), the data visualization application 234 groups (112) together the user-selected data fields according to the object model 106. Such groups are called data field sets. In many cases, all of the user-selected data fields are in a single data field set. In some instances, there are two or more data field sets. Each measure m is in exactly one data field set, but each dimension d may be in more than one data field set.

The data visualization application 234 queries (114) the data sources 102 for the first data field set, and then generates a first data visualization 118 corresponding to the retrieved data. The first data visualization 118 is constructed according to the visual variables in the visual specification 110 that have assigned data fields from the first data field set. When there is only one data field set, all of the information in the visual specification 110 is used to build the first data visualization 118. When there are two or more data field sets, the first data visualization 118 is based on a first visual sub-specification consisting of all information relevant to the first data field set. For example, suppose the original visual specification 110 includes a filter that uses a data field f. If the field f is included in the first data field set, the filter is part of the first visual sub-specification, and thus used to generate the first data visualization 118.

When there is a second (or subsequent) data field set, the data visualization application 234 queries (116) the data sources 102 for the second (or subsequent) data field set, and then generates the second (or subsequent) data visualization 120 corresponding to the retrieved data. This data visualization 120 is constructed according to the visual variables in the visual specification 110 that have assigned data fields from the second (or subsequent) data field set.

Figure 2:
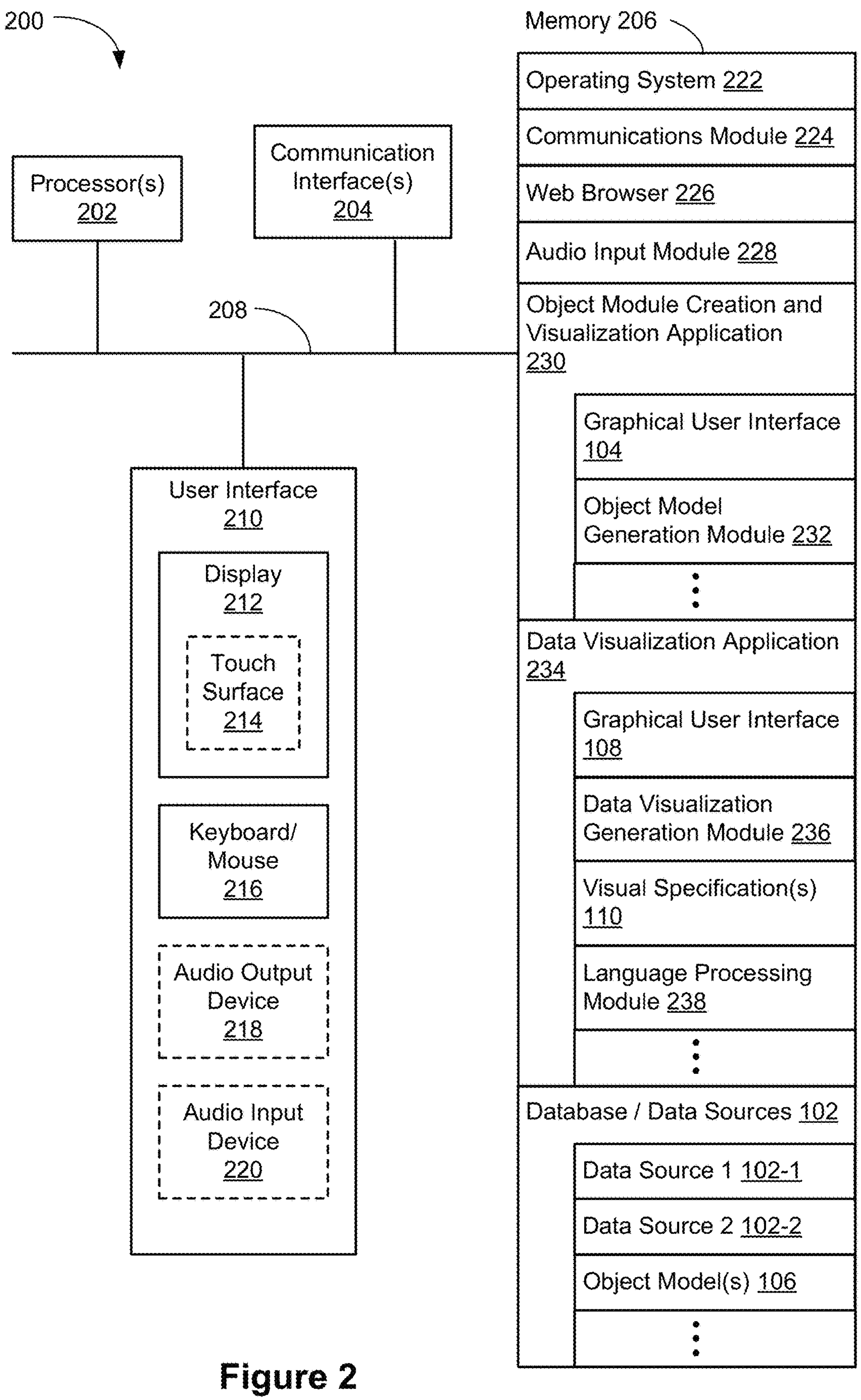
FIG. 2 is a block diagram of a computing device according to some implementations.

FIG. 2 is a block diagram illustrating a computing device 200 that can execute a data visualization application 234 to display a data visualization 118 (or the data visualization 120). In some implementations, the computing device displays a graphical user interface 108 for the data visualization application 234. Computing devices 200 include desktop computers, laptop computers, tablet computers, and other computing devices with a display and a processor capable of running a data visualization application 234. A computing device 200 typically includes one or more processing units/cores (CPUs) 202 for executing modules, programs, and/or instructions stored in the memory 206 and thereby performing processing operations; one or more network or other communications interfaces 204; memory 206; and one or more communication buses 208 for interconnecting these components. The communication buses 208 may include circuitry that interconnects and controls communications between system components. A computing device 200 includes a user interface 210 comprising a display 212 and one or more input devices or mechanisms. In some implementations, the input device/mechanism includes a keyboard 216; in some implementations, the input device/mechanism includes a "soft" keyboard, which is displayed as needed on the display 212, enabling a user to "press keys" that appear on the display 212. In some implementations, the display 212 and input device/mechanism comprise a touch screen display 214 (also called a touch sensitive display or a touch surface). In some implementations, the display is an integrated part of the computing device 200. In some implementations, the display is a separate display device. In some implementations, the computing device includes one or more audio output devices 218 (e.g., a speaker) and/or one or more audio input devices 220 (e.g., a microphone).

In some implementations, the memory 206 includes high-speed random-access memory, such as DRAM, SRAM, DDR RAM or other random-access solid-state memory devices. In some implementations, the memory 206 includes non-volatile memory, such as one or more magnetic disk storage devices, optical disk storage devices, flash memory devices, or other non-volatile solid-state storage devices. In some implementations, the memory 206 includes one or more storage devices remotely located from the CPUs 202. The memory 206, or alternatively the non-volatile memory devices within the memory 206, comprises a non-transitory computer-readable storage medium. In some implementations, the memory 206, or the computer-readable storage medium of the memory 206, stores the following programs, modules, and data structures, or a subset thereof:

- an operating system 222, which includes procedures for handling various basic system services and for performing hardware dependent tasks;
- a communication module 224, which is used for connecting the computing device 200 to other computers and devices via the one or more communication network interfaces 204 (wired or wireless) and one or more communication networks, such as the Internet, other wide area networks, local area networks, metropolitan area networks, and so on;
- a web browser 226 (or other client application), which enables a user to communicate over a network with remote computers or devices;
- optionally, an audio input module 228, which enables a user to provide audio input (e.g., using the audio input device 220) to the computing device 200;
- an object model creation and visualization application 230, which provides a graphical user interface 104 for a user to construct object models 106 by using an object model generation module 232 (which includes one or more backend components). For example, when a user adds a new object (e.g., by dragging an object), the user interface 104 communicates with the back end to create that new object in the model and to then create a relationship between the new object and the model. In some implementations, the user interface 104, either alone or in combination with the back end, chooses an existing object to link the new object to. Some implementations obtain details from the user for the relationship. In some implementations, the object model creation and visualization application 230 executes as a standalone application (e.g., a desktop application). In some implementations, the object model creation and visualization application 230 executes within the web browser 226. In some implementations, the object model creation and visualization application 230 accesses one or more stored object models 106, which identify the structure of the data sources 102. In an object model, the data fields (attributes) are organized into classes, where the attributes in each class have a one-to-one correspondence with each other. The object model also includes many-to-one relationships between the classes. In some instances, an object model maps each table within a database to a class, with many-to-one relationships between classes corresponding to foreign key relationships between the tables. In some instances, the data model of an underlying source does not cleanly map to an object model in this simple way, so the object model includes information that specifies how to transform the raw data into appropriate class objects. In some instances, the raw data source is a simple file (e.g., a spreadsheet), which is transformed into multiple classes;

a data visualization application 234, which provides a graphical user interface 108 for a user to construct visual graphics (e.g., an individual data visualization or a dashboard with a plurality of related data visualizations). In some implementations, the data visualization application 234 executes as a standalone application (e.g., a desktop application). In some implementations, the data visualization application 234 executes within the web browser 226. In some implementations, the data visualization application 234 includes:

a graphical user interface 108, which enables a user to build a data visualization by specifying elements visually, as illustrated in FIG. 4 below;

in some implementations, the user interface 108 includes a plurality of shelf regions, which are used to specify characteristics of a desired data visualization. In some implementations, the shelf regions include a columns shelf and a rows shelf, which are used to specify the arrangement of data in the desired data visualization. In general, fields that are placed on the columns shelf are used to define the columns in the data visualization (e.g., the x-coordinates of visual marks). Similarly, the fields placed on the rows shelf define the rows in the data visualization (e.g., the y-coordinates of the visual marks). In some implementations, the shelf regions include a filters shelf, which enables a user to limit the data viewed according to a selected data field (e.g., limit the data to rows for which a certain field has a specific value or has values in a specific range). In some implementations, the shelf regions include a marks shelf, which is used to specify various encodings of data marks. In some implementations, the marks shelf includes a color encoding icon (to specify colors of data marks based on a data field), a size encoding icon (to specify the size of data marks based on a data field), a text encoding icon (to specify labels associated with data marks), and a view level detail icon (to specify or modify the level of detail for the data visualization);

visual specifications 110, which are used to define characteristics of a desired data visualization. In some implementations, a visual specification 110 is built using the user interface 108. A visual specification includes identified data sources (i.e., specifies which data sources are selected), which provide enough information to find the data sources 102 (e.g., a data source name or network full path name). A visual specification 110 also includes visual variables, and the assigned data fields for each of the visual variables. In some implementations, a visual specification has visual variables corresponding to each of the shelf regions. In some implementations, the visual variables include other information as well, such as context information about the computing device 200, user preference information, or other data visualization features that are not implemented as shelf regions (e.g., analytic features);

a language processing module 238 (sometimes called a natural language processing module) for processing (e.g., interpreting) natural language inputs (e.g., commands) received (e.g., using a natural language input module). In some implementations, the natural language processing module 238 parses the natural language command (e.g., into tokens) and translates the command into an intermediate language (e.g., ArkLang). The natural language processing module 238 includes analytical expressions that are used by natural language processing module 238 to form intermediate expressions of the natural language command. The natural language processing module 238 also translates (e.g., compiles) the intermediate expressions into database queries by employing a visualization query language to issue the queries against a database or data source 102 and to retrieve one or more data sets from the database or data source 102;

a data visualization generation module 236, which generates and displays data visualizations according to visual specifications. In accordance with some implementations, the data visualization generator 236 uses an object model 106 to determine which dimensions in a visual specification 110 are reachable from the data fields in the visual specification. In some implementations, for each visual specification, this process forms one or more reachable dimension sets. Each reachable dimension set corresponds to a data field set, which generally includes one or more measures in addition to the reachable dimensions in the reachable dimension set; and zero or more databases or data sources 102 (e.g., a first data source 102-1 and a second data source 102-2), which are used by the data visualization application 234. In some implementations, the data sources are stored as spreadsheet files, CSV files, XML files, flat files, JSON files, tables in a relational database, cloud databases, or statistical databases. The database 102 also store the object models 106.

Each of the above identified executable modules, applications, or set of procedures may be stored in one or more of the previously mentioned memory devices, and corresponds to a set of instructions for performing a function described above. The above identified modules or programs (i.e., sets of instructions) need not be implemented as separate software programs, procedures, or modules, and thus various subsets of these modules may be combined or otherwise re-arranged in various implementations. In some implementations, the memory 206 stores a subset of the modules and data structures identified above. In some implementations, the memory 206 stores additional modules or data structures not described above.

Although FIG. 2 shows a computing device 200, FIG. 2 is intended more as functional description of the various features that may be present rather than as a structural schematic of the implementations described herein. In practice, and as recognized by those of ordinary skill in the art, items shown separately could be combined and some items could be separated.

Figure 3:
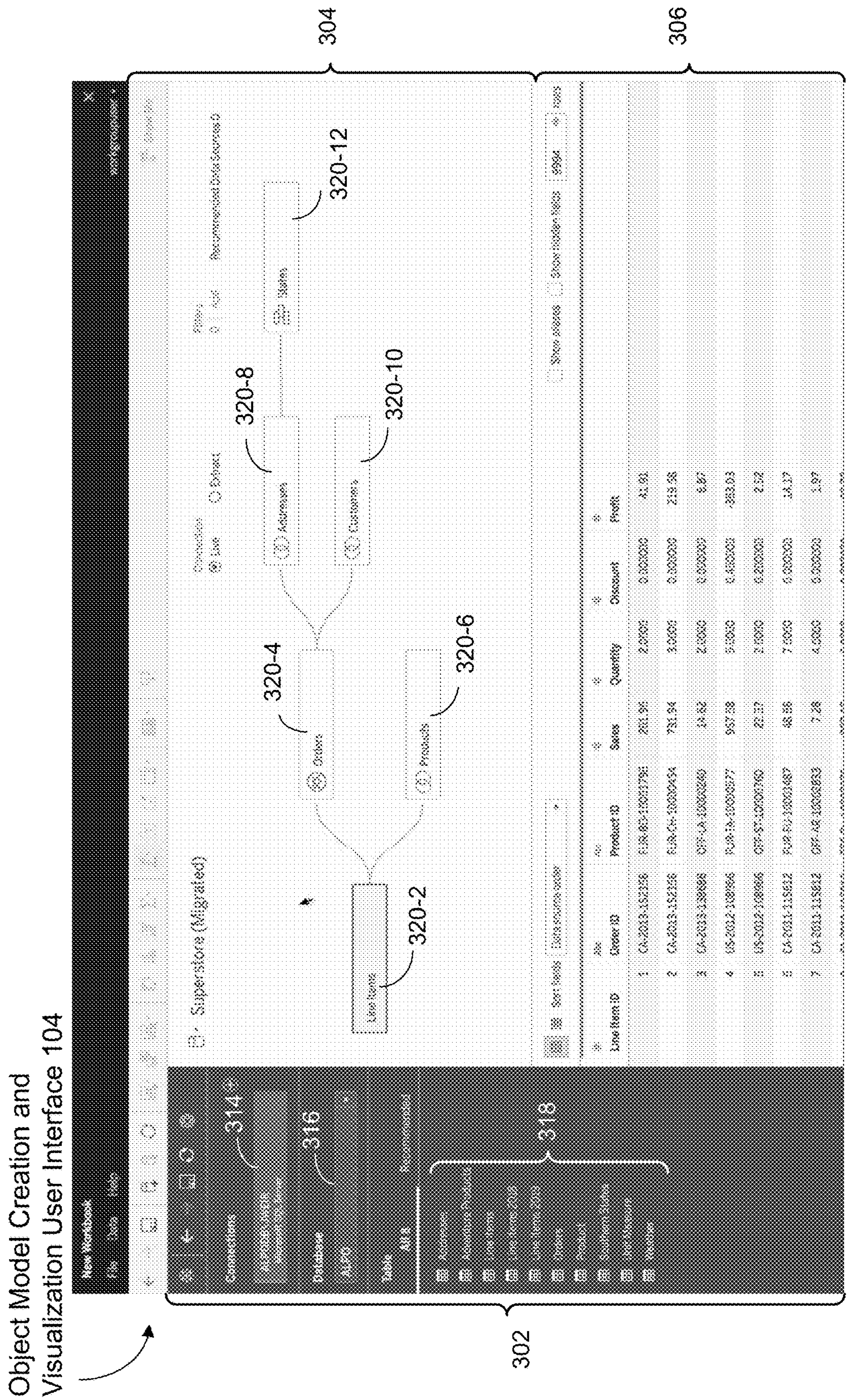
FIGS. 3, 4A-4B, 5A-5G, 6A-6F, 7A-7G, 8A-8J, 9A-9G, 10A-10E, and 11A-11D are screen shots illustrating various features of building object models according to some disclosed implementations.

FIG. 3 shows a screen shot of an example user interface 104 used for creating and/or visualizing object models, in accordance with some implementations. The user interface 104 includes a connections region 302 that displays data sources. The connections region 302 provides connections 314 to database servers that host databases 316 (or data sources). Each data source includes one or more tables of data 318 that may be selected and used to build an object model. In some implementations, the list of tables is grouped (e.g., according to a logical organization of the tables). The graphical user interface 104 also includes an object model visualization region 304. The object model visualization region 304 displays object models (e.g., a tree or a graph of data objects). The object model displayed include one or more data object icons (e.g., the icons 320-2, 320-4, 320-6, 320-8, 320-10, and 320-12). Each data object icon in turn represents either a table (e.g., a physical table) or a logical combination of one or more tables. For example, the icon 320-2 represents a Line Items table, and the icon 320-12 represents a States table. In some implementations, the interface 104 also includes a data grid region 306 that displays data fields of one or more data object icons displayed in the object model visualization region 304. In some implementations, the grid region 306 is updated or refreshed in response to detecting a user input in the object model visualization region 304. In FIG. 3, the visualization region 304 shows the Line Items object icon 320-2 highlighted and the grid region 306 displaying details (e.g., data fields) of the Line Items table corresponding to the object icon 320-2. In some implementations, the grid region 306 shows a first table (e.g., a root of a tree of logical tables or object model) to start with (e.g., when a preexisting object model is loaded, as explained further below in reference to FIG. 4A), without detecting a user input. If a user navigates away and/or selects an alternate object icon (e.g., the Orders icon 320-4), the grid region is updated to show details of the logical table (or physical table) corresponding to the alternate object icon (e.g., details of the Orders table).

Figure 4A:
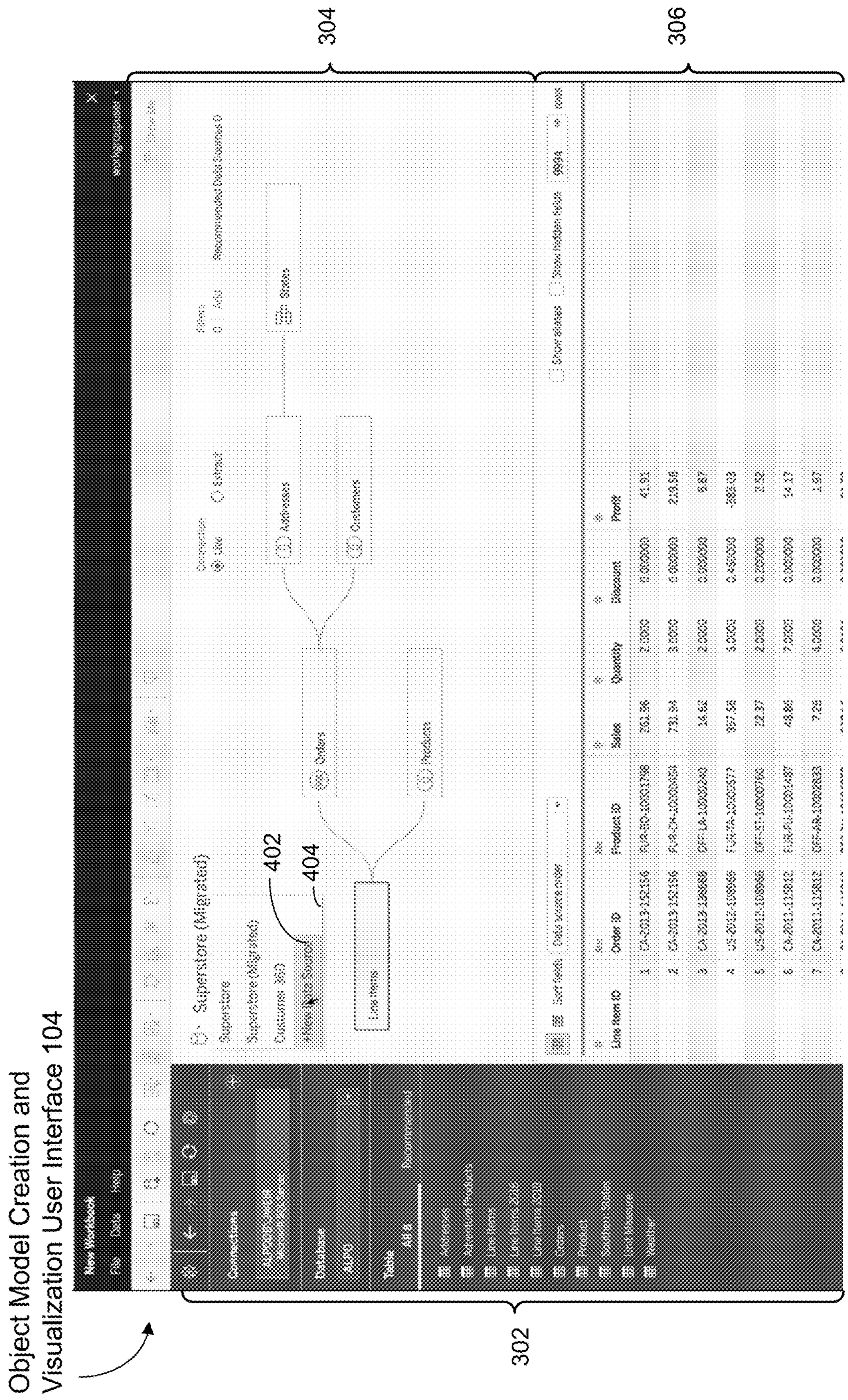
Figure 4B:
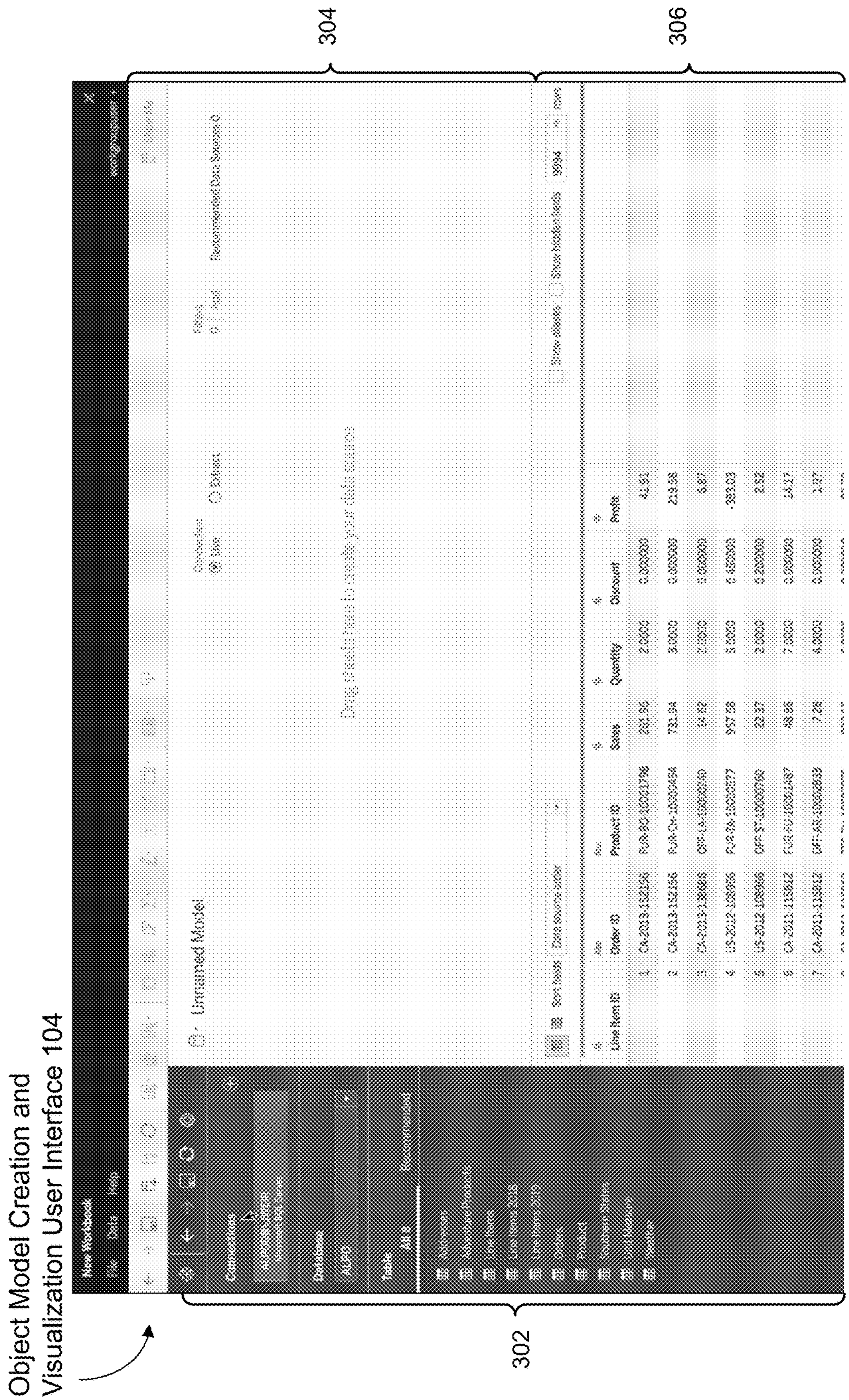

FIGS. 4A and 4B are screen shots of the example user interface 104 for creating a new object model, in accordance with some implementations. FIG. 4A corresponds to a situation where the object model visualization region 304 is displaying an object model, and a user navigates (e.g., moves or drags a cursor) to select an affordance 402 for a new data source. In some implementations, the affordance 402 is an option displayed as part of a pull-down menu 404 of available object models. FIG. 4B is a screen shot that illustrates the state of the object model visualization region 304 after a user has selected to create a new object model, in accordance with some implementations. As illustrated, the visualization region 304 is initially empty or does not shown any object icons. In some implementations, the data grid region 306 is also cleared to not show any data fields.

Figure 5A:

FIGS. 5A-5G are screen shots that illustrate a process for creating object models using the example user interface, in accordance with some implementations. Similar to FIG. 4A, a user starts with a clear canvas in the visualization region 304. When the user selects one of the tables in the connections region 302, the system generates a candidate object icon 502. Some implementations create a shadow object (e.g., a rectangular object) and superimpose the object over or on the table selected by the user. In FIG. 5A, the user selects the Line Items table, so a new (candidate) object icon (the rectangular shadow object) is created for that table.

Figure 5B:

FIG. 5B is a screen shot showing that the user has moved or dragged the icon 502 from the connections region 302 to the object model visualization region 304, in accordance with some implementations.

Figure 5C:
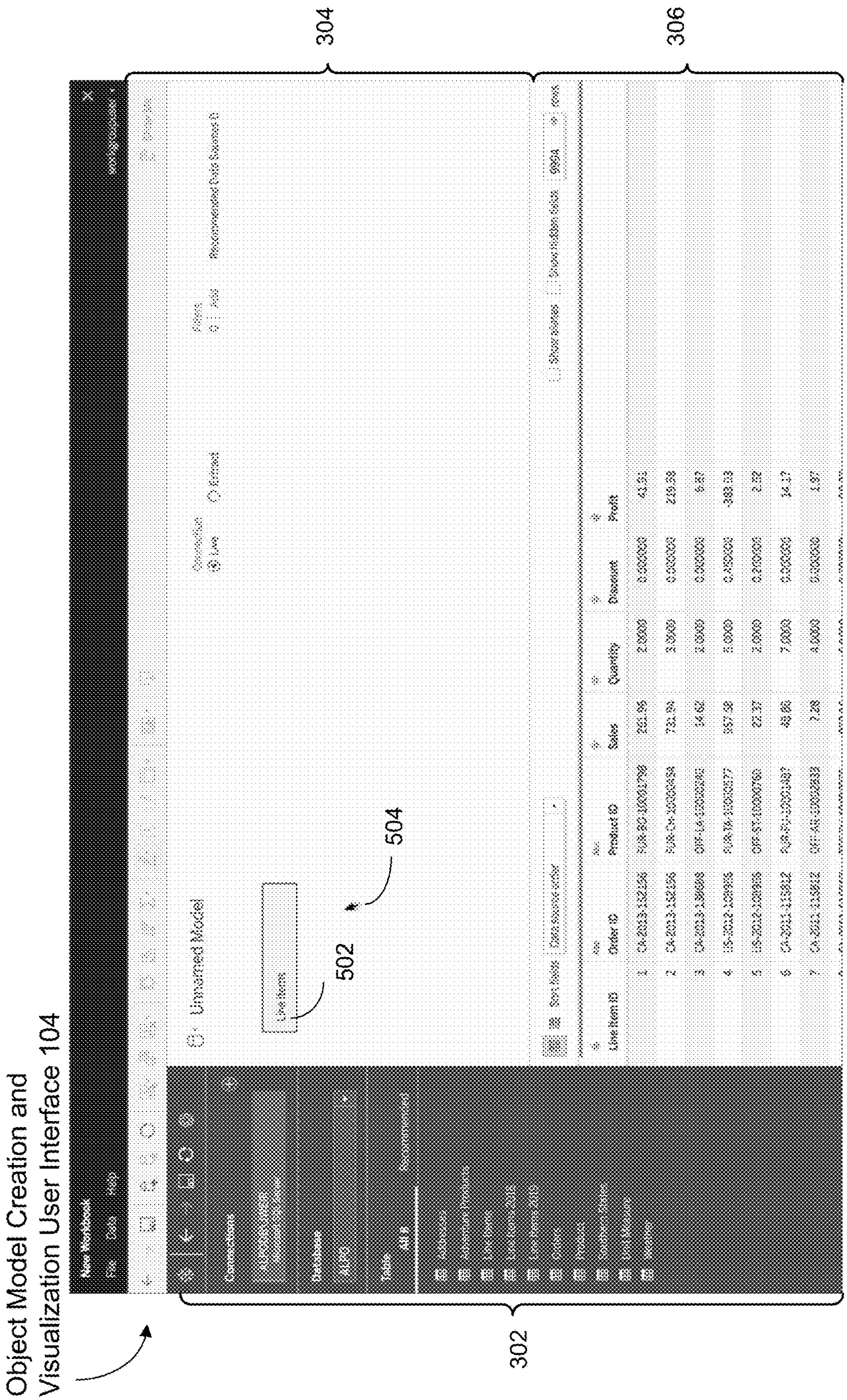

FIG. 5C is a screen shot showing that the user has moved or dragged the icon 502 to the visualization region 304 (as indicated by the position 504 of the cursor or arrow) in the object model visualization region 304, in accordance with some implementations. Since the icon 502 moved to the visualization region 302 is the first such icon, the system automatically identifies the table (Line Items) as the root of a new object model tree. In some implementations, the data grid region 306 is automatically refreshed to display data for the data fields of the table corresponding to the object icon (the Line Items table in this example).

Figure 5D:
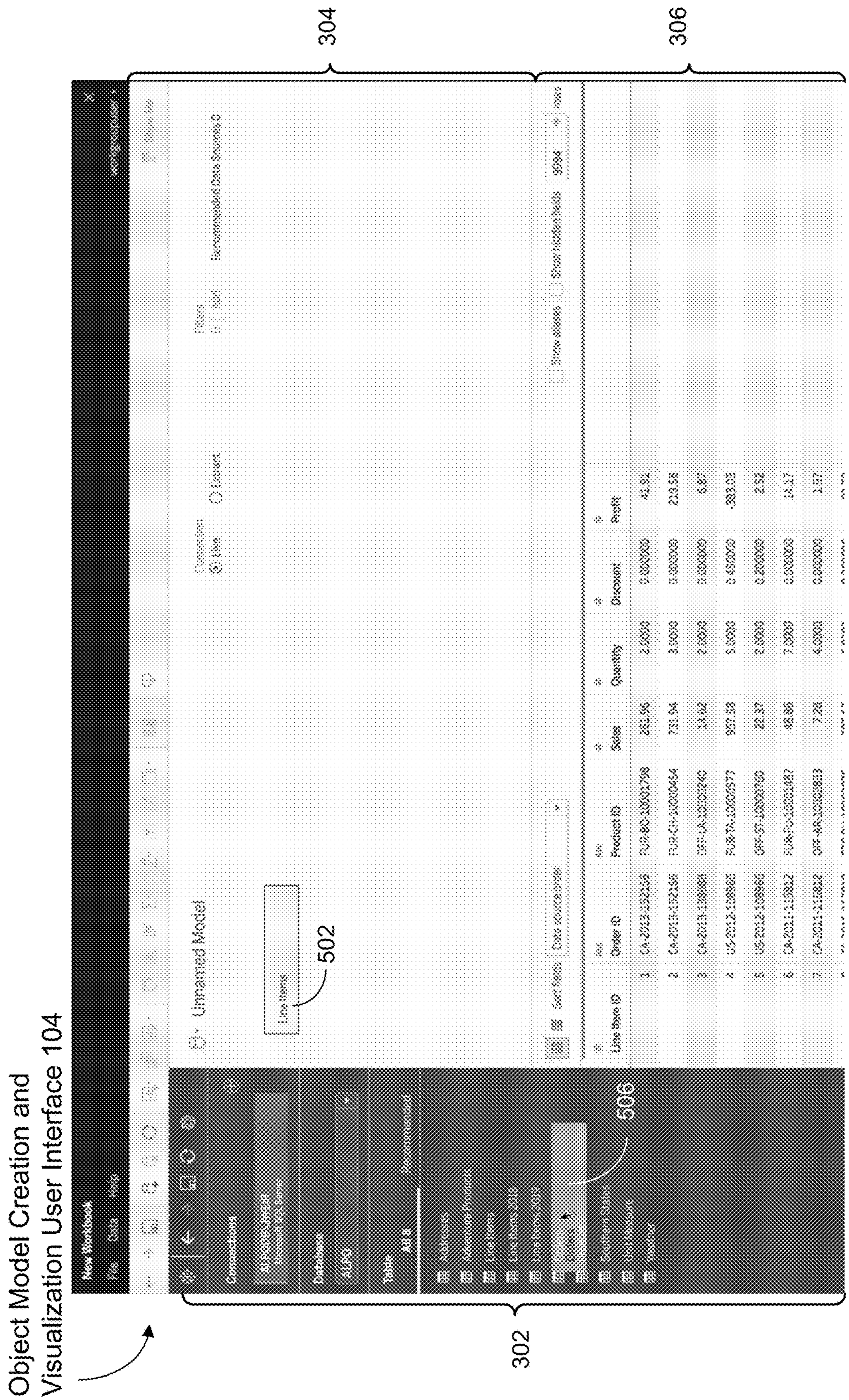
Figure 5E:
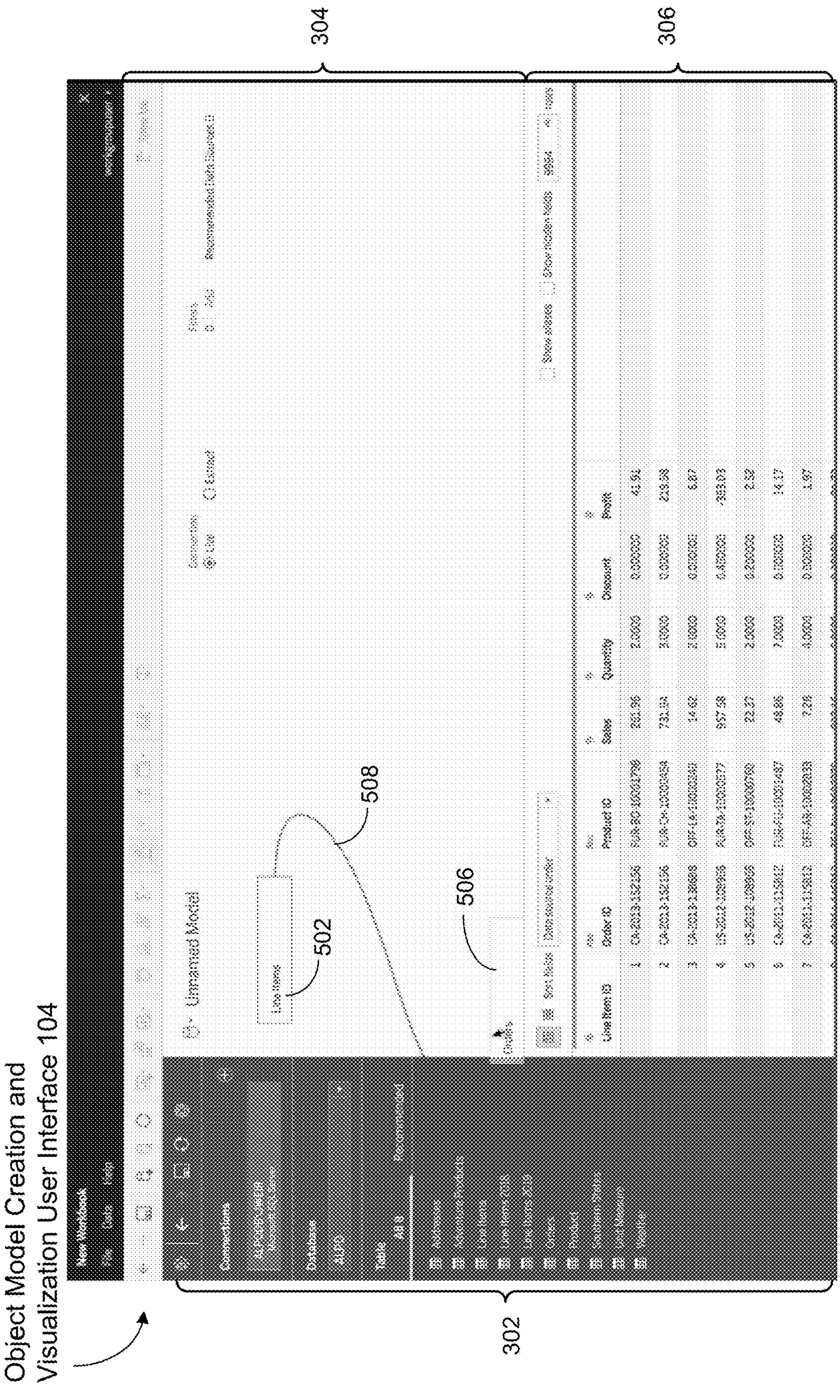
Figure 5F:
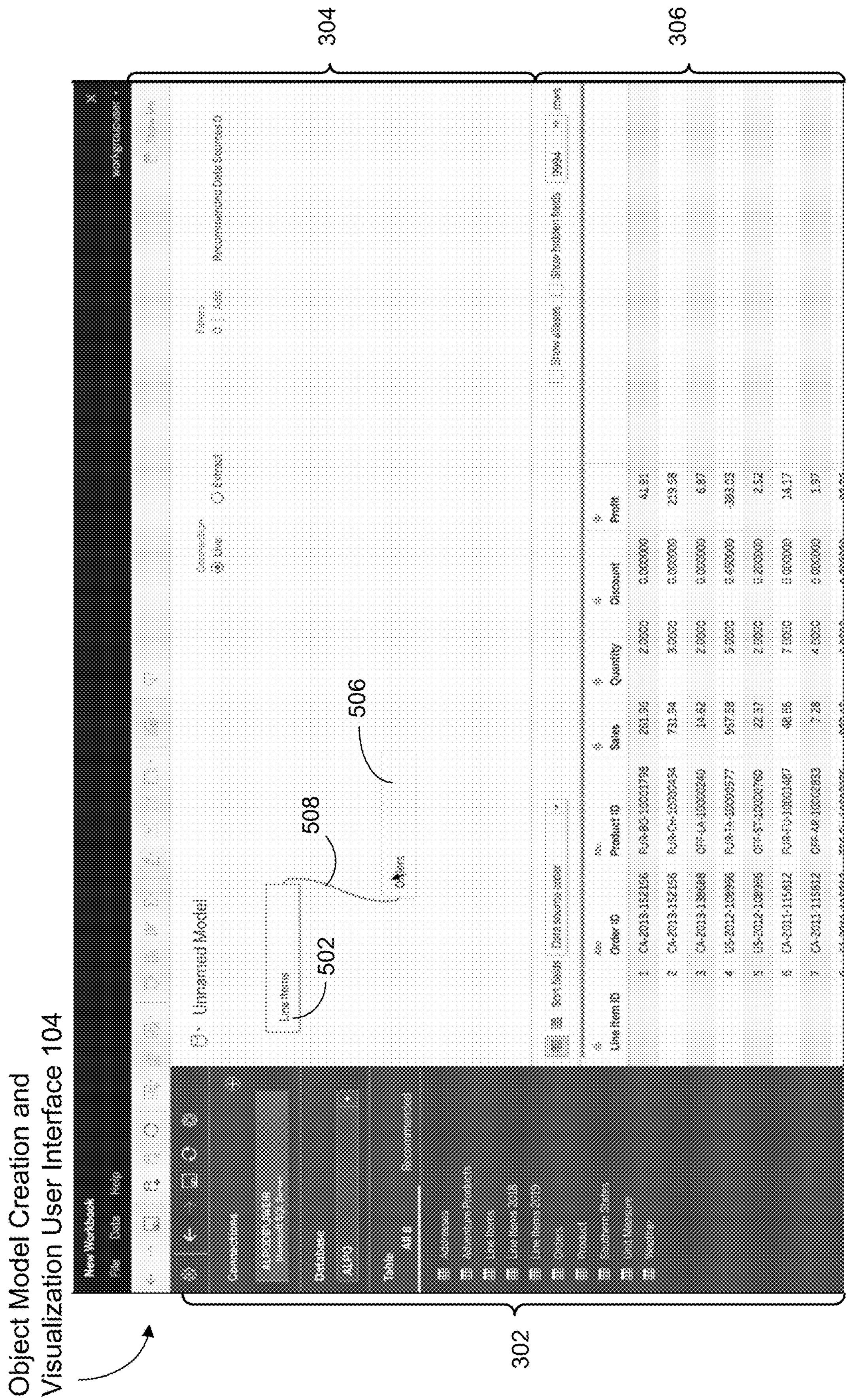
Figure 5G:
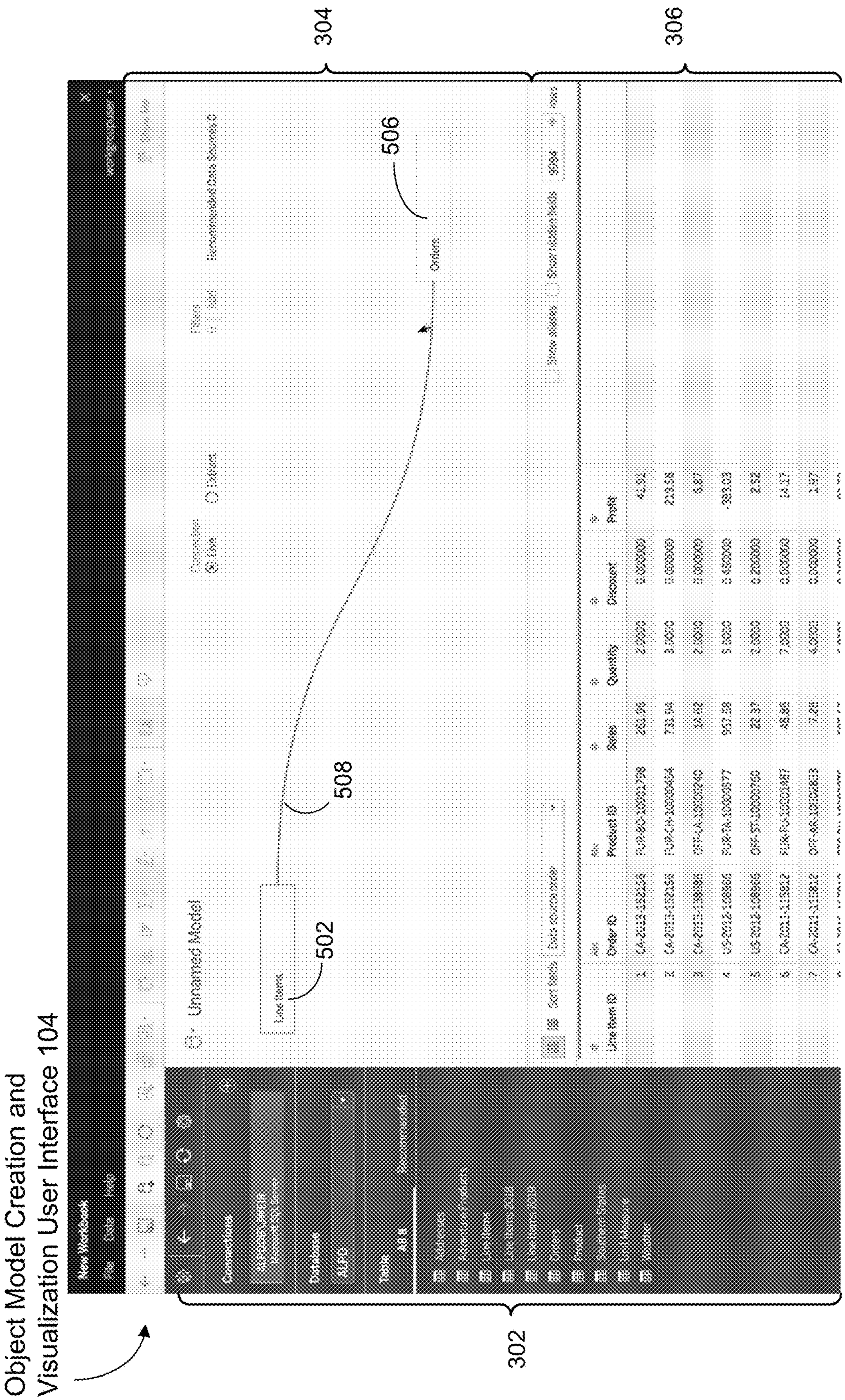

Continuing with the example, referring next to FIG. 5D, the screen shot shows that the user has selected the Orders table in the connections region 302. Similar to FIG. 5A, the system responds by creating another candidate object icon 506 for the Orders table. As shown in FIG. 5E, the icon 506 is moved to the visualization region 304 and the system recognizes that the visualization region 304 is already displaying an object model (with the Line Items object icon 502). The system begins displaying a visual cue 508 (e.g., a Bezier curve) prompting the user to add the Orders table (or icon 506) to the object model by associating the Orders table with the Line Items table (or the corresponding object icon 502). Details on how the visual cues are generated are described below in reference to FIGS. 12A-12L and 13A-13F, according to some implementations. As shown in FIGS. 5F and 5G, when the user drags the candidate object icon in the visualization region 304, the visual cue 508 is adjusted appropriately (e.g., the Bezier curve shortens in FIG. 5F and lengthens in FIG. 5G) to continue to show a possible association with a neighboring object icon (the root object Line Items table, in this case), according to some implementations. After the user completes moving the candidate object icon 506, the system links the object icon 502 with the candidate object icon 506 to create a new object model, according to some implementations.

Figure 6A:
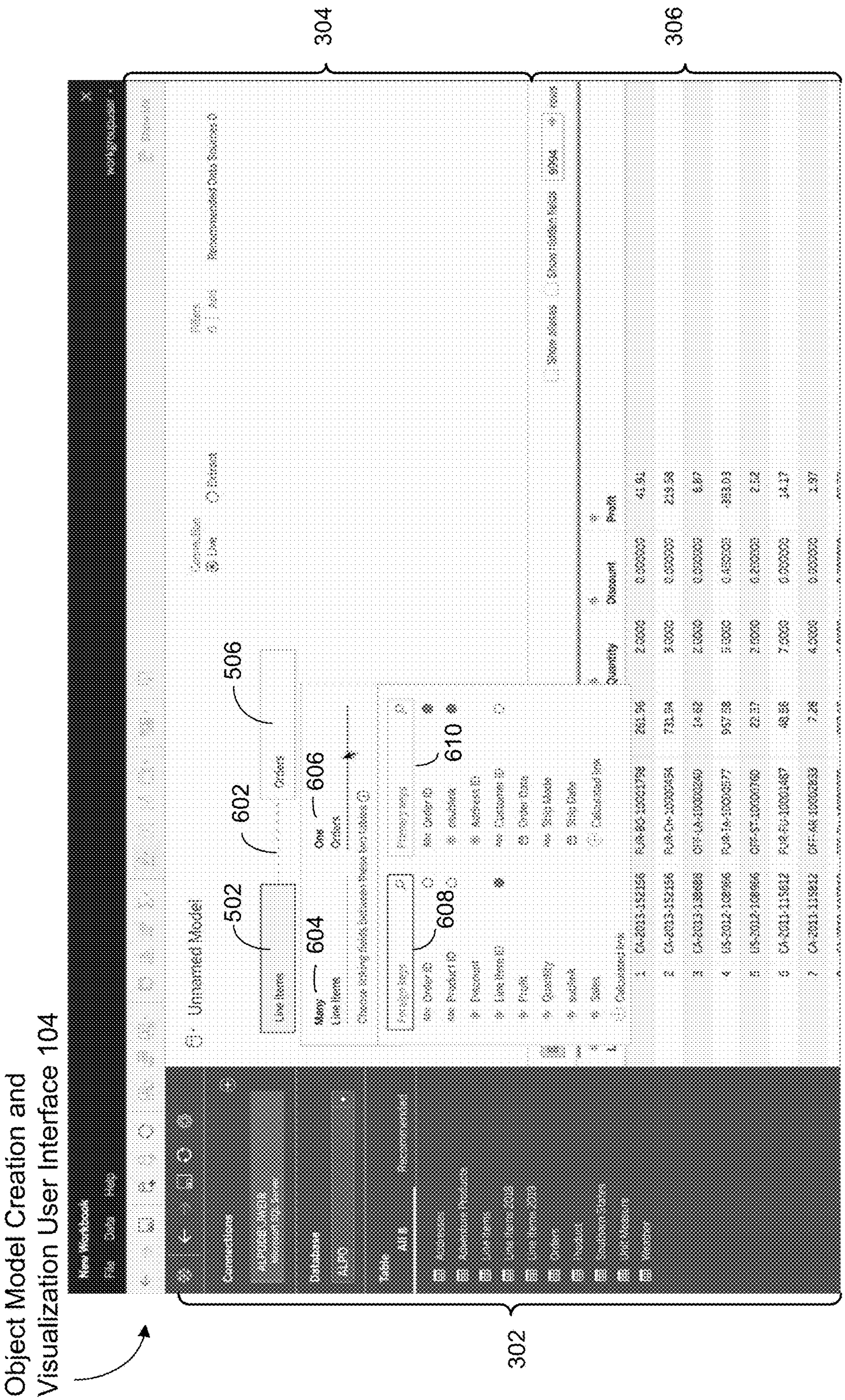

FIGS. 6A-6E are screen shots that illustrate a process for establishing relationships between data objects of an object model created using the example user interface 104, in accordance with some implementations. FIG. 6A illustrates a screen shot of the interface with the visualization region 304 displaying the object model created as described above in FIG. 5G with the Line Items table (the icon 502) and the Orders table (the icon 506). The dashed line 602 indicates that the two tables (object icons 502 and 506) have not yet been joined by a relationship. The user interface indicates that Line Items is the "many" side 604 and that Orders represents the "one" side 606 of a relationship to be identified. In some implementations, the choices for the foreign keys 608 (FKs) as well as the primary keys 610 (PK) are displayed for user selection.

Figure 6B:
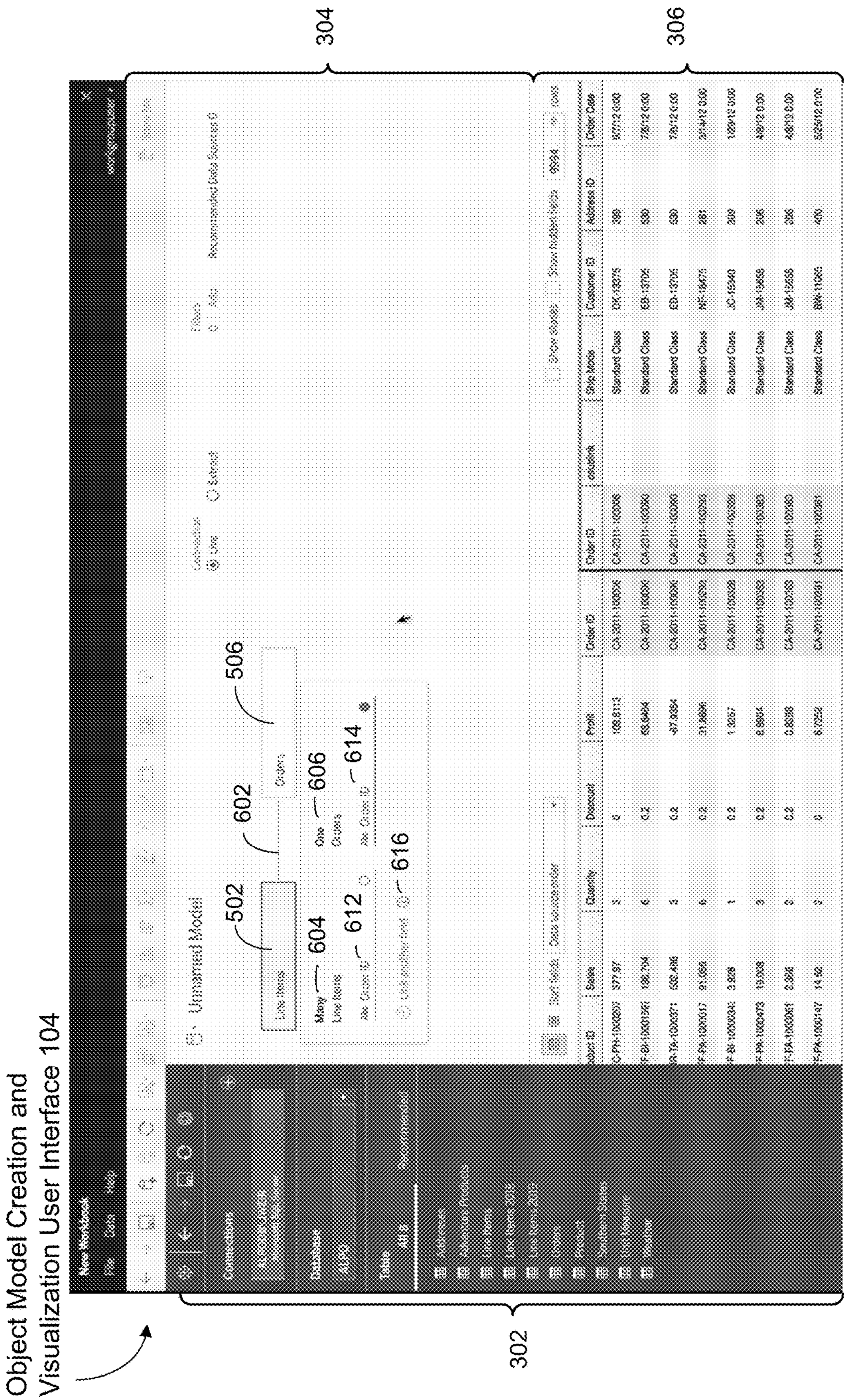

FIG. 6B illustrates a screen shot of the interface 104 after the user selects a relationship, according to some implementations. In particular, as indicated by the keys 612 and 614, the user selected to link the two tables using Order ID. Some implementations provide an affordance 616 for the user to further link other fields between the two tables. Some implementations also refresh or update the data grid region 306 to display the tables aligned on the basis of the relationship or key selected by the user (e.g., Order ID).

Figure 6C:

In some implementations, as shown in FIG. 6C, when the user clicks away (or drags the cursor away) from the portion of the visualization region 304 in FIG. 6B for selecting keys, to position 618, the display reverts to the object model with the icons 502 and 506 connected by a solid line 602 to indicate the established link between the two tables. Some implementations update the data grid region 306 to indicate the data fields for the root object icon for the object model (icon 502 corresponding to the Line Items table, in this example).

Figure 6D:
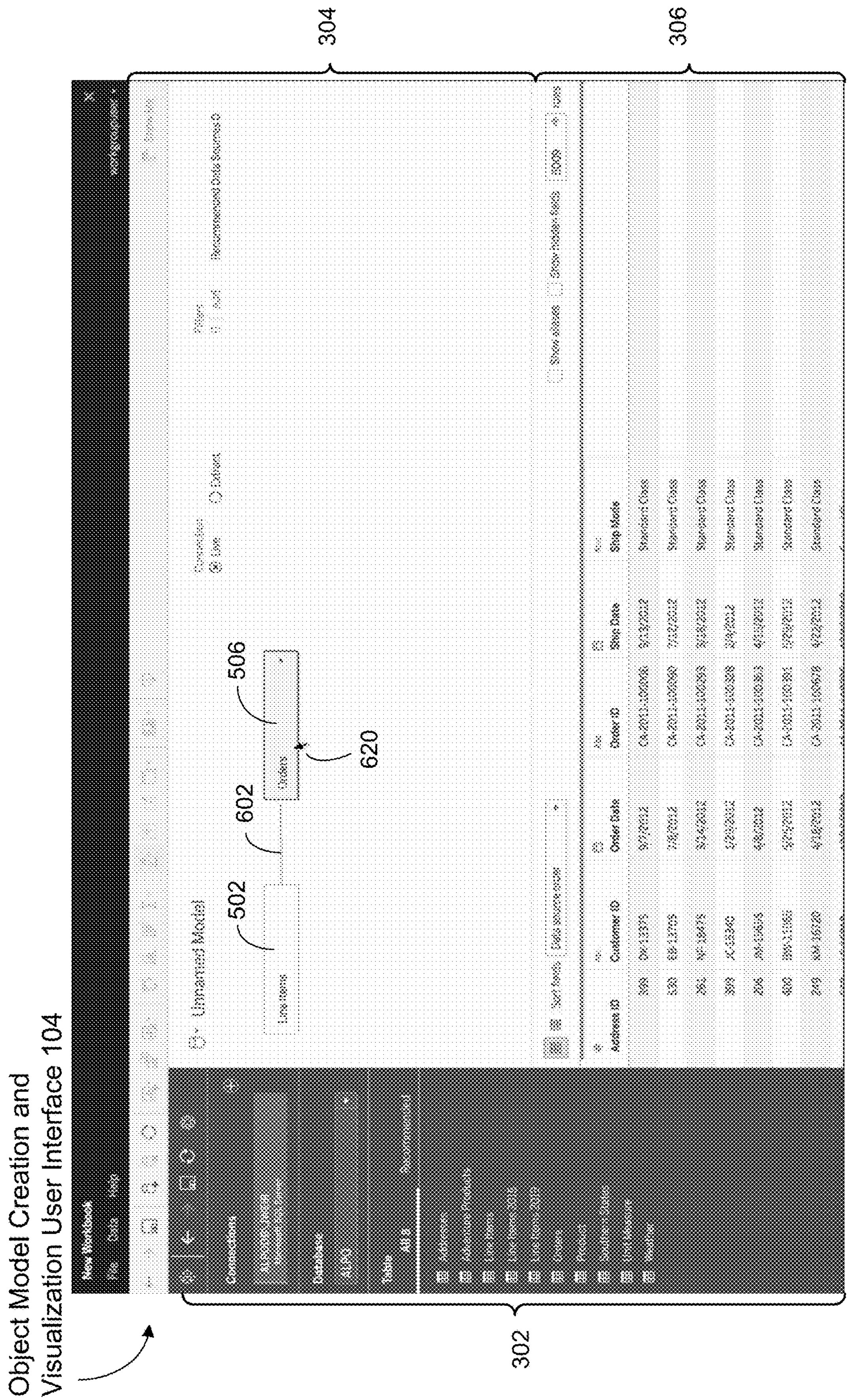

Continuing with the example, FIG. 6D is a screen shot shows that the user has selected a different object icon (icon 506 in this example) by moving the cursor to position 620. In some implementations, the data grid region 306 is automatically refreshed or updated to show the data fields of the selected object icon (e.g., data fields of the Orders table).

Figure 6E:
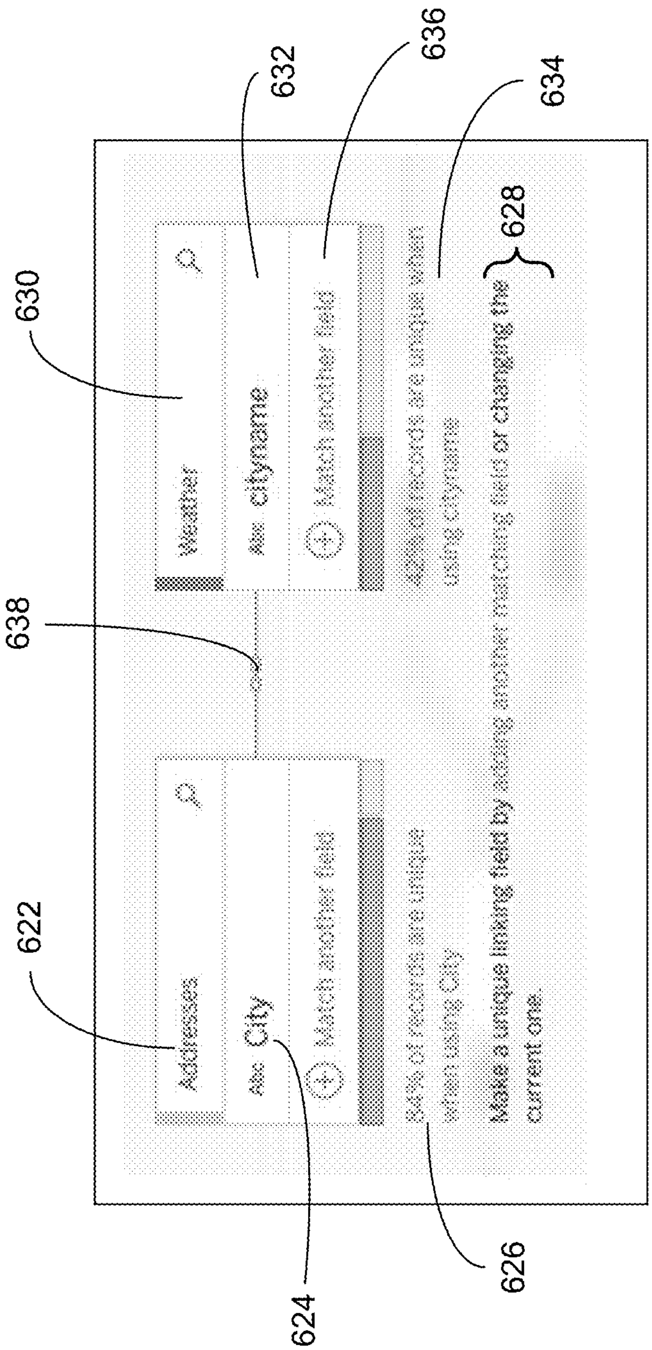

Referring next to the screen shot in FIG. 6E, some implementations verify whether a user-provided relationship is valid and/or provide clues or user prompts for join relationships. In particular, FIG. 6E illustrates how the actual join can be constructed and/or validated in some implementations. In this example, two tables Addresses 622 and Weather 630 are joined (638) by the user. Some implementations indicate the field names (sometimes called linking fields) for the join (e.g., the field City 624 from the Addresses table 622 and the field cityname 632 from the Weather table 630). In some instances, as in this example, tables may have more than one linking field. Some implementations provide an option 636 to match another field or indicate (628) that the user could make a unique linking field by adding another matching field or by changing the current fields. Some implementations also indicate the number of records (the indicators 626 and 634) that are unique (for each table) when using the current user-selected fields for the join.

Figure 6F:
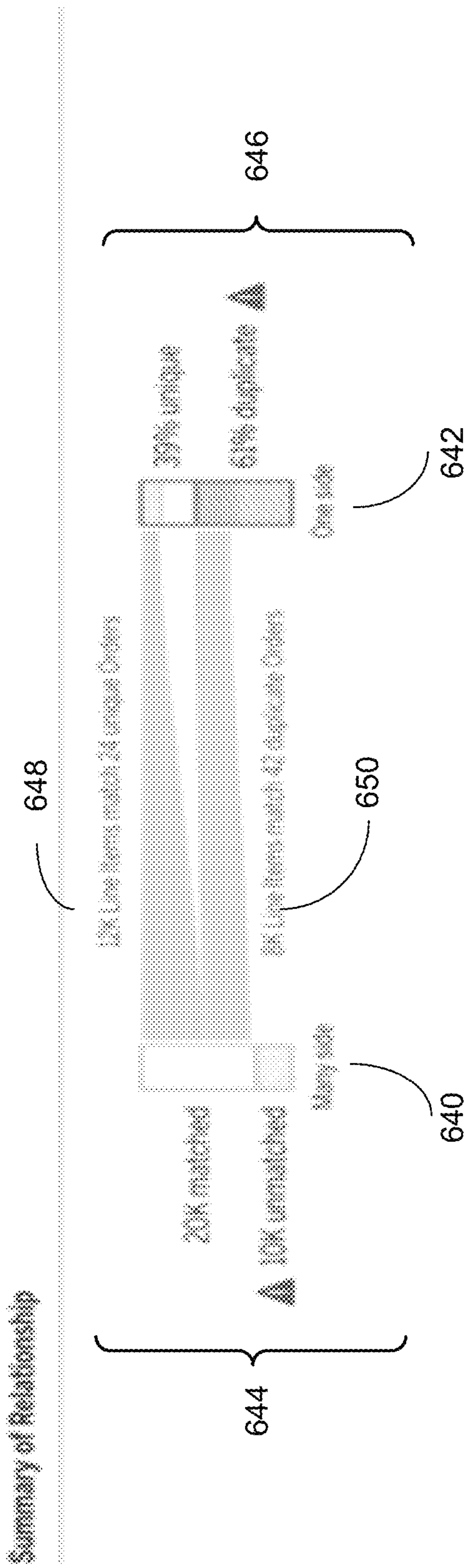

Referring next to the screen shot in FIG. 6F, some implementations provide a summary of user-provided join relationships. In particular, FIG. 6F illustrates how a user can examine relationships in some implementations. In this example, two tables Line Items 640 (many side) and Orders 642 (one side) are joined by the user. Some implementations show (644) the number of matched entries and/or unmatched entries using some visual cues (e.g., using different colors) and/or textual information. Some implementations show (646) percentage of duplicate and/or unique entries. Some implementations show (648, 650) the number of entries of the a first table (e.g., the Line Items table) that match unique/duplicate entries in a second table (e.g., the Orders).

Figure 7A:
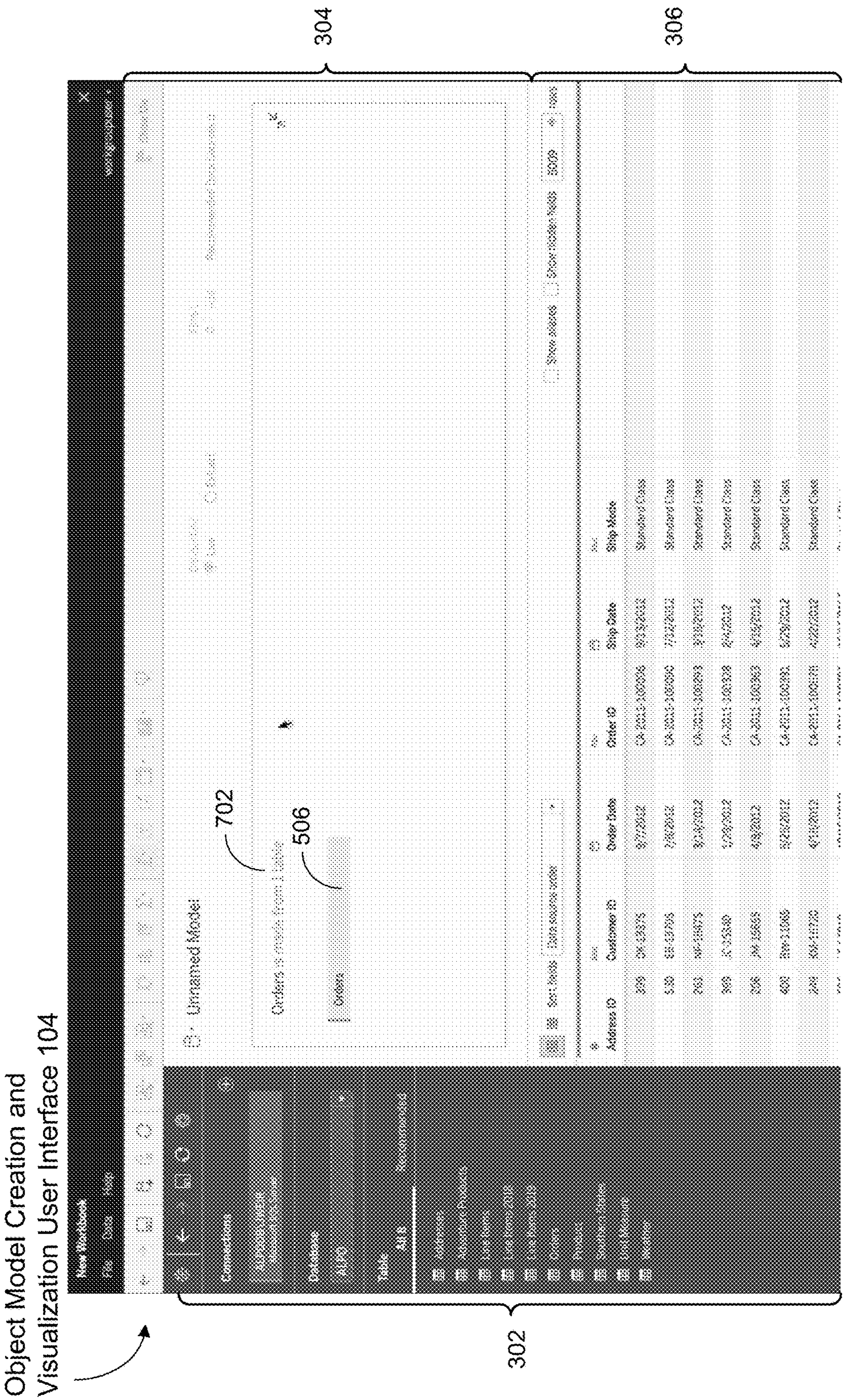
Figure 7B:
Figure 7C:
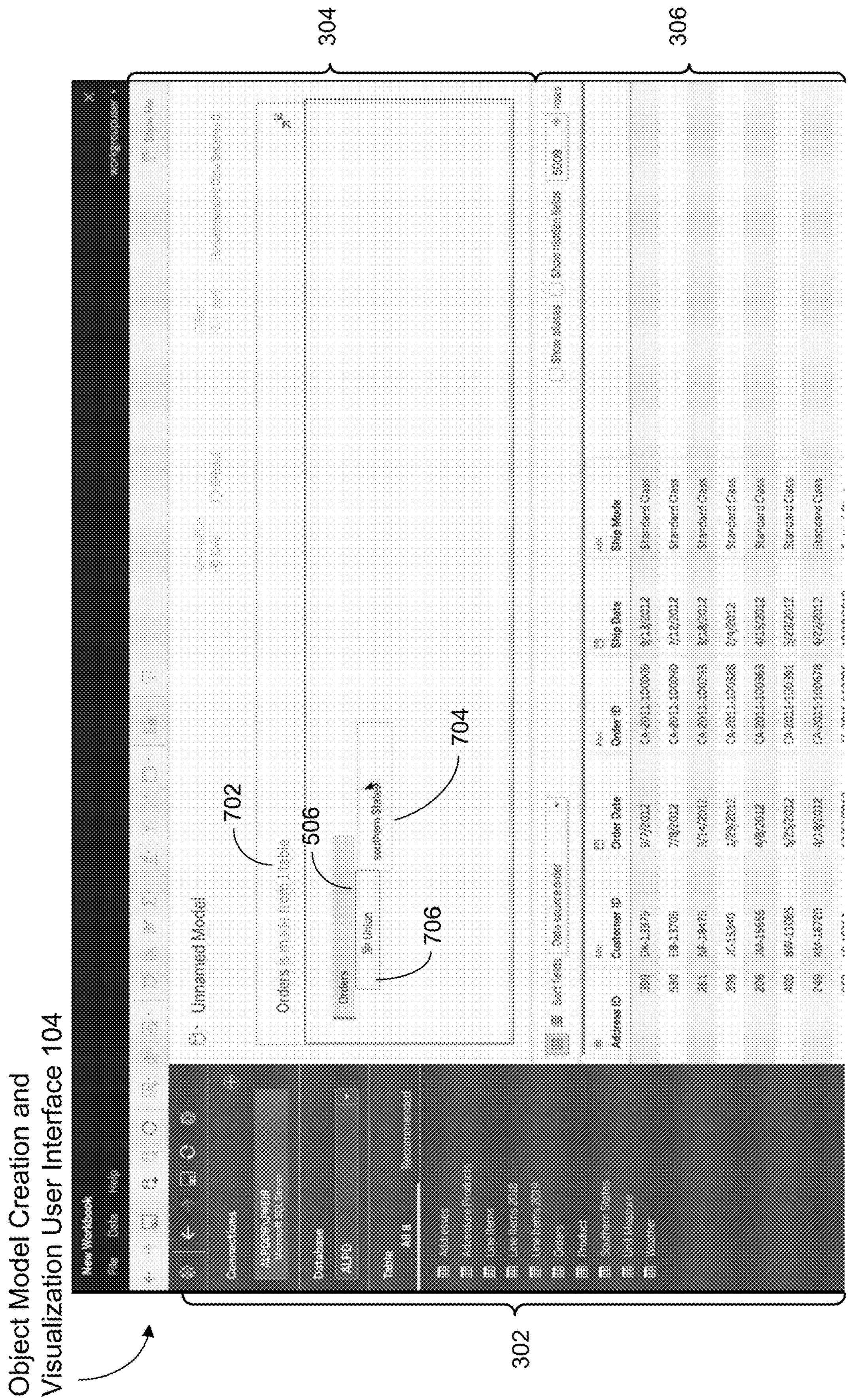
Figure 7D:
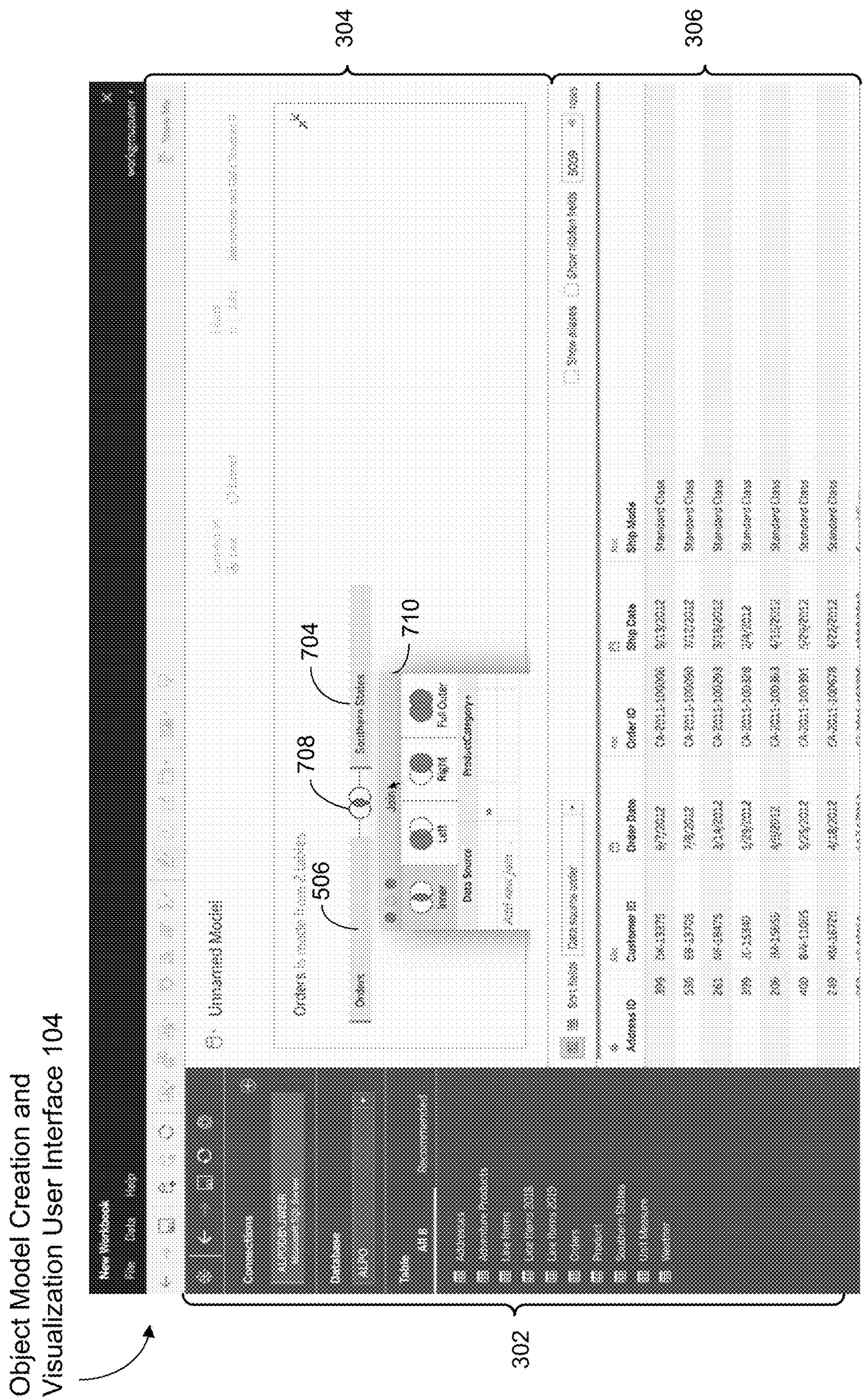
Figure 7E:
Figure 7F:
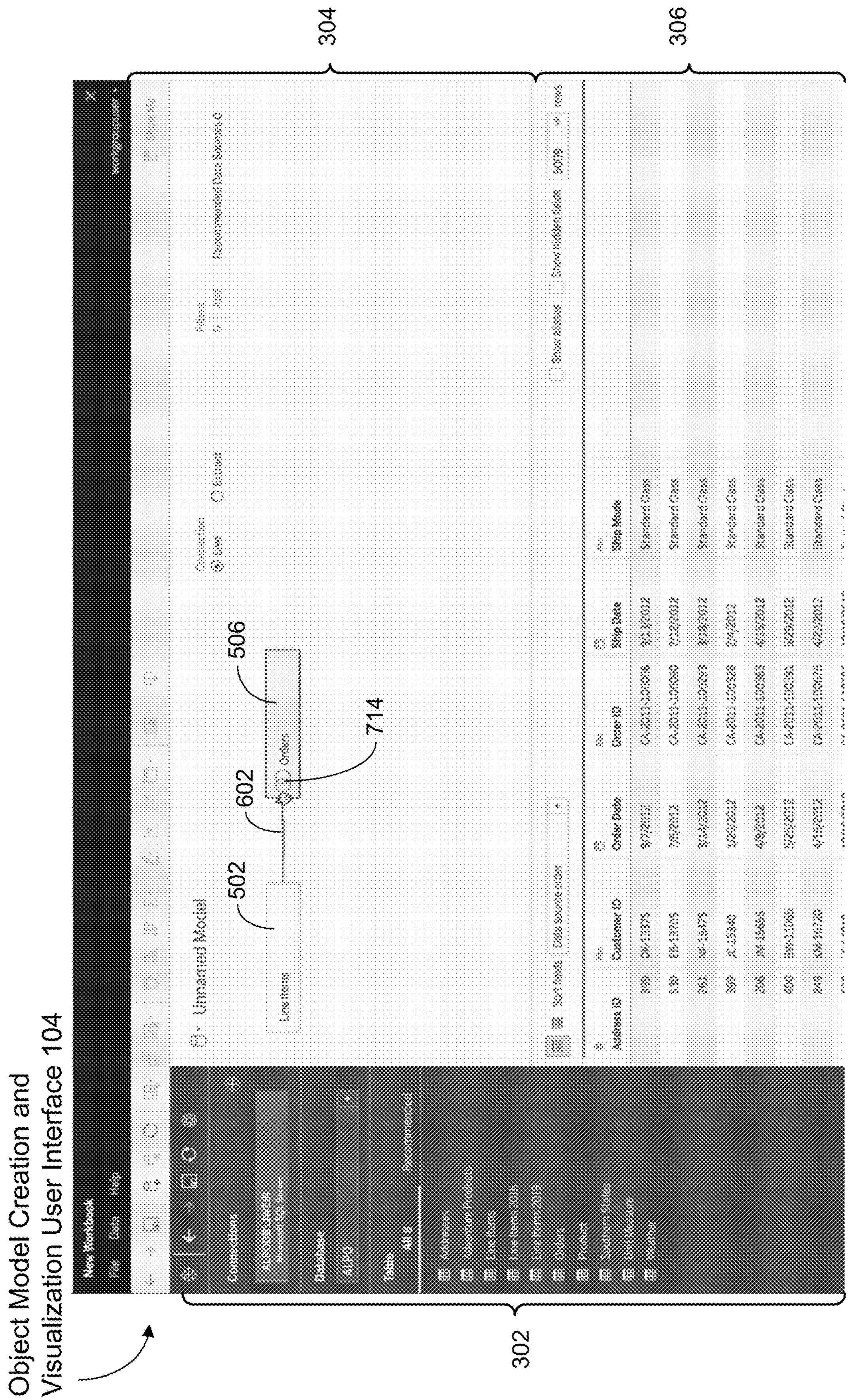
Figure 7G:

FIGS. 7A-7G are screen shots that illustrate a process for editing components of an object model using the example user interface, in accordance with some implementations. FIG. 7A continues the example shown in FIG. 6D, where the user selected the object icon 506. In response to the user selection, the visualization region 304 is updated to zoom in on the object icon 506. In other words, the focus is shifted to the Orders table or object icon 506, according to some implementations. Also, the display indicates (702) that the Orders object icon 506 is made from one table (the Orders table), according to some implementations. Suppose, as shown in FIG. 7B, the user selects the Southern States table from the connections region 302 to connect or link that table to the Orders table. In response to the user selection, the system creates a candidate object icon 704 which the user drags towards the object model visualization region 304. As shown in FIG. 7C, when the candidate object icon 704 is dragged by the user to the visualization region 304 and next to (or near) the object icon 506, the system responds by providing an affordance or option 706 to union the Orders table (object icon 506) with the Southern States table corresponding to the candidate object icon 704, according to some implementations. Continuing the example, in FIG. 7D, subsequent to the user selecting to join the two tables (corresponding to the icons 506 and 704), as indicated by the join icon 708, the system displays options 710 for joining the two tables (e.g., inner, left, right, or full outer joins), according to some implementations. Subsequently, after the user has selected one of the join options, the system joins the tables (with an inner join in this example). In some implementations, the system updates the display to indicate (712), as shown in FIG. 7E, that the Orders object is now made of two tables (the Orders table and the Southern States table corresponding to the icon 704). Reverting to the parent object model (consisting of the Line Items table 502 and the Orders object 506), as shown in FIG. 7F, in some implementations, the object icon 506 is updated to indicate (714) that the object is now a join object (made by joining the two tables Orders and Southern States). The user can select the Orders object icon 506 to examine the contents of the Orders object, as shown in FIG. 7G. In some implementations, the user can revert to the parent object model (shown in FIG. 7F) by clicking (or double-clicking) on (or selecting) an affordance or option (e.g., the revert symbol icon 716) in the visualization region 304.

Figure 8A:
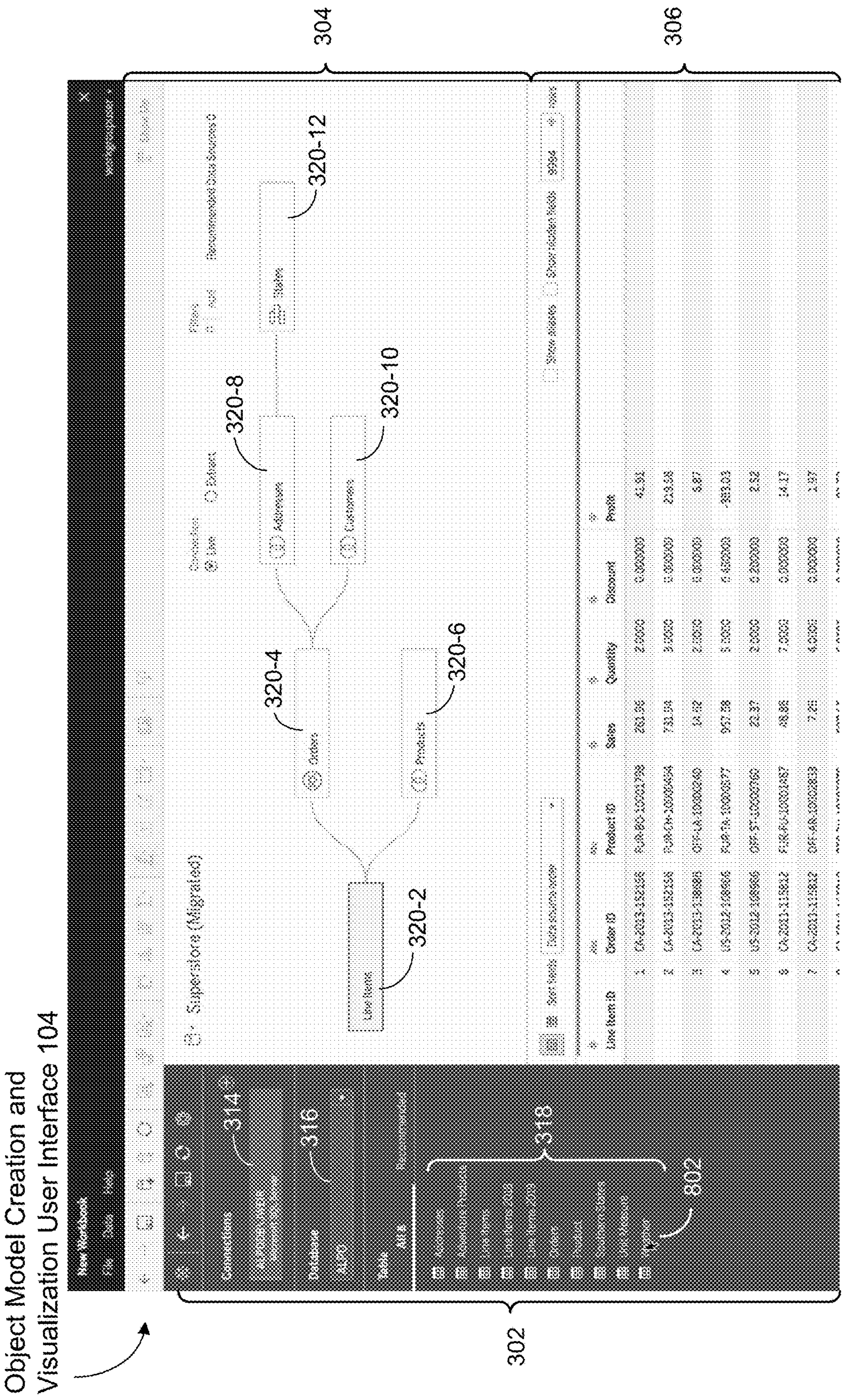
Figure 8B:
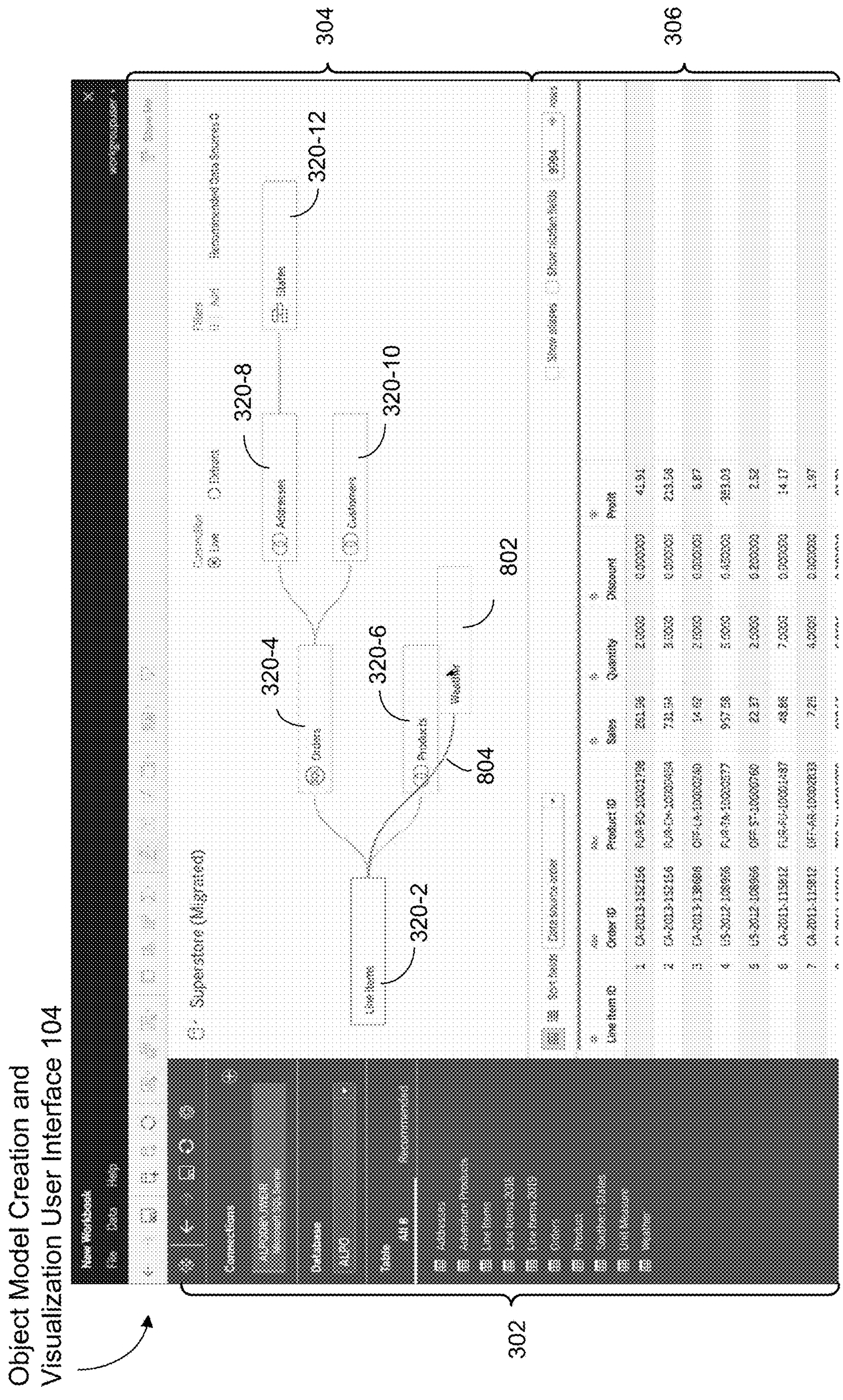
Figure 8C:
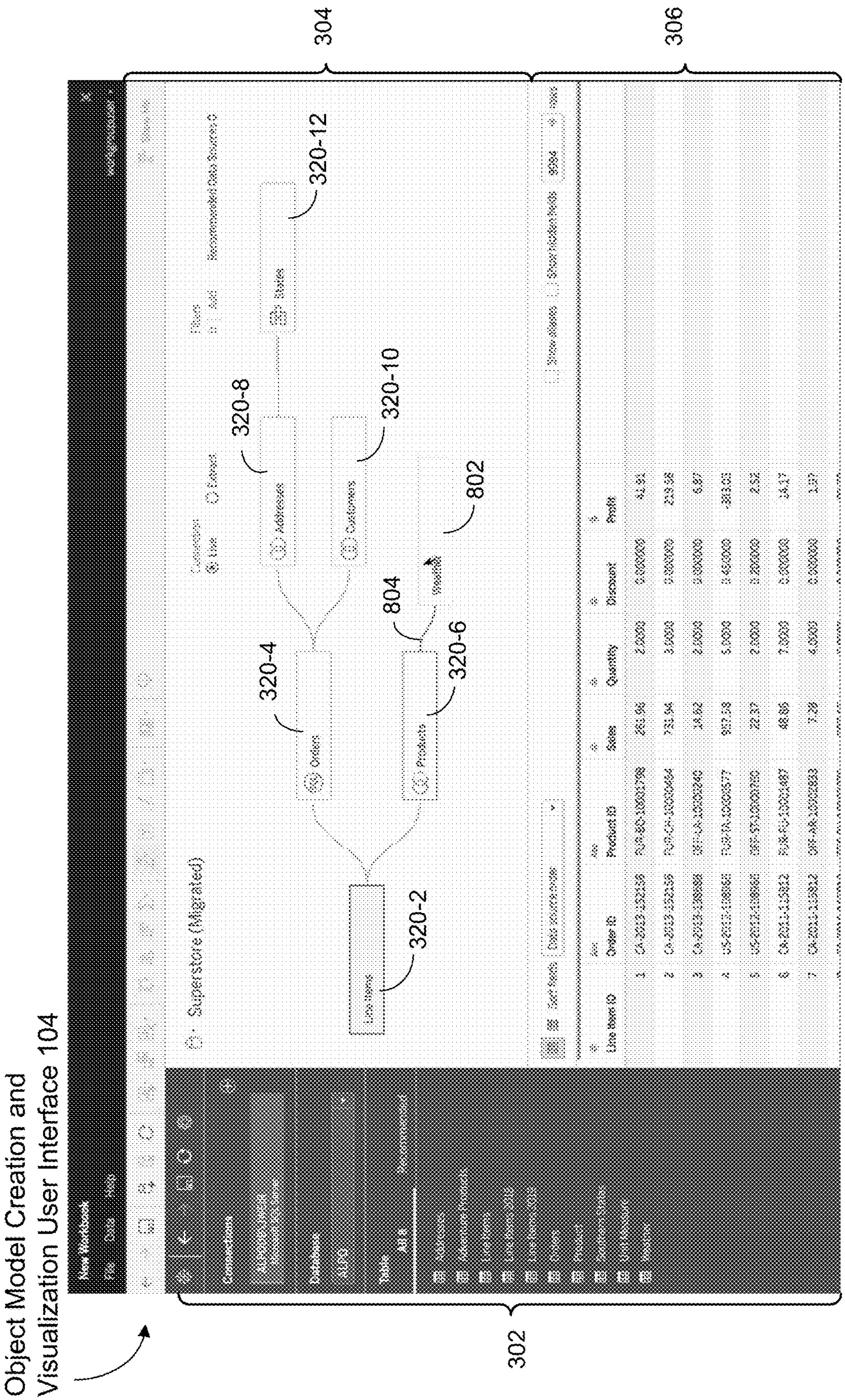
Figure 8D:
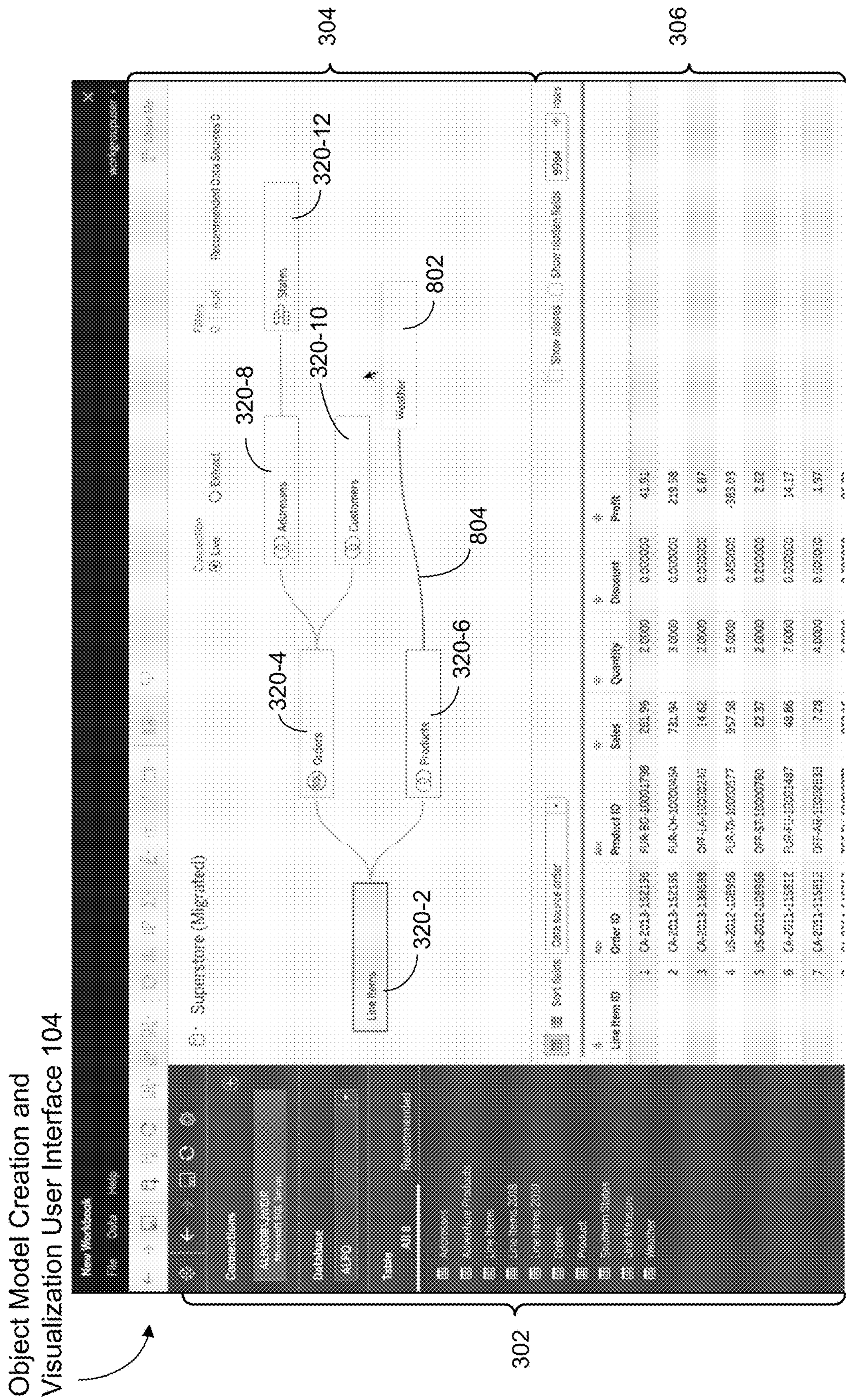

FIGS. 8A-8J are screen shots that illustrate examples of visual cues provided while creating object models using the example user interface, in accordance with some implementations. A user begins with the example object model in FIG. 3, as reproduced in the visualization shown in FIG. 8A. The user selects the Weather table from the connections region 302 to add to the object model shown in the visualization region 304. As described above, the system creates a candidate object icon 802 for the Weather object and begins showing a visual cue 804 indicating possible connections to neighboring object icons, as shown in FIG. 8B.

Figure 8E:
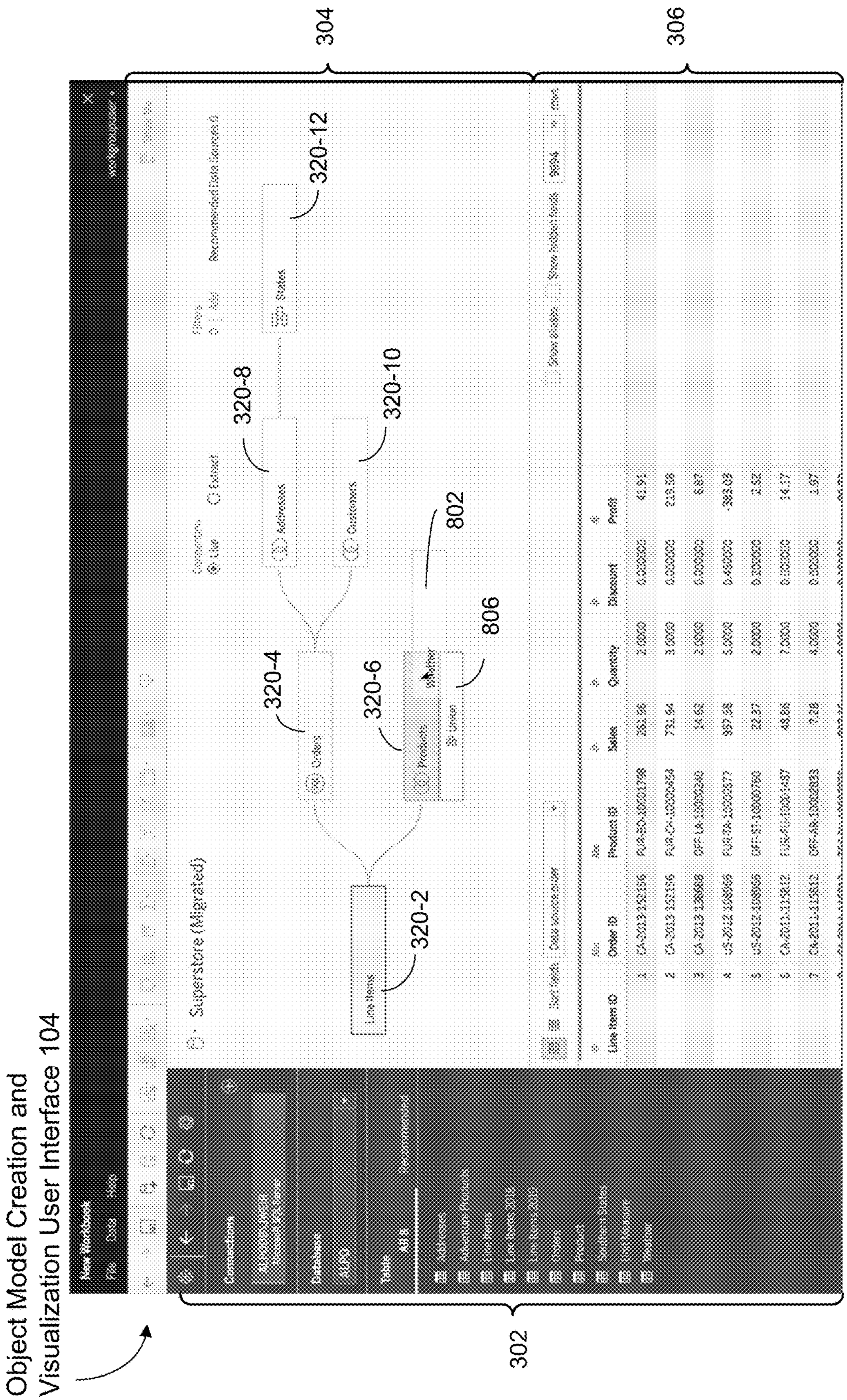
Figure 8F:
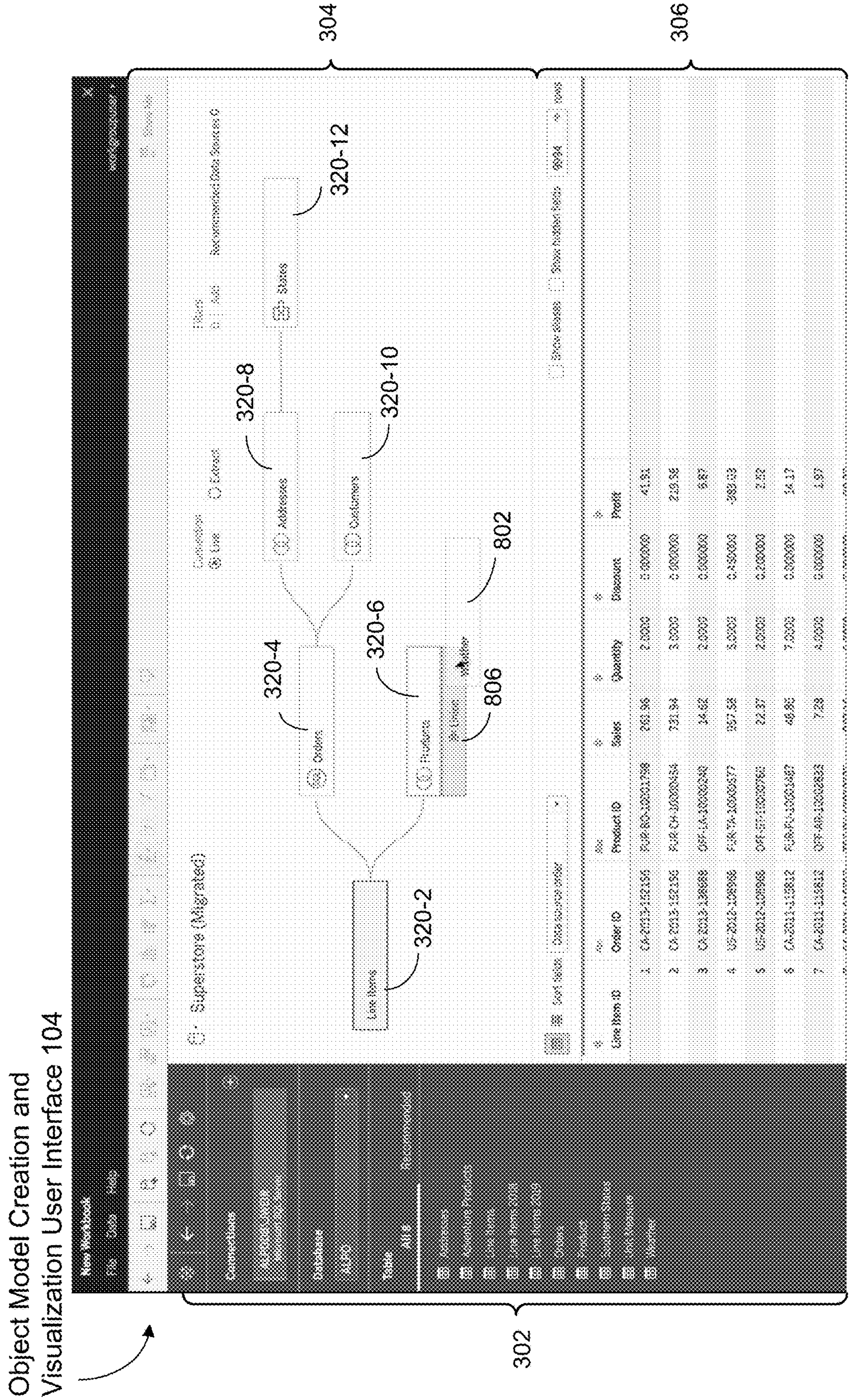
Figure 8G:
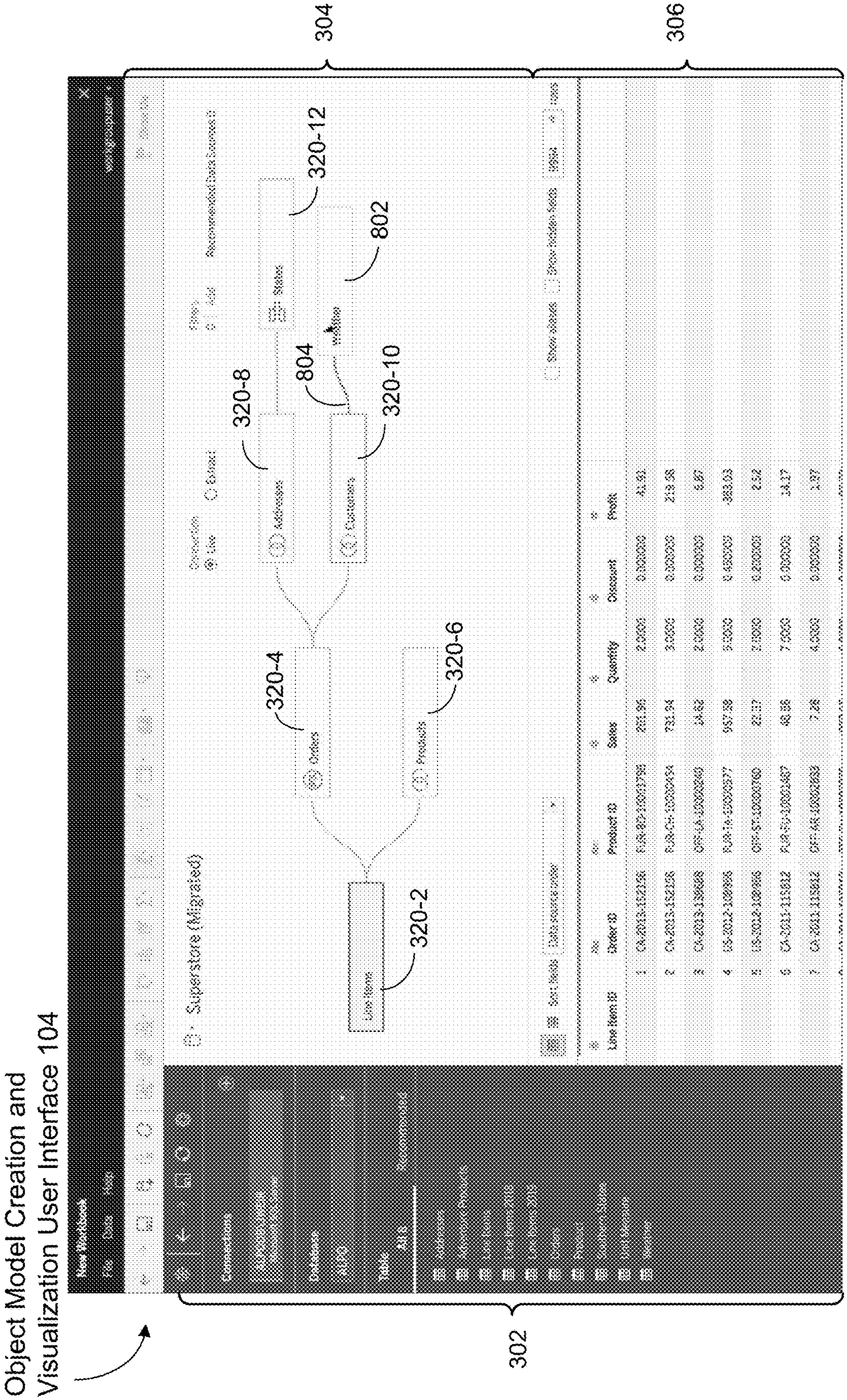
Figure 8H:
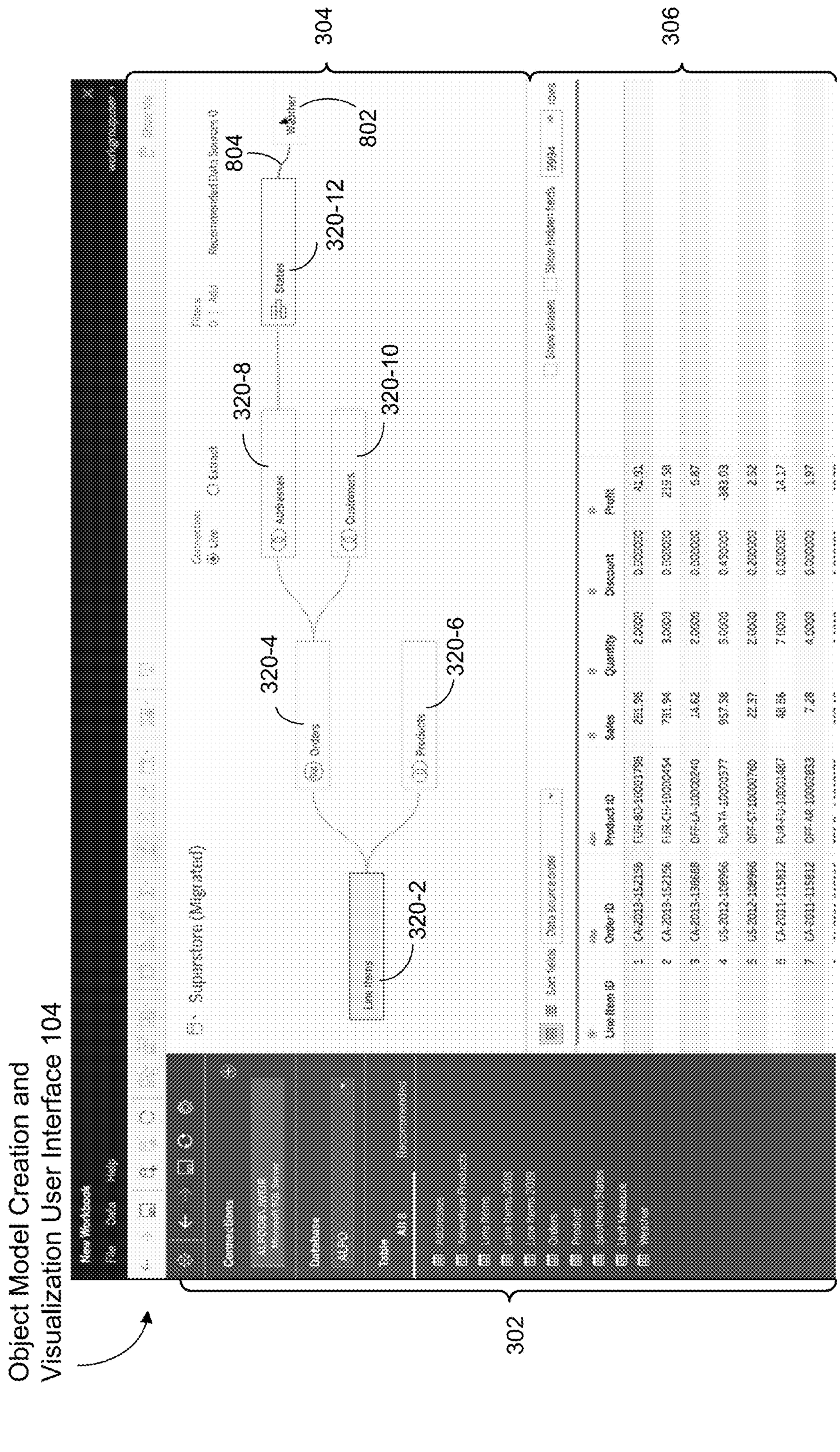
Figure 8I:
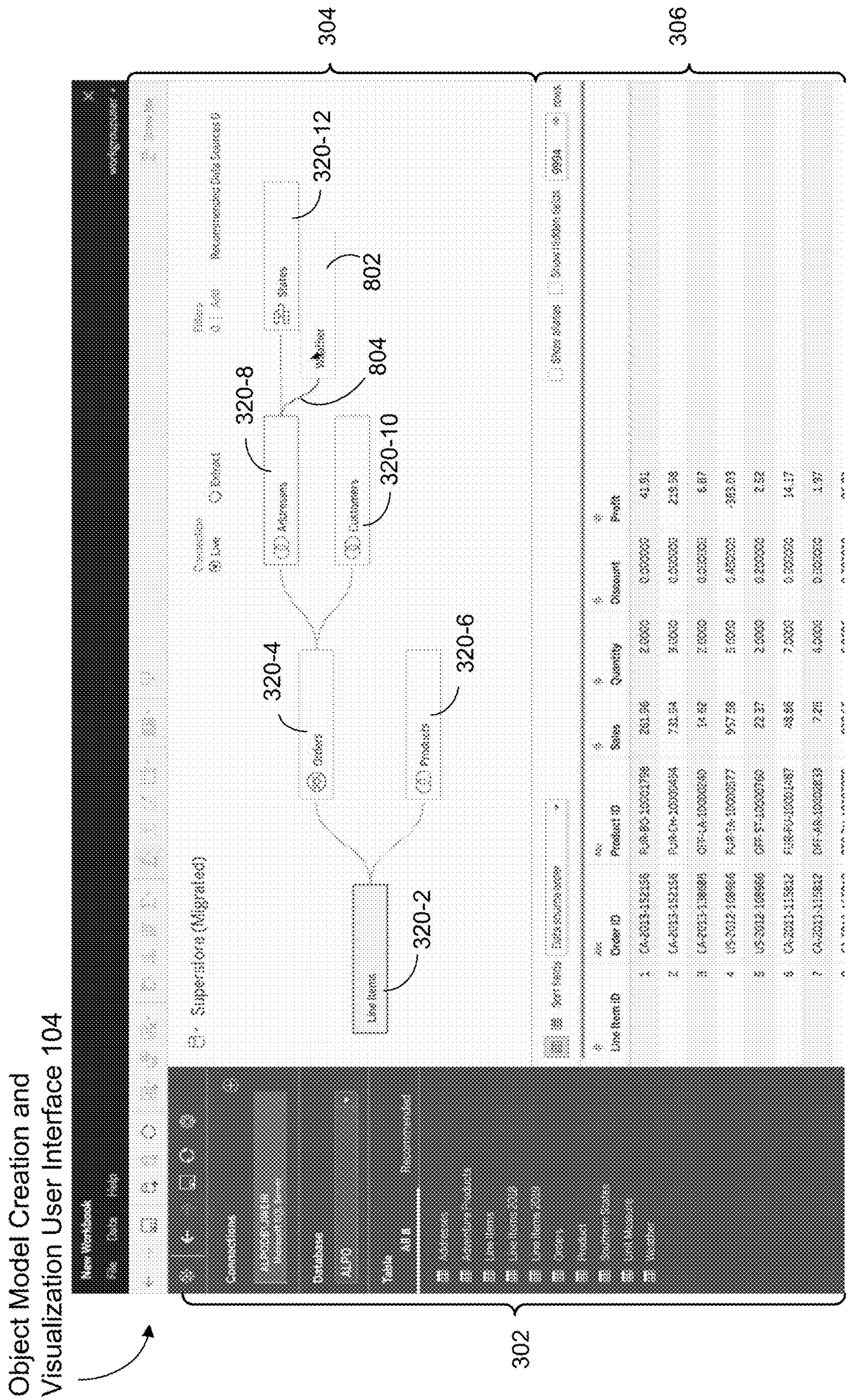
Figure 8J:
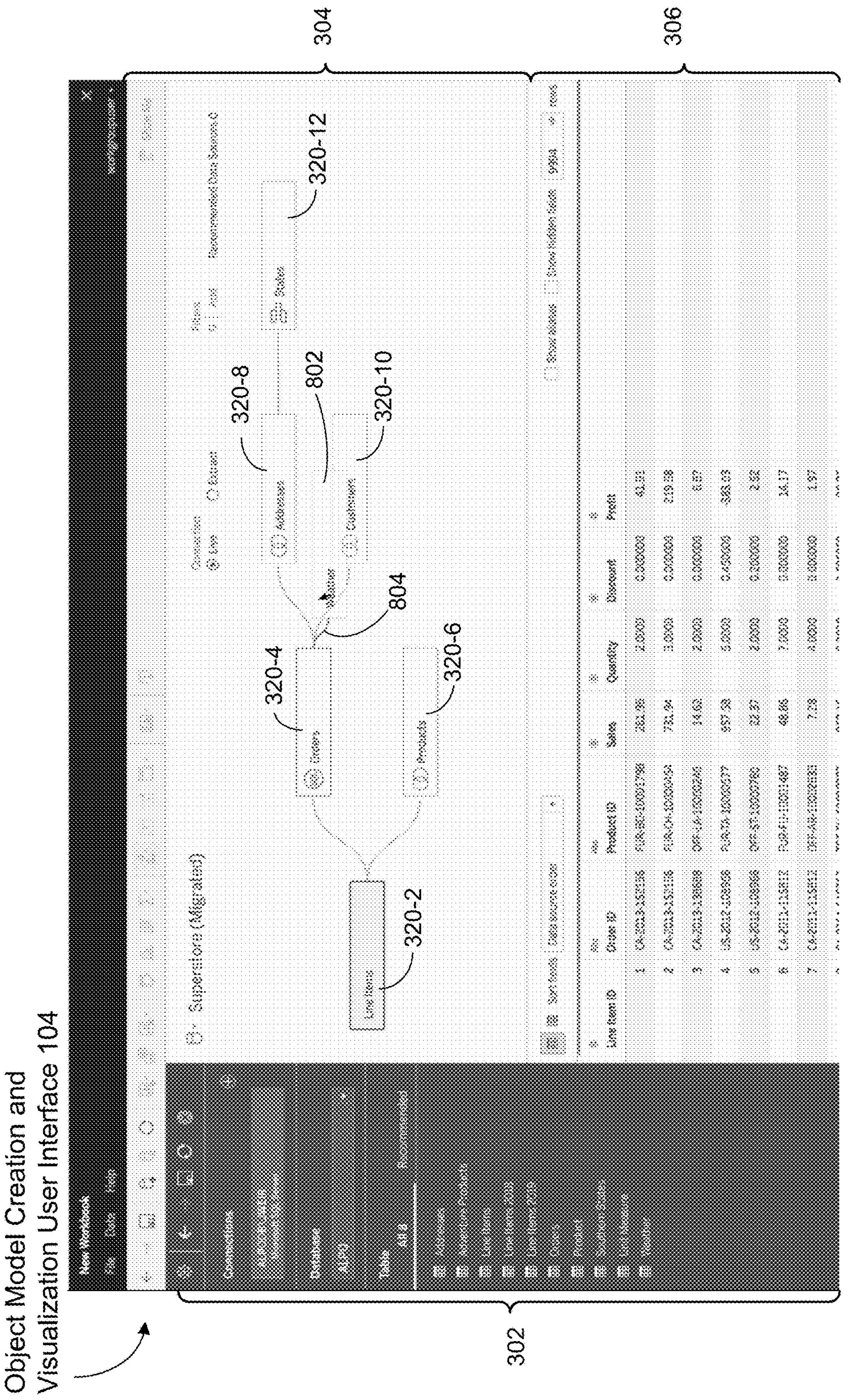

In FIG. 8B, the visual cue 804 indicates that the candidate object icon 802 could be connected to the object icon 320-2. As the user drags the candidate object icon 802 away from the object icon 320-2, the system automatically adjusts the visual cue 804 and/or highlights a neighboring object icon (e.g., the object icon 320-2 in FIG. 8B, the object icon 320-6 in FIG. 8C, and the object icon 320-6 in FIG. 8D), according to some implementations. Some implementations determine the neighboring object icon based on proximity to the candidate object icon. Some implementations determine and/or indicate valid, invalid, and/or probable object icons to associate the candidate object icon with. For example, some implementations determine probable neighbors based on known or predetermined relationships between the objects. As illustrated in FIG. 8E, the user could drag back the candidate object icon 802 to the object icon 320-6, and when the candidate object icon is close to or on top of the object icon 320-6, the system responds by showing an option 806 to union the two objects 320-6 and 802, according to some implementations. FIG. 8F illustrates a screen shot wherein the candidate object icon 802 is combined by a union 806 with the object corresponding to the object icon 320-6, according to some implementations. If the user drags the candidate object icon 802 away from the object icon 320-6 and near the object icon 320-10, the system shows the visual cue 804, as illustrated in FIG. 8G, according to some implementations. In some implementations, the union with the previous object icon (the object icon 320-6 in this example) is reverted prior to adjusting the visual cue 804. FIGS. 8H, 8I, and 8J further illustrate examples of adjustments of the visual cue 804 as the user drags the candidate object icon 802 closer to various object icons in the visualization region 304, according to some implementations.

Figure 9A:
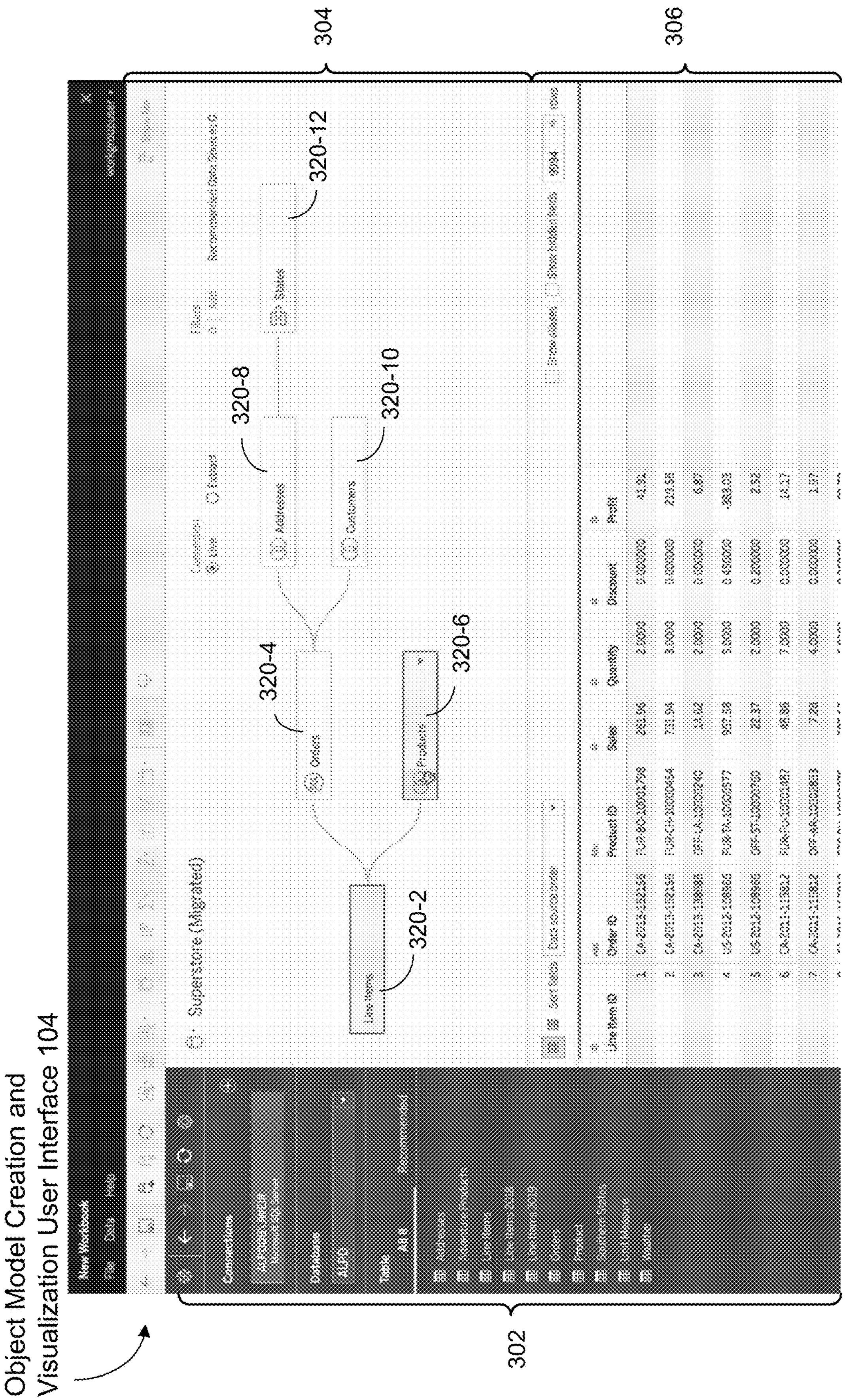
Figure 9B:
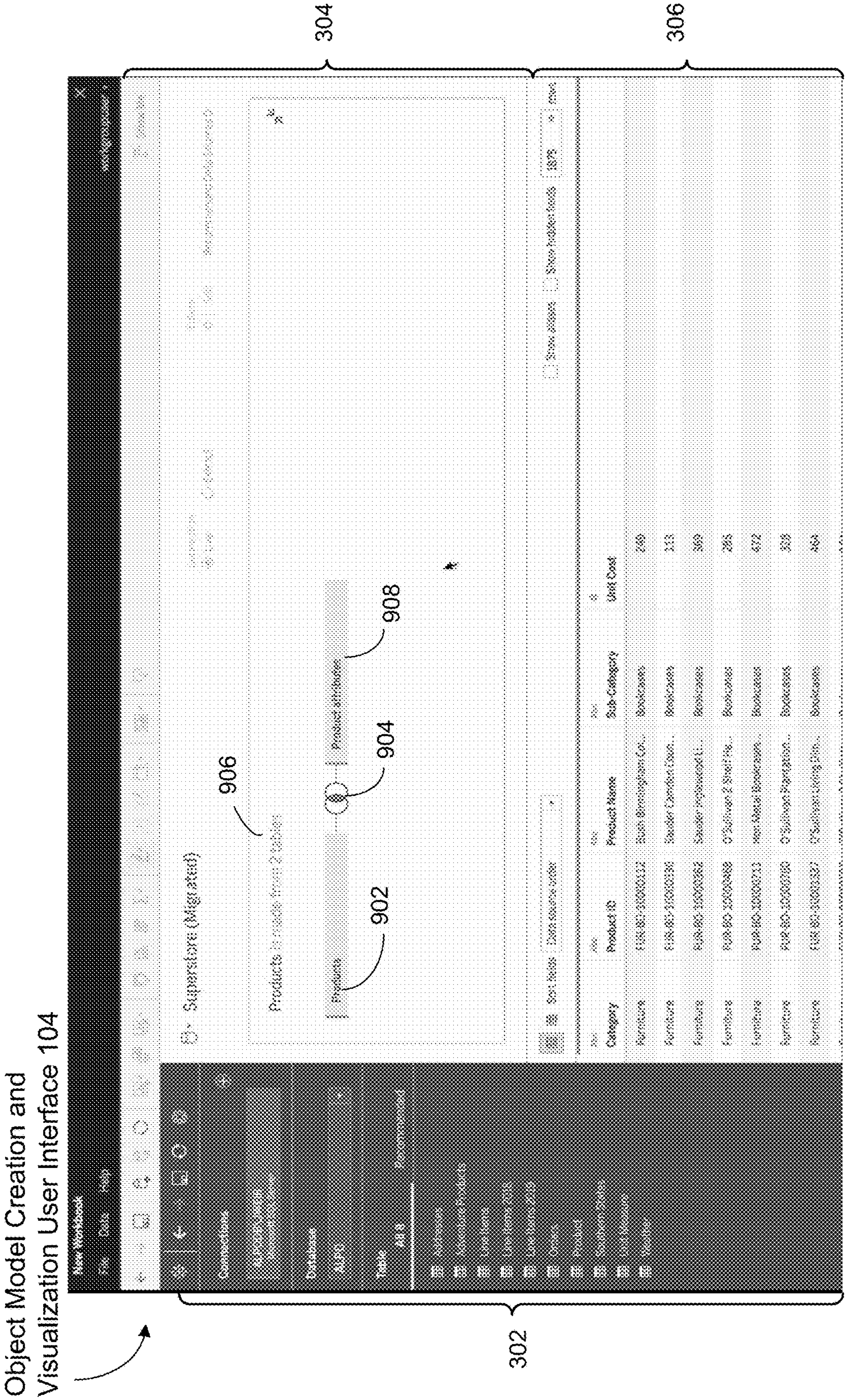
Figure 9C:
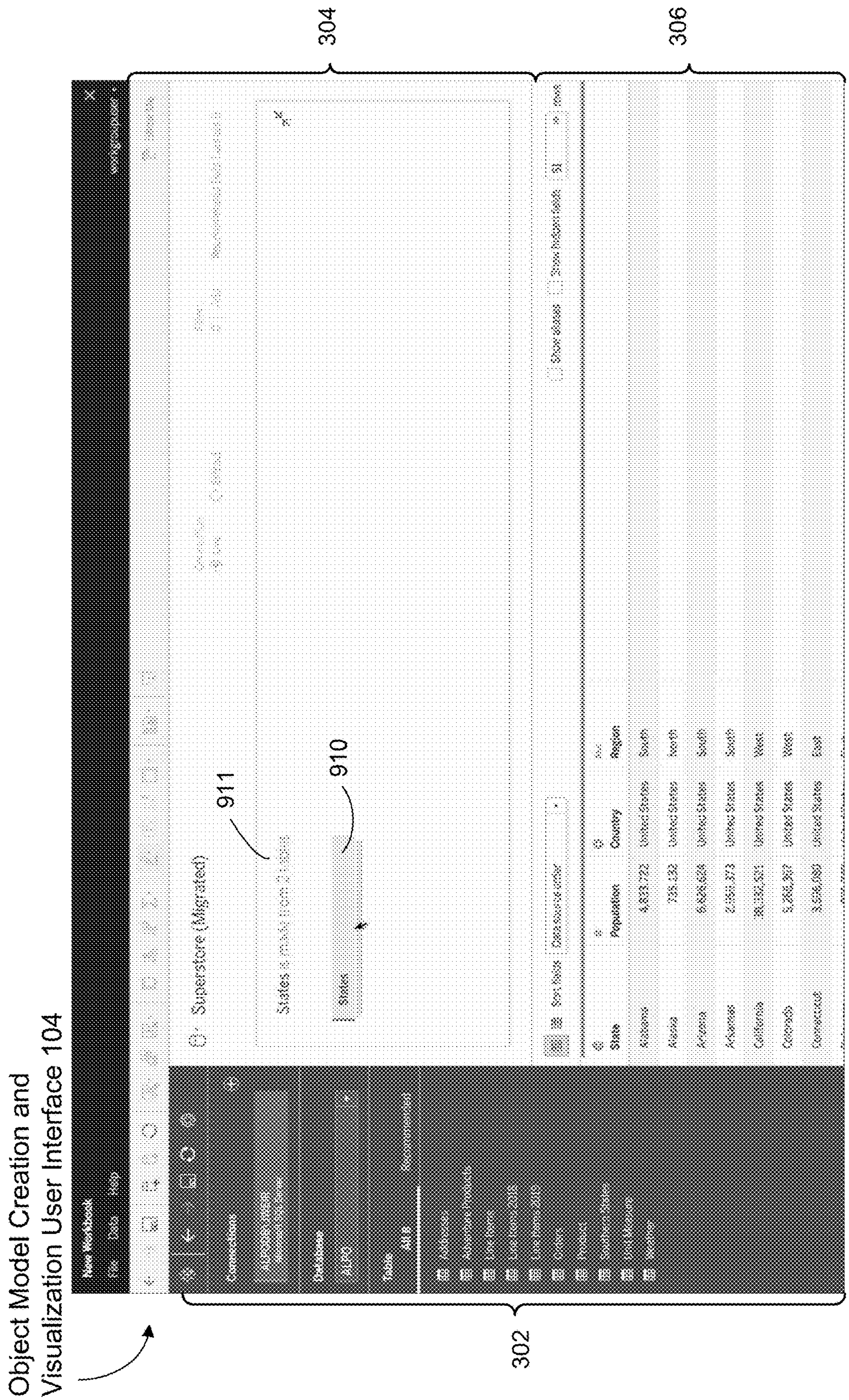
Figure 9D:
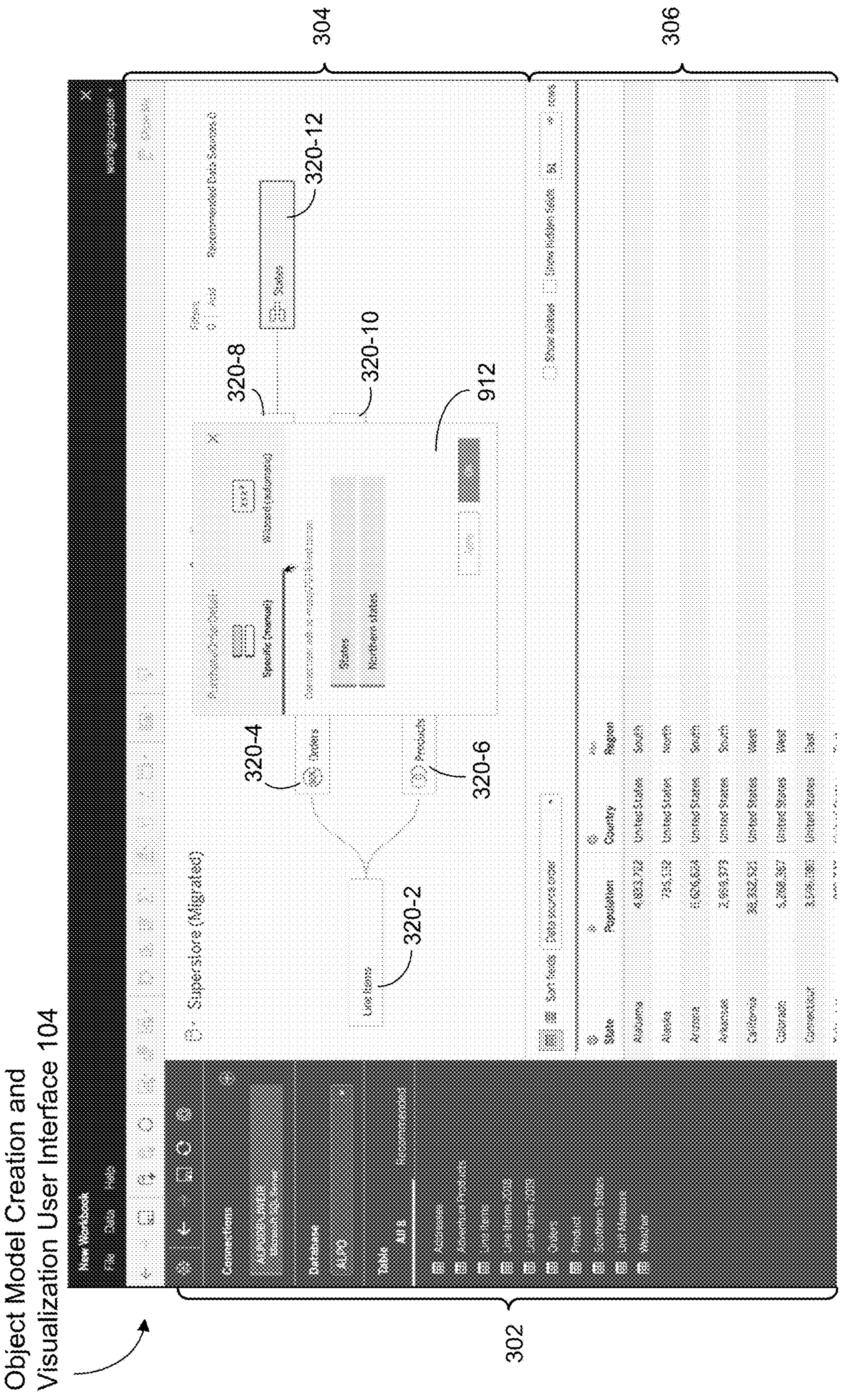

FIGS. 9A-9G are screen shots that illustrate visualizations of components of an object model created using the example user interface 104, in accordance with some implementations. A user begins with the example object model in the visualization shown in FIG. 9A. As illustrated in FIGS. 9B-9G, the user can examine each component of the object model in the visualization region 304 by selecting (e.g., moving the cursor over, and/or clicking) an object icon. For example, in FIG. 9A, the user selects the object icon 320-6. In response, the system displays (e.g., zooms in on) the object icon 320-6 (corresponding to the Products object), as shown in FIG. 9B, according to some implementations. In particular the Products object is made (906) by (inner) joining (904) two tables Product 902 and the Products attribute table 908. FIG. 9C is a screen shot illustrating that the States object is also made (911) from two tables as indicated by the object icon 910. FIG. 9D is a screen shot of an example illustration of displaying details of an object icon (the object icon 320-12 in this example), according to some implementations. In some implementations, a user can see the details 912 of an object icon from the object model visualization region 304 while displaying the object model without zooming in on the object icon.

Figure 9E:
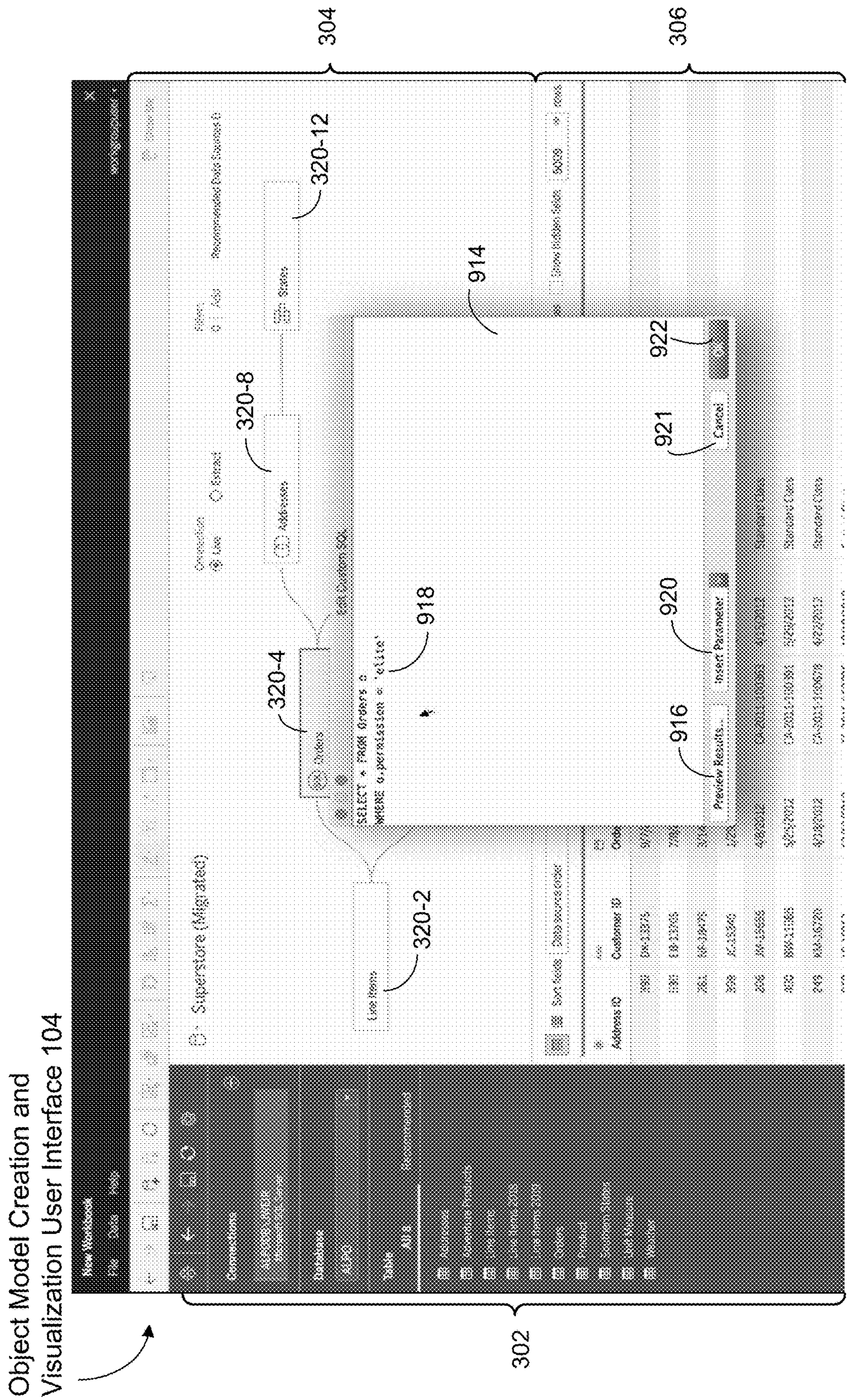
Figure 9F:
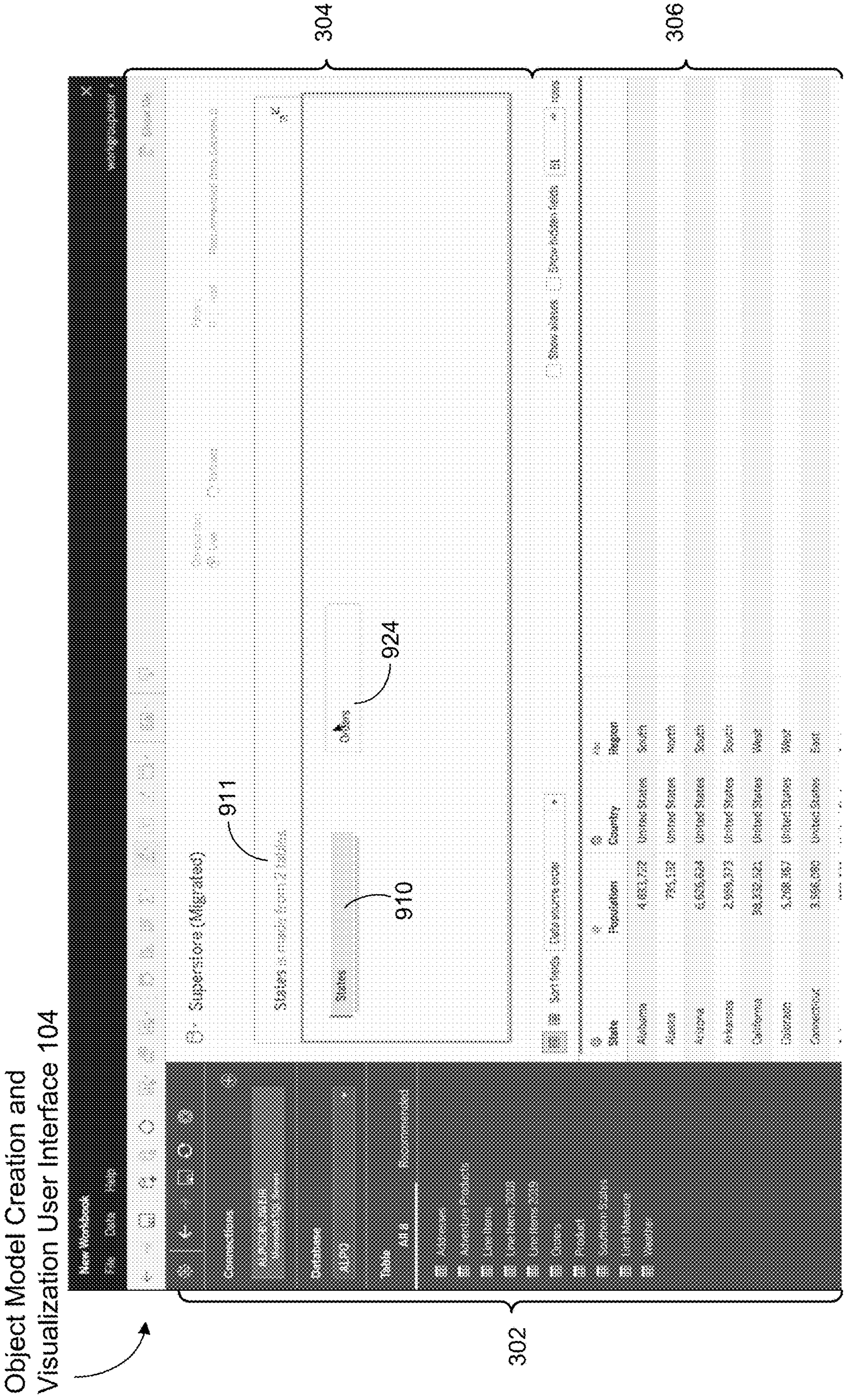
Figure 9G:
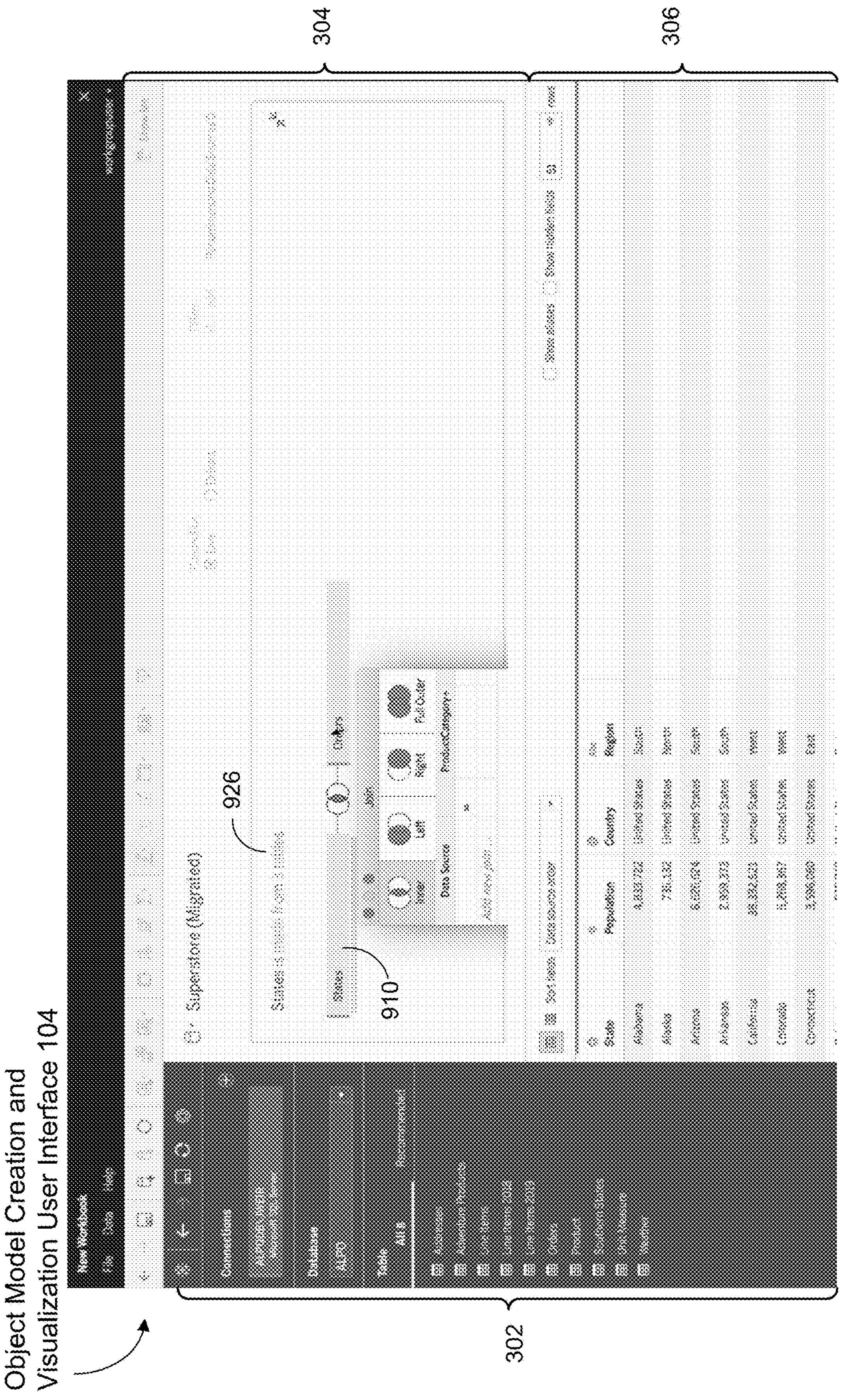

In contrast to the other objects in the object model, as shown in FIG. 9E, the Orders object (corresponding to the object icon 320-4) is a custom SQL object as indicated by the details 914. In some implementations, the details 914 can be edited or customized further by the user. For example, the query 918 can be edited by the user, the results of the query can be previewed by selecting an affordance 916, and/or parameters for the query can be inserted by selecting another affordance 920, according to some implementations. The user can cancel or revert back from the edit interface using an affordance 921 to cancel operations or by selecting an affordance (e.g., an OK button 922), according to some implementations. Further, as illustrated in FIGS. 9F and 9G, components of an object model can be extended or edited further (e.g., new objects added or old objects deleted). In FIG. 9F, the States object 910 is made of two tables (as indicated by the indicator 911) is joined with the Orders table (object icon 924). FIG. 9G illustrates an updated visualization in the visualization region 304 for the States object (e.g., indicating (926) that the States object is now made from 3 tables instead of 2 tables, as shown in FIG. 9F).

Figure 10A:
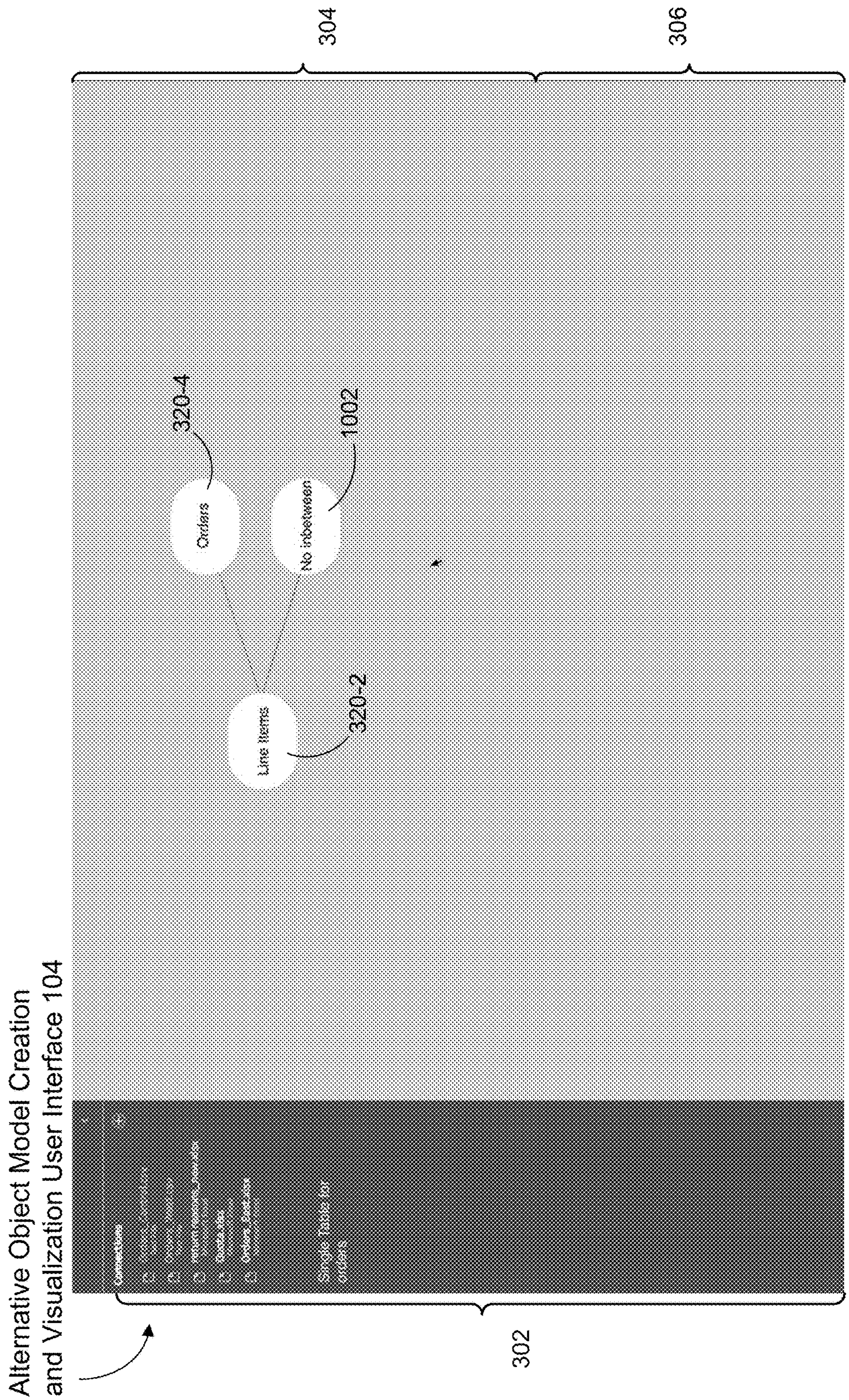
Figure 10B:
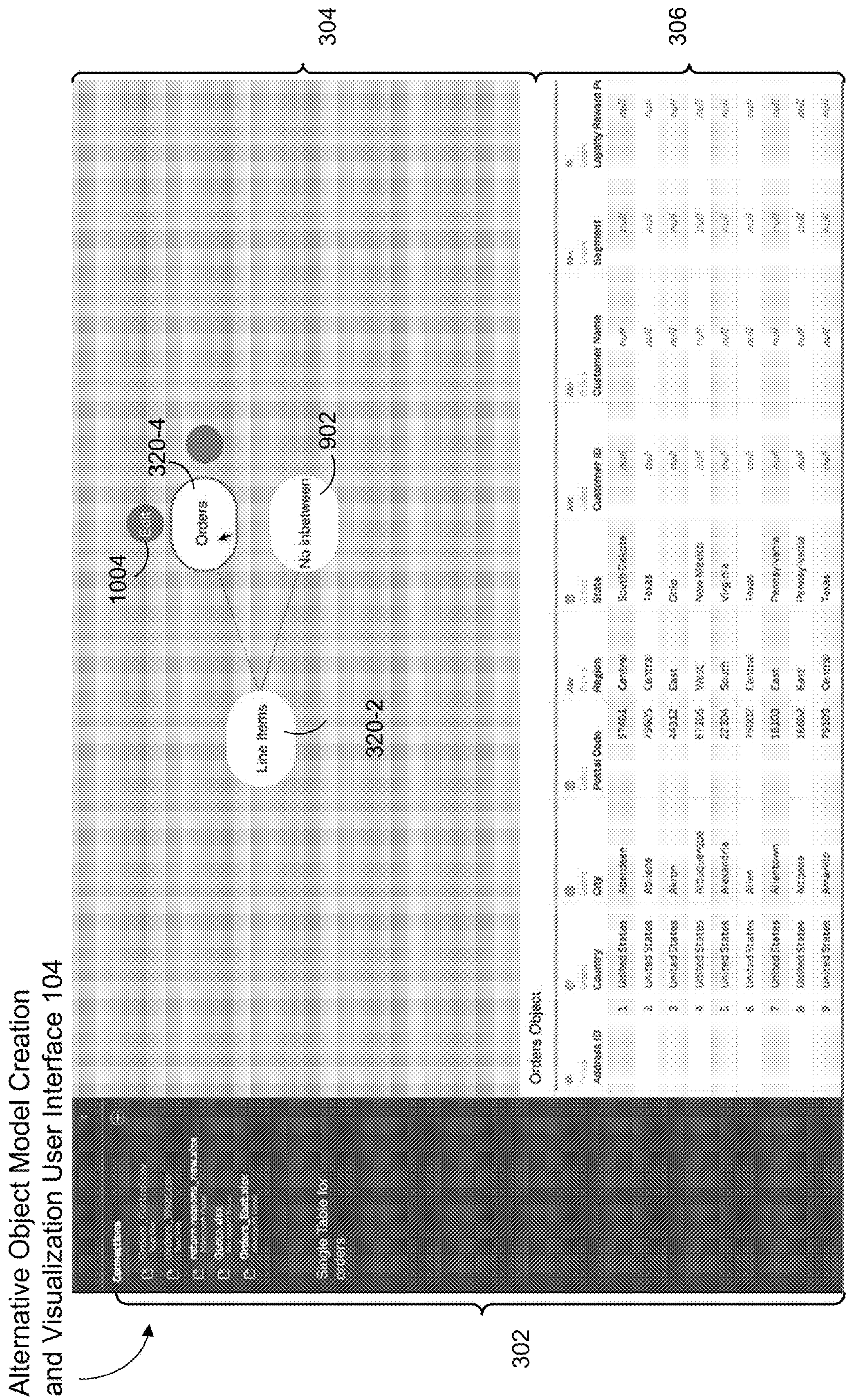
Figure 10C:
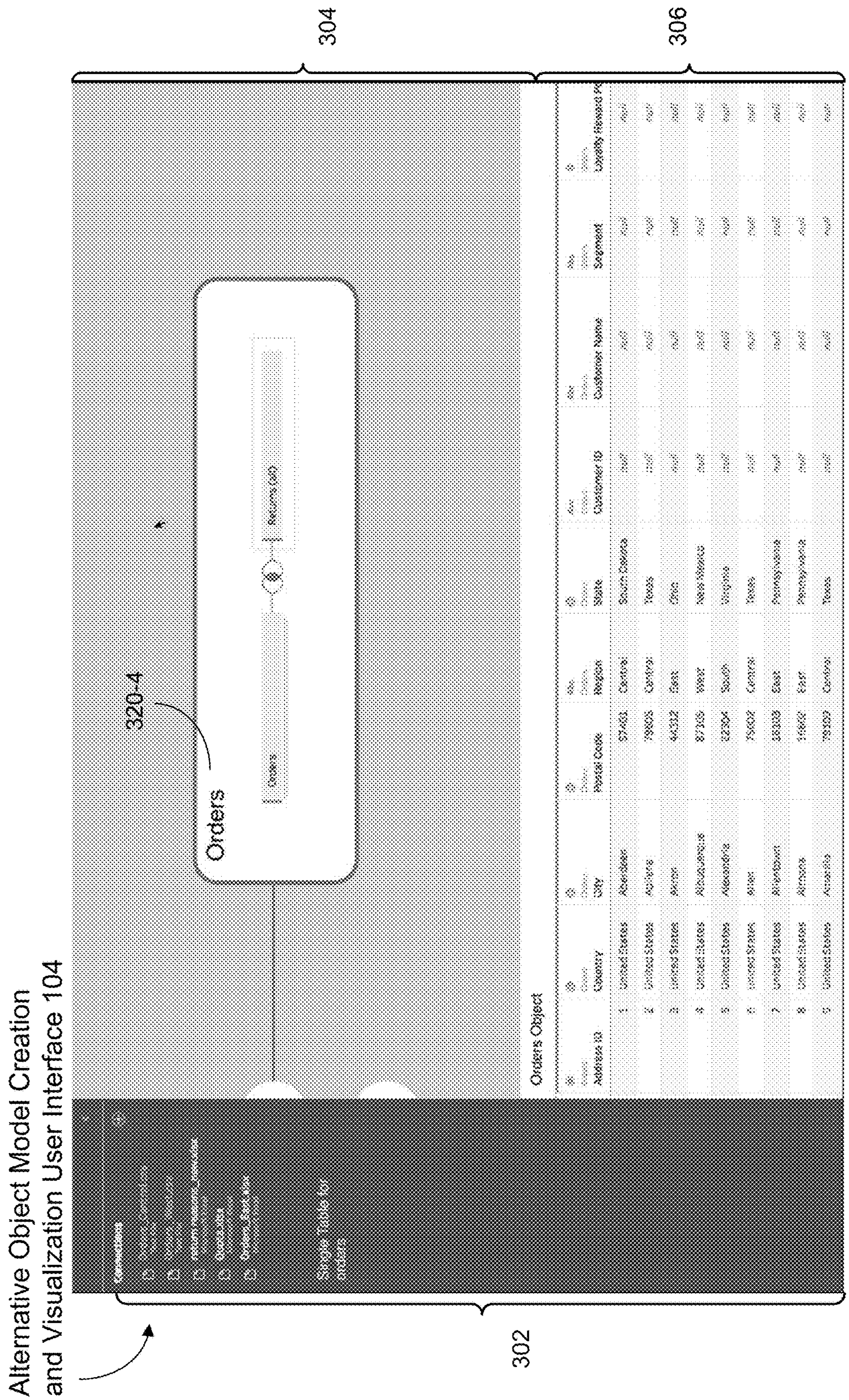
Figure 10D:
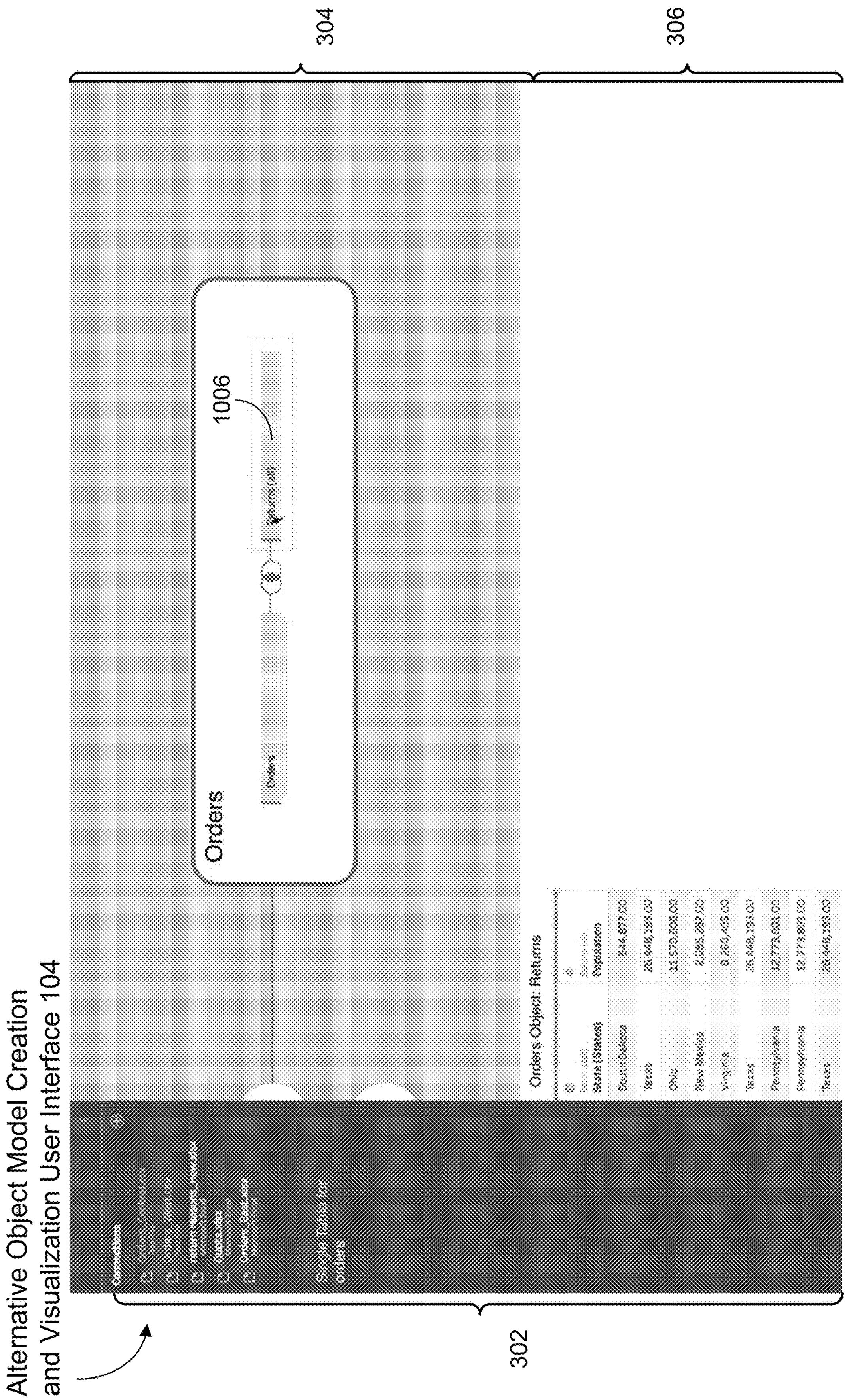
Figure 10E:
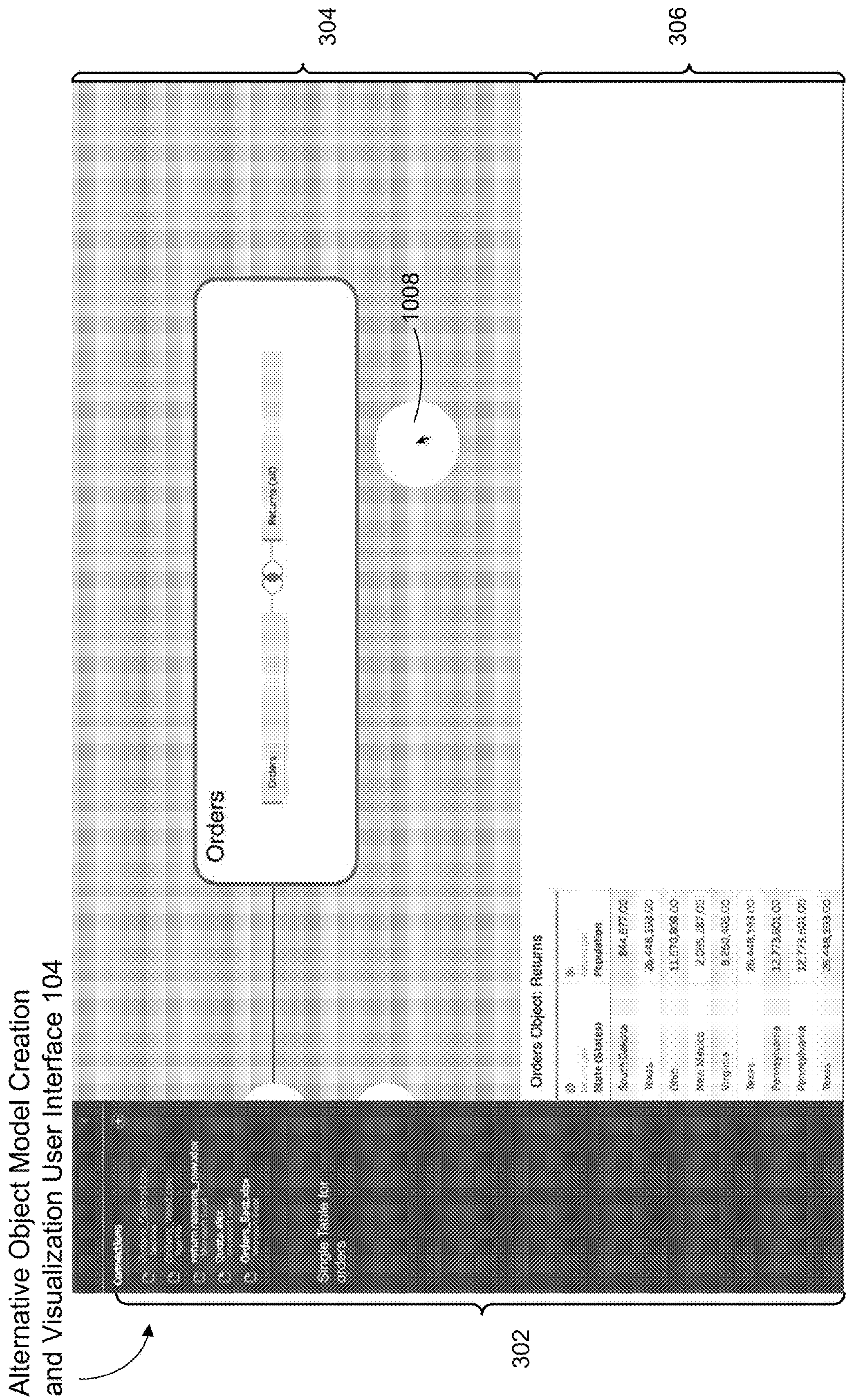

FIGS. 10A-10E are screen shots that illustrate an alternative user interface 104 for creating and visualizing object models, in accordance with some implementations. As shown in FIG. 10A, in some implementations, the object model visualization region 304 displays an object model using circles or ovals (or any similar shapes, such as rectangles). Each icon corresponds to a respective data object (e.g., the objects 320-2, 320-4, and 1002, in this example), connected by edges. The data grid region 306 is empty initially. Referring next to FIG. 10B, in some implementations, when the user selects an object icon (the Orders object 320-4 in this example), the object is highlighted or emphasized, and/or one or more options or affordances 1004 to edit or manipulate the object is displayed to the user, according to some implementations. In some implementations, the data grid region 306 is updated to display the details of the selected object. When the user selects the edit option 1004 for the object, as illustrated in the screen shot in FIG. 10C, the high-level object diagram of the object (the Orders object 320-4) is displayed in the visualization region 304, according to some implementations. As illustrated in FIG. 10D, a user can examine the contents of components of the object (e.g., the Returns table 1006 in the Orders object in FIG. 10D). In some implementations, the data grid region 306 is updated accordingly. As shown in the screen shot shown in FIG. 10E, a user can revert back from the component object (e.g., zoom out) to the parent object model by clicking away from the object (e.g., click at a position 1008), according to some implementations. Some implementations allow users to disassemble or delete one or more objects from an object model. For example, a user can drag an object icon out of or away from an object model and the corresponding object is removed from the object model. Some implementations automatically adjust the object model (e.g., fix up any connections from or to the removed object, chain the other objects in the object model).

Figure 11A:
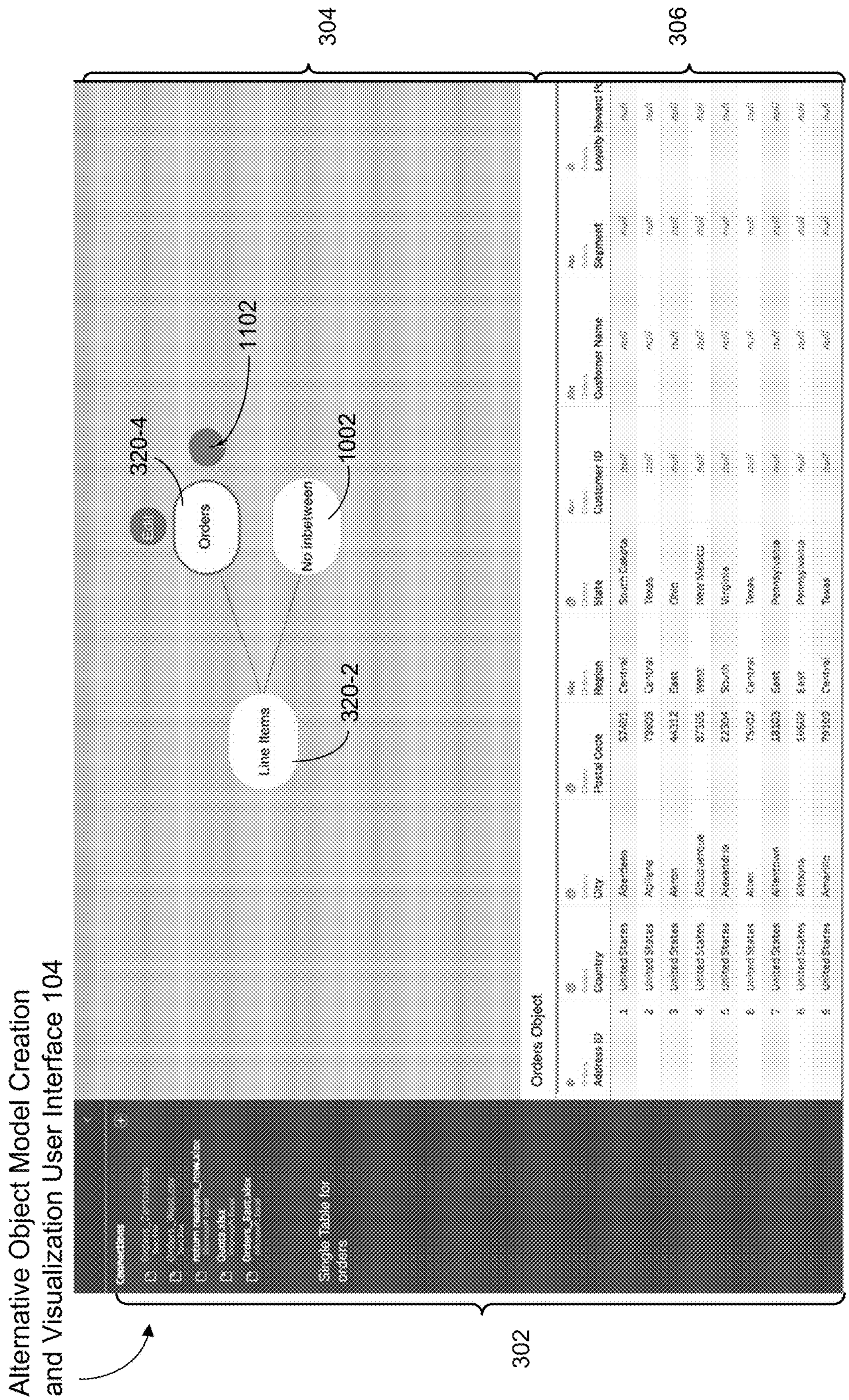
Figure 11B:
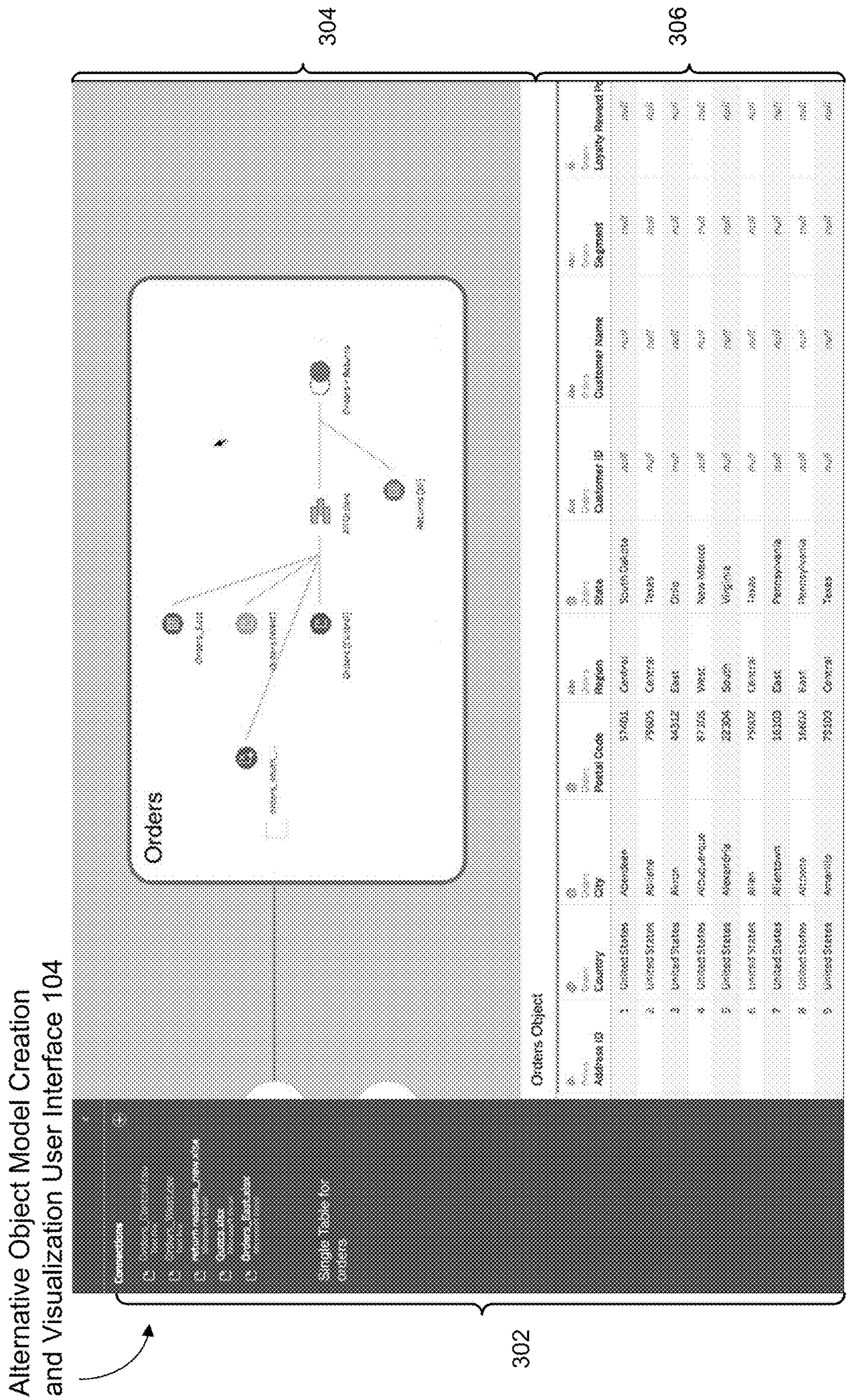
Figure 11C:
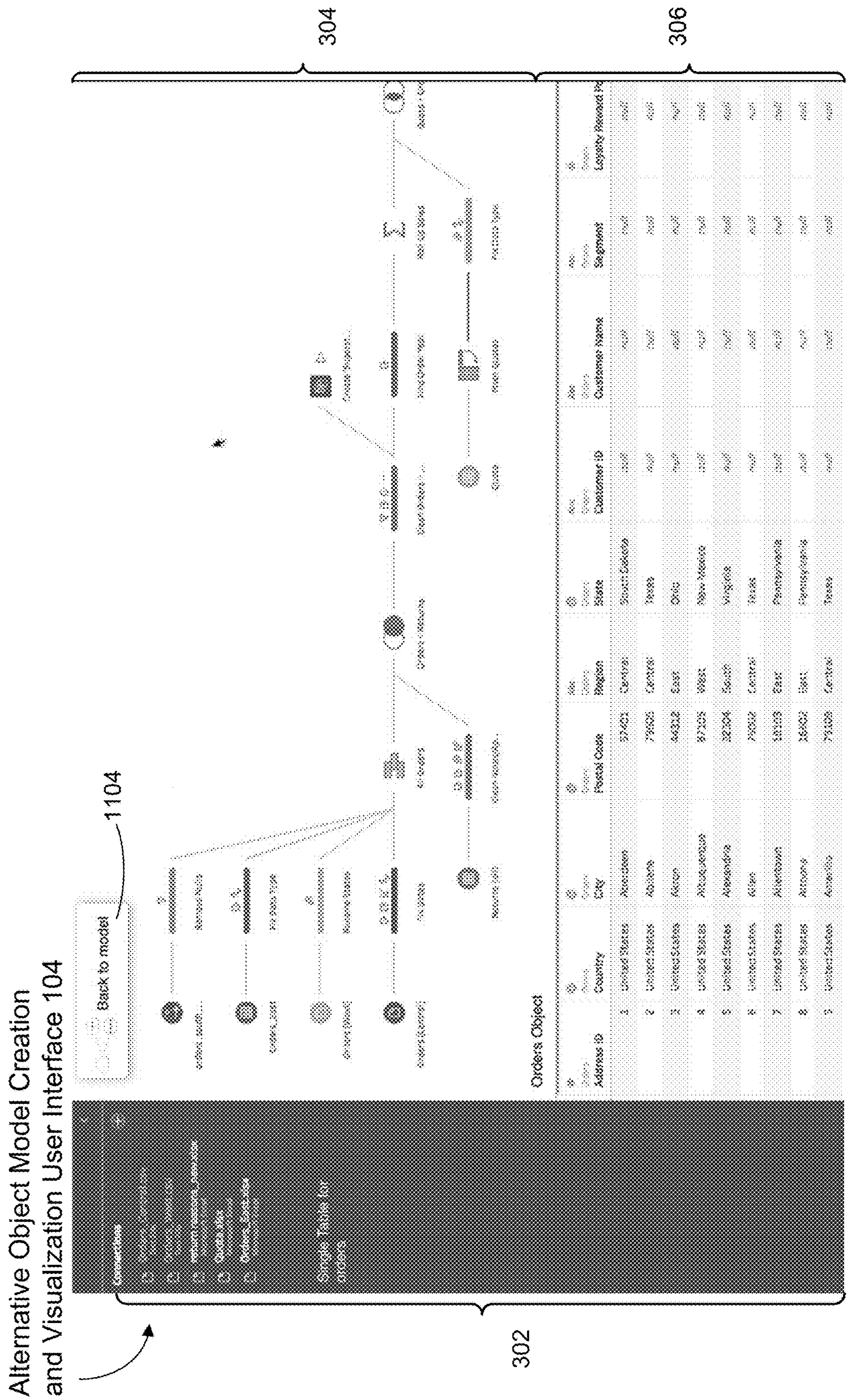
Figure 11D:
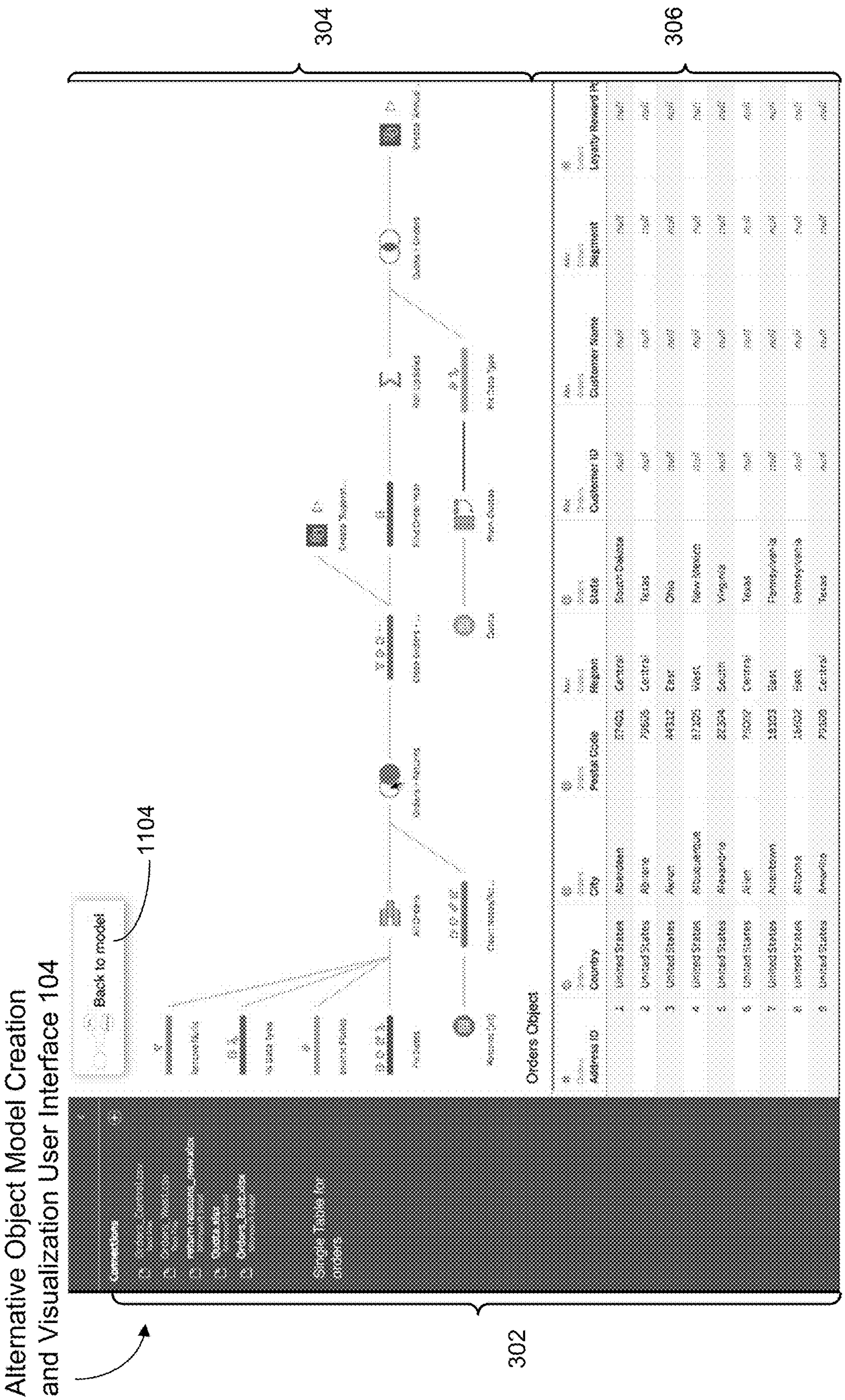

FIGS. 11A-11D are screen shots that illustrate a process for editing data preparation flows of components (objects) of an object model, using the alternative user interface 104, in accordance with some implementations. Some implementations provide an option or an affordance (e.g., the circle region 1102) to view and/or edit data preparation flows corresponding to data objects. For example, when the user selects (e.g., clicks) the option 1102 in FIG. 11A, the display in the visualization region 304 refreshes or updates to show the details of the data preparation flow for the Orders object, as shown in FIG. 11B, according to some implementations. In some implementations, as illustrated in FIGS. 11C and 11D, the user can edit or modify steps of the data preparation flow (e.g., modify a union or cleaning processes in the flow). Some implementations provide an option 1104 to return to the model once the user completes modifying the data preparation flow for the object.

Figure 12A:
FIGS. 12A-12L and 13A-13F illustrate techniques for providing visual cues in an interactive application for creation and visualization of object models, in accordance with some implementations.
Figure 12B:
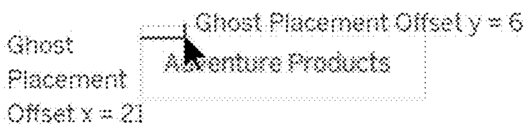

FIGS. 12A-13F illustrate techniques for providing visual cues in an interactive application for creation and visualization of object models, in accordance with some implementations. FIG. 12A shows an example of a ghost object 1202, which is generated when a user selects a table to add to an object model. In some implementations, the user can drag the object 1202 onto (or towards) an object model visualization region. Some implementations use distinct styles or dimensions for different types of objects (e.g., a first type for an object that is made of one table and another type for an object that is made of multiple tables). As illustrated in FIG. 12B, in some implementations, the ghost object is placed at an offset (e.g., an offset of 6 pixels vertically and 21 pixels horizontally) relative to the mouse position (or the cursor).

Figure 12C:
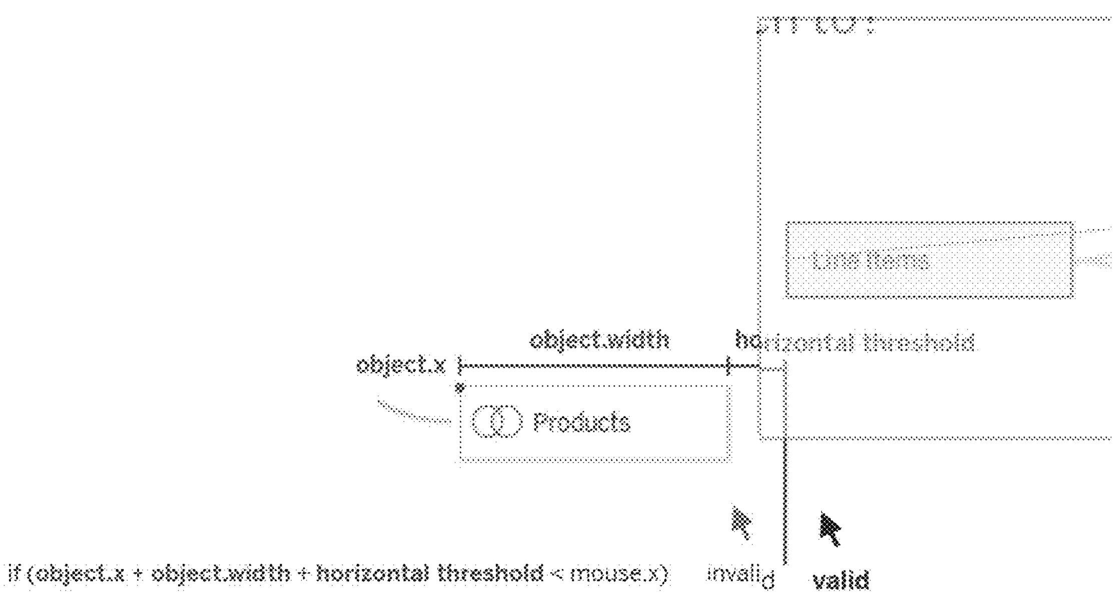
Figure 12D:
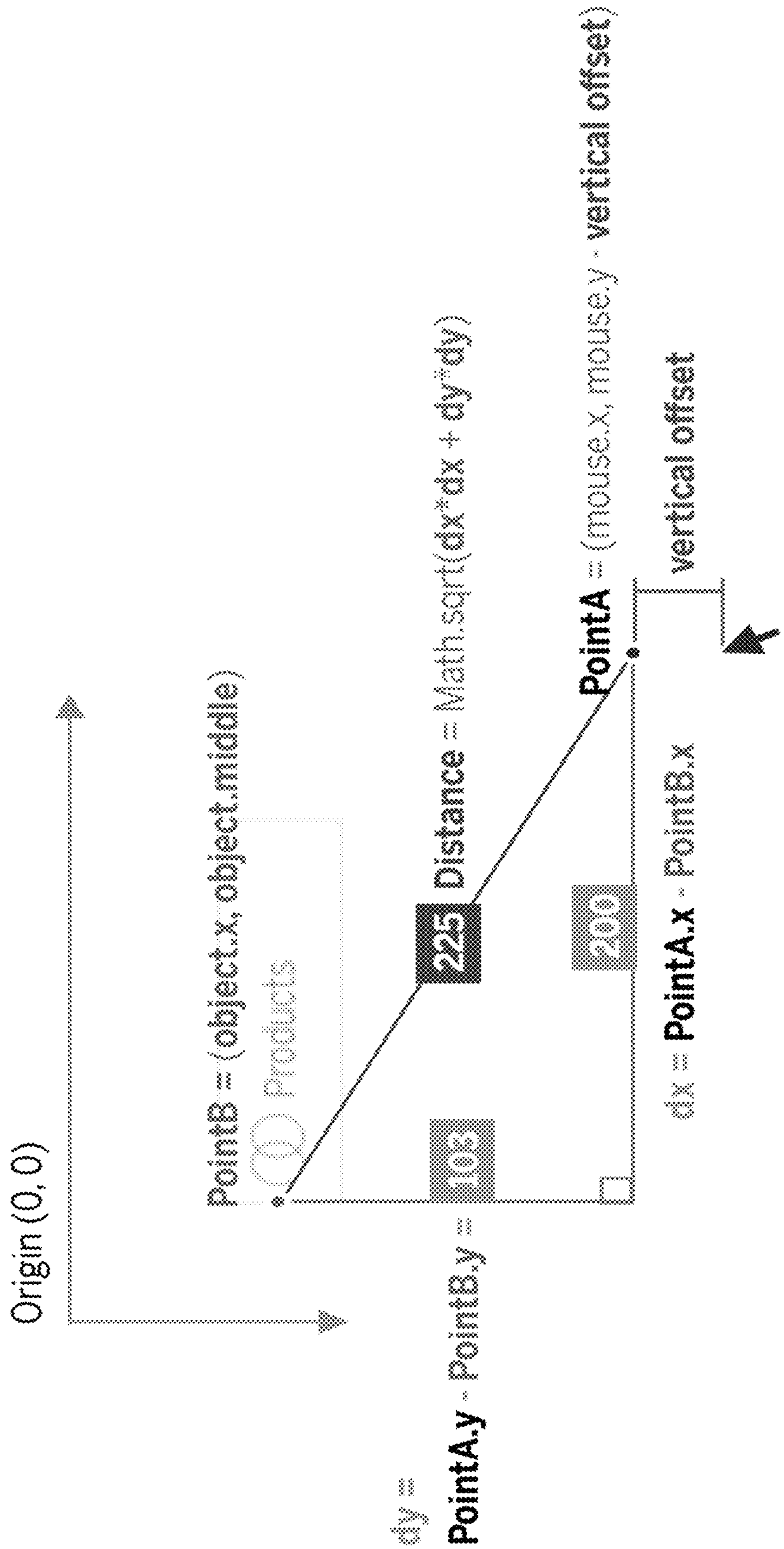
Figure 12E:
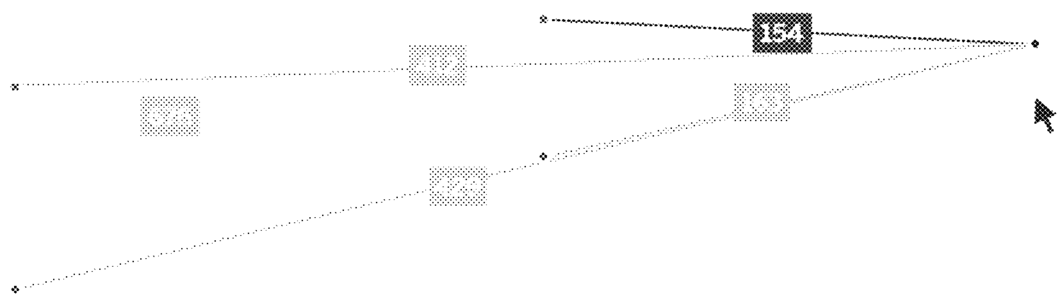
Figure 12F:
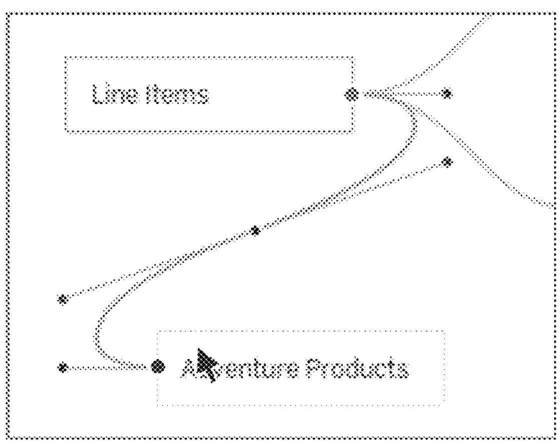
Figure 12G:
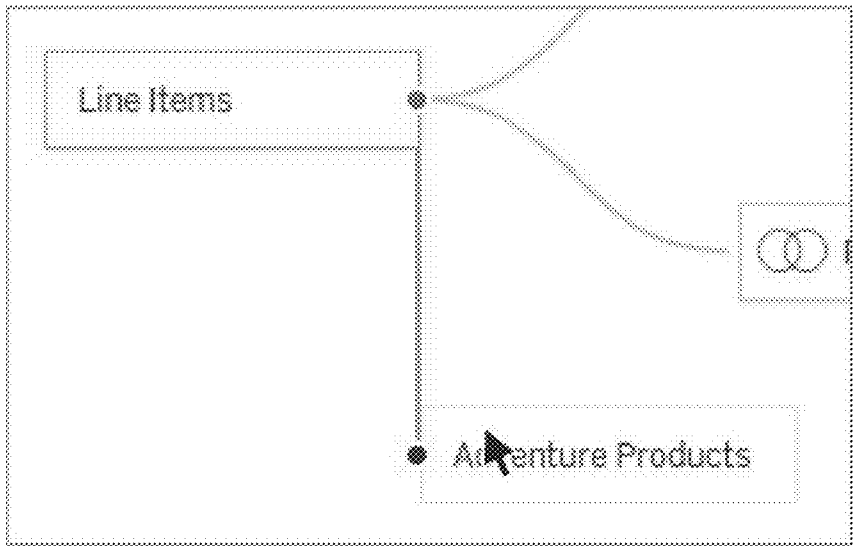
Figure 12H:
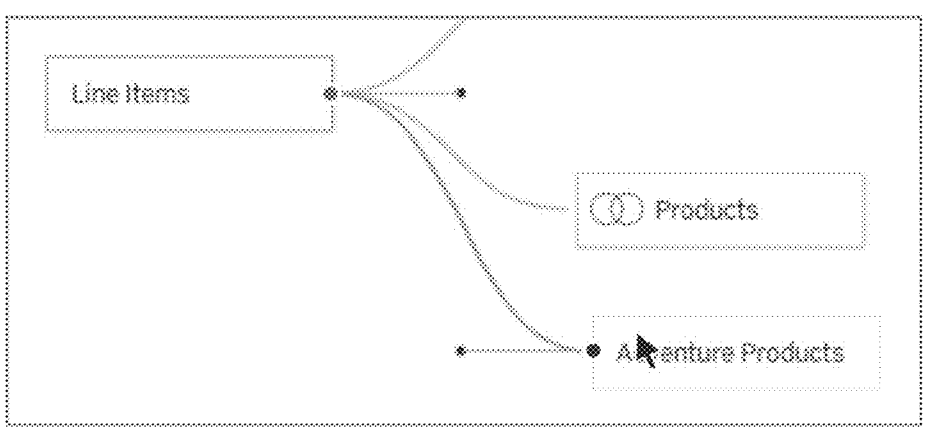

FIGS. 12C-12H illustrate heuristics for determining a neighboring object to attach a visual cue (e.g., a noodle object). As shown in FIG. 12C, some implementations identify all of the objects to the “left” of the cursor. In some implementations, an object is considered “left” of the cursor if the mouse is to the right of its horizontal threshold as illustrated in FIG. 12C. In some implementations, the leftmost object in the graph is considered “left” of the cursor and does not need the calculation shown in FIG. 12C. As illustrated in FIG. 12D, in some implementations, an object's distance from the cursor is calculated based on its left and middle point, while including a vertical offset. Based on this information, some implementations determine the closest object (sometimes called the neighboring object icon), as illustrated further in FIG. 12E, according to some implementations. Some implementations render a visual cue (e.g., a noodle) to the closest object, as illustrated in FIG. 12F. Some implementations also style (e.g., highlight, emphasize, add color to) the closest object. In some implementations, the noodle or the visual cue renders differently if an end point is to the left or to the right of a start point. Some implementations use a double Bezier curve if the end point is to the left of the start point. As illustrated in FIG. 12G, some implementations use either a single Bezier curve or a double Bezier curve if the end point equals the start point. Some implementations use a single Bezier curve if the end point is to the right of the start point, as illustrated in FIG. 12H.

Figure 12I:
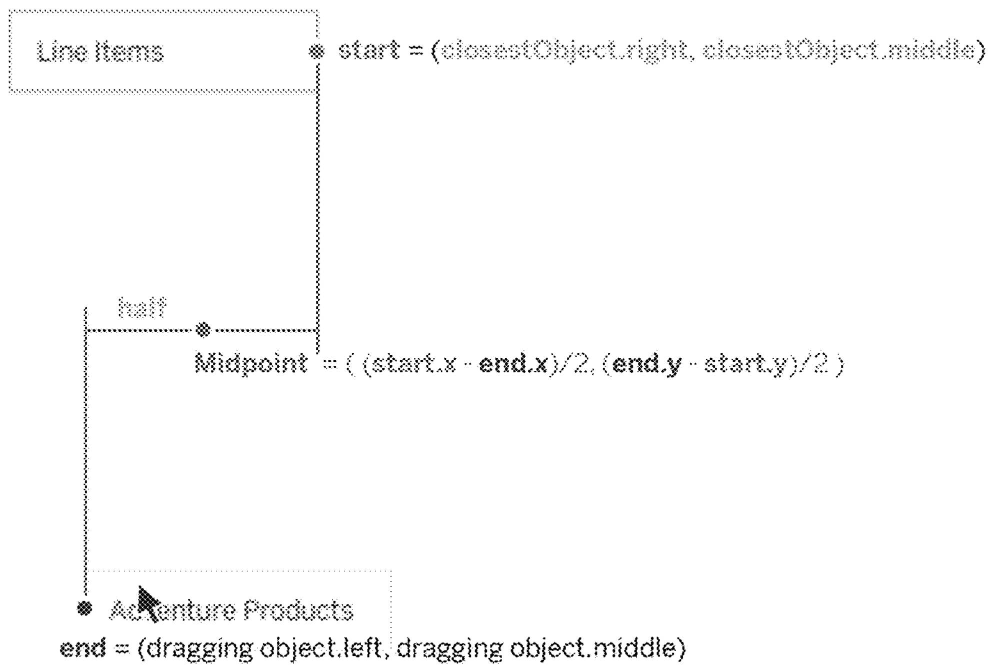
Figure 12J:
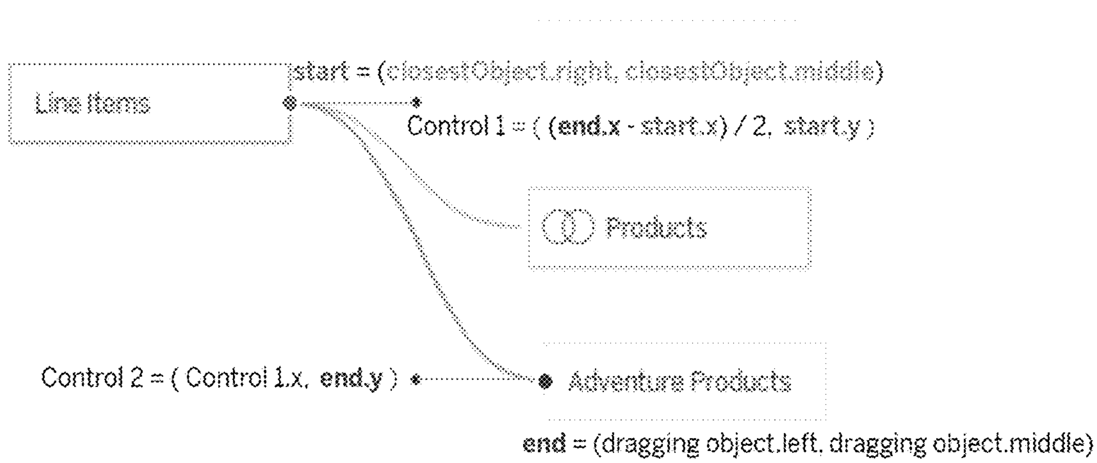
Figure 12K:
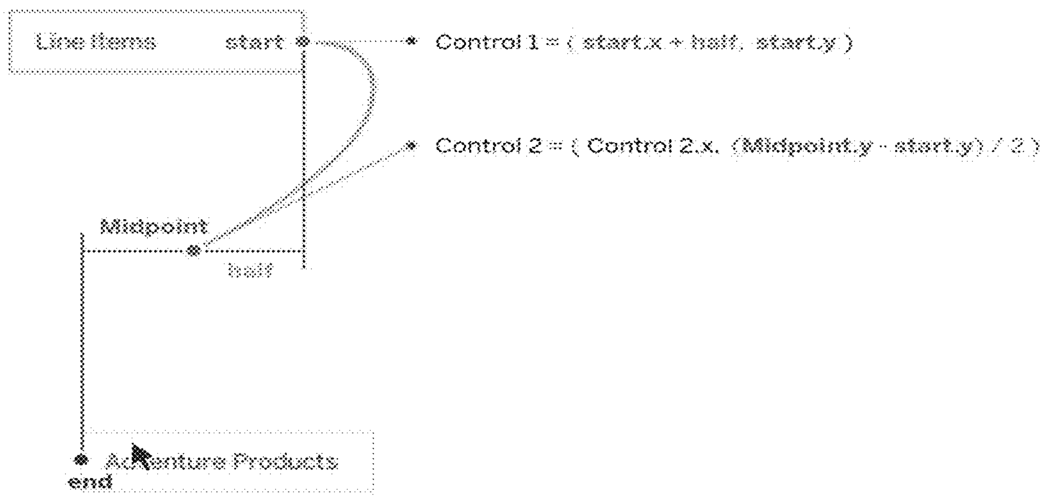
Figure 12L:
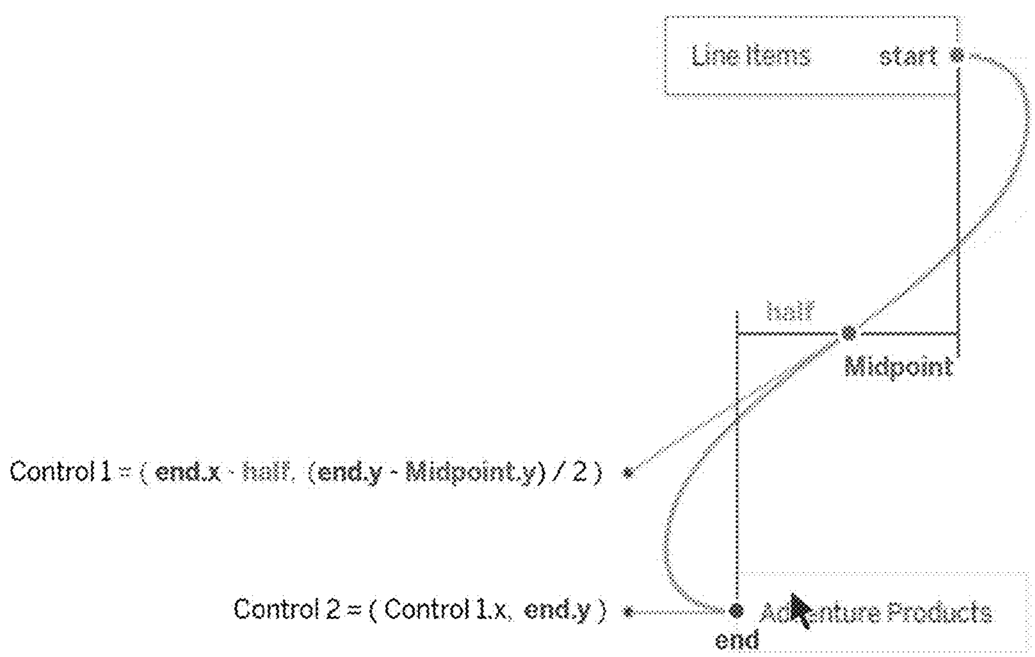

FIGS. 121-12L illustrate an example method for generating double Bezier curves, according to some implementations. In some implementations, as illustrated in FIG. 12I, the method determines a start point, a mid-point, and an end point. FIG. 12J illustrates an example method for generating single Bezier curves, according to some implementations. Some implementations use the techniques illustrated in FIG. 12K to draw the first curve, and/or use the techniques illustrated in FIG. 12L to draw the second curve of a double Bezier curve.

Figure 13A:
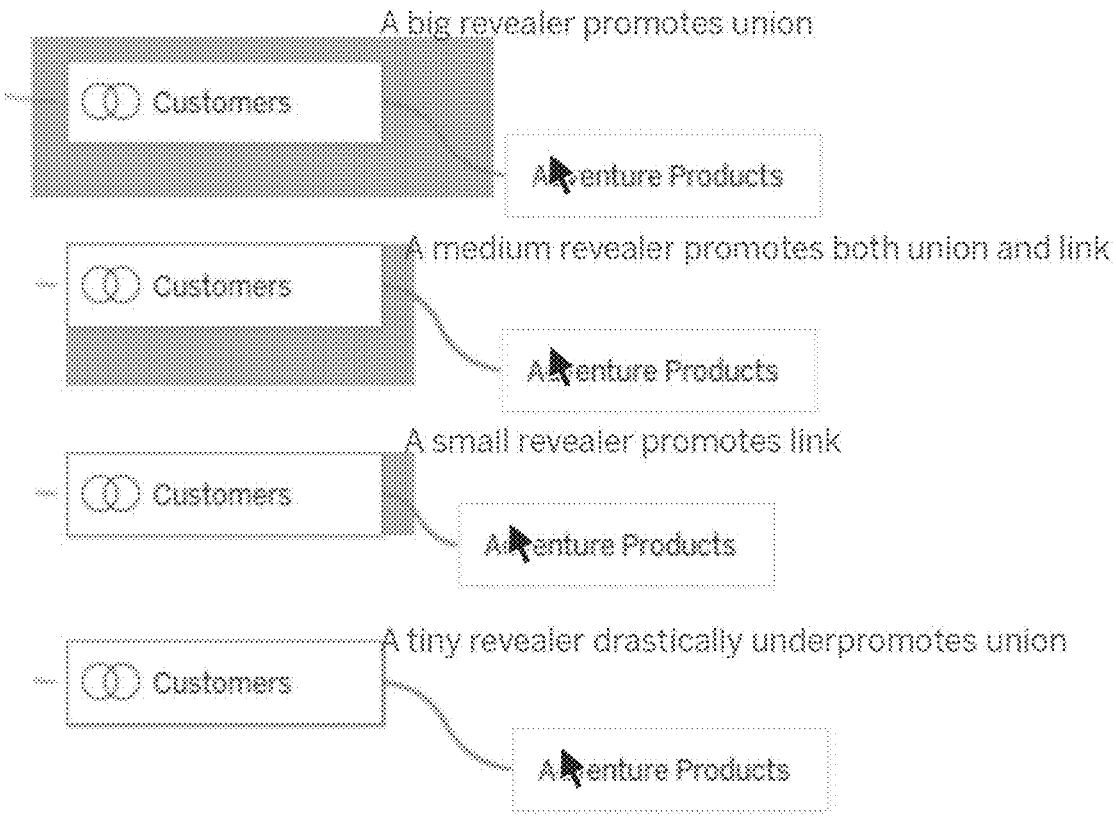
Figure 13B:
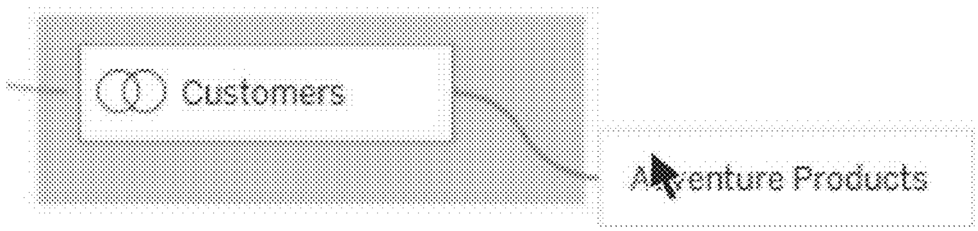
Figure 13C:
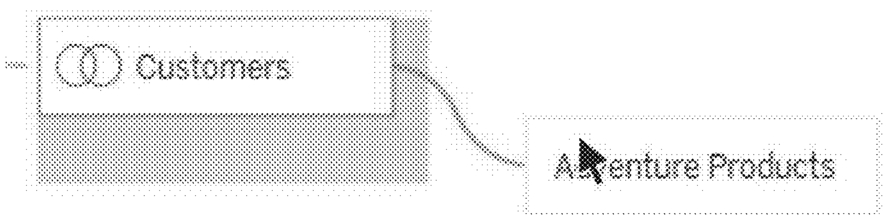
Figure 13D:
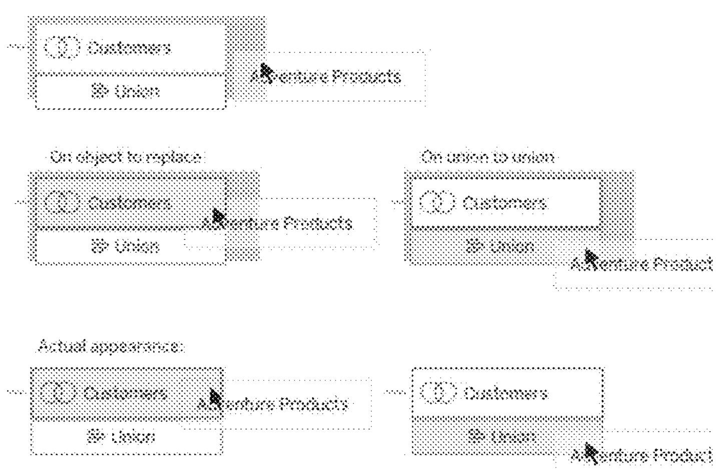
Figure 13E:
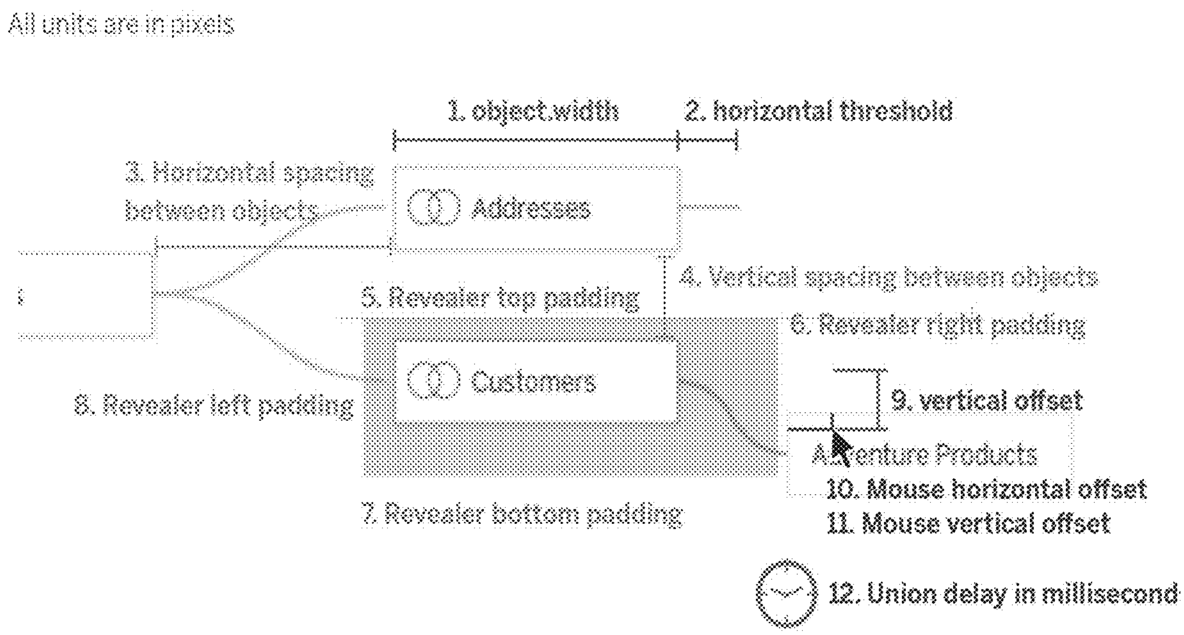
Figure 13F:
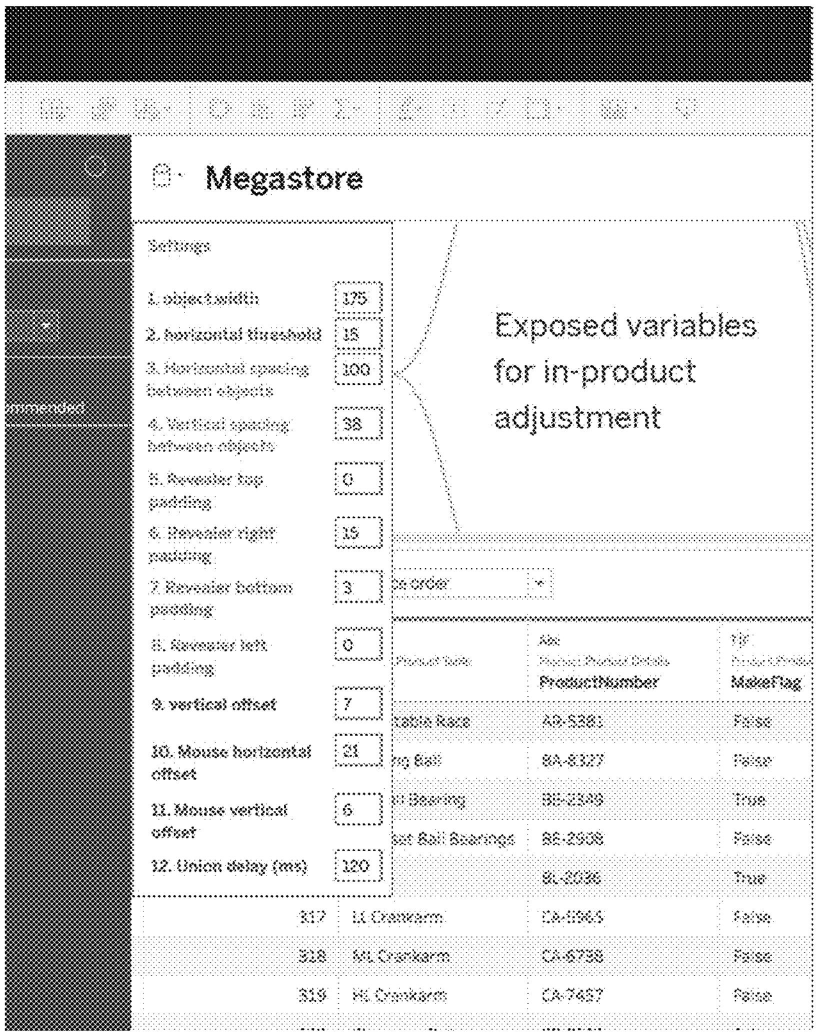

FIGS. 13A-13F further illustrate techniques for providing visual cues, according to some implementations. The examples use a union drop target for illustration, but similar techniques can be applied for other types of objects or icons for visualization cues. In some implementations, an invisible revealer area is dedicated to showing a union drop target, as illustrated in FIG. 13A. When the mouse is in the revealer area, the noddle is hidden and the system begins a drop target reveal process, according to some implementations. In some implementations, a union or link appear more or less often depending on the revealer's dimensions. Some implementations tune the thresholds and sizes of targets to match expectations of a user (e.g., via a feedback process). Referring next to FIGS. 13B and 13C, in some implementations, when the mouse enters the revealer area, the system waits for a delay (e.g., a few seconds) before hiding the noodle and showing the union target. FIG. 13B illustrates a user dragging the candidate object icon (for the Adventure Products object), and FIG. 13C illustrates the delay. In some implementations, the union target appears after a timer of a predetermined union delay (e.g., a few milliseconds) completes. In some implementations, dragging the icon outside of the revealer area before the predetermined union delay resets and cancels the timer if the timer has not completed. FIG. 13D illustrates when the union is revealed. FIGS. 13E and 13F illustrate some of the tunable parameters in some implementations. In some implementations, the parameters are interdependent variables, and each parameter is adjusted for an overall look and feel. The tunable parameters include, in various implementations, object width, horizontal threshold, horizontal and/or vertical spacing between objects, revealer top/bottom and/or right/left padding, vertical offset, mouse horizontal/vertical offsets, and/or union delay in milliseconds.

FIGS. 14A-14J provide a flowchart of a method 1400 for forming (1402) object models according to the techniques described above, in accordance with some implementations. The method 1400 is performed (1404) at a computing device 200 having one or more processors and memory. The memory stores (1406) one or more programs configured for execution by the one or more processors.

The computer displays (1408), in a connections region (e.g., the region 318), a plurality of data sources. Each data source is associated (1408) with a respective one or more tables. The computer concurrently displays (1410), in an object model visualization region (e.g., the region 304), a tree of one or more data object icons (e.g., the object icons 320-2, . . . , 320-12 in FIG. 3). Each data object icon represents (1410) a logical combination of one or more tables. While concurrently displaying the tree of the one or more data object icons in the object model visualization region and the plurality of data sources in the connections region, the computer performs (1412) a sequence of operations.

Figure 14A:
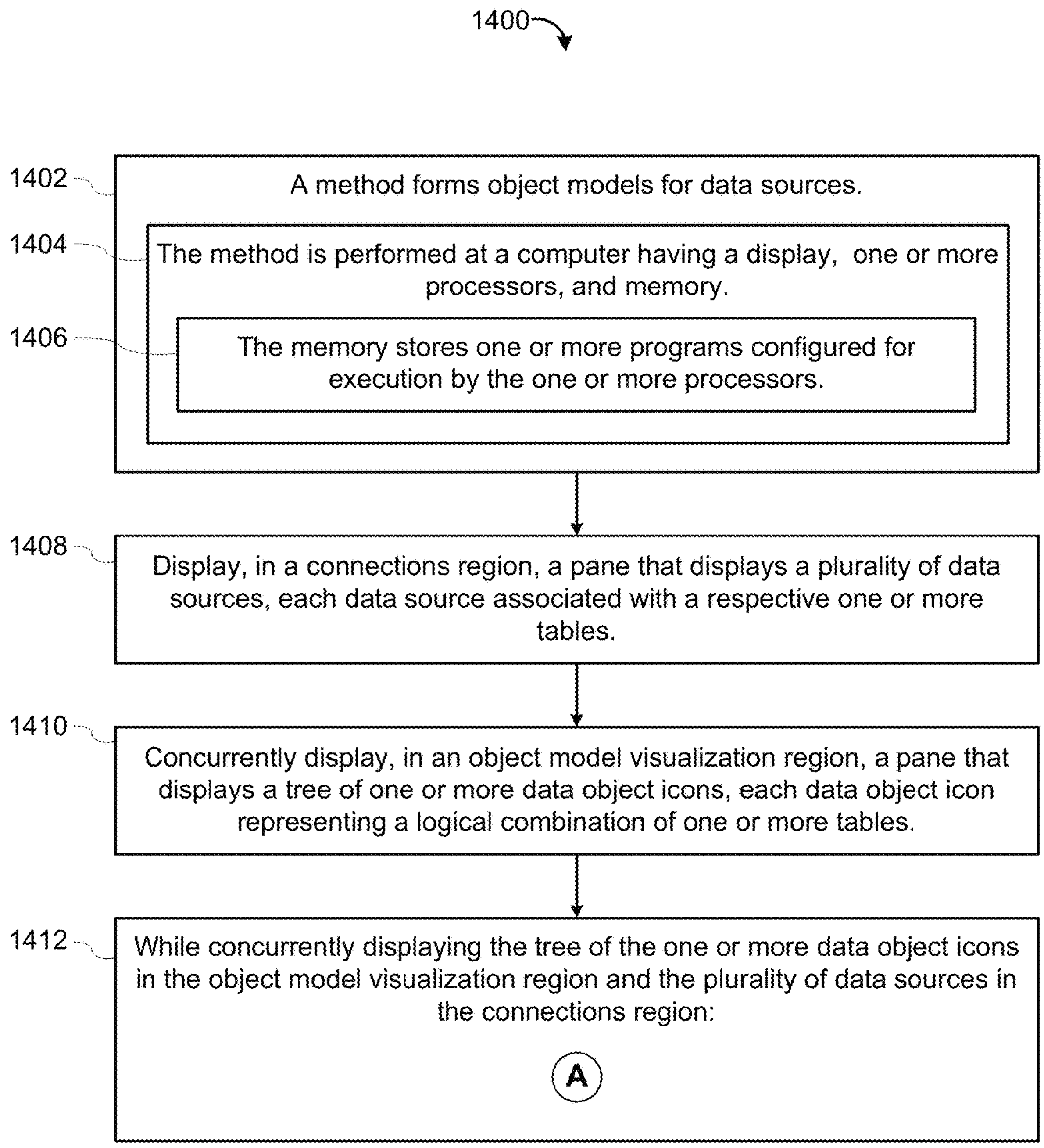
FIGS. 14A-14J provide a flowchart of a method for forming object models, in accordance with some implementations.
Figure 14B:
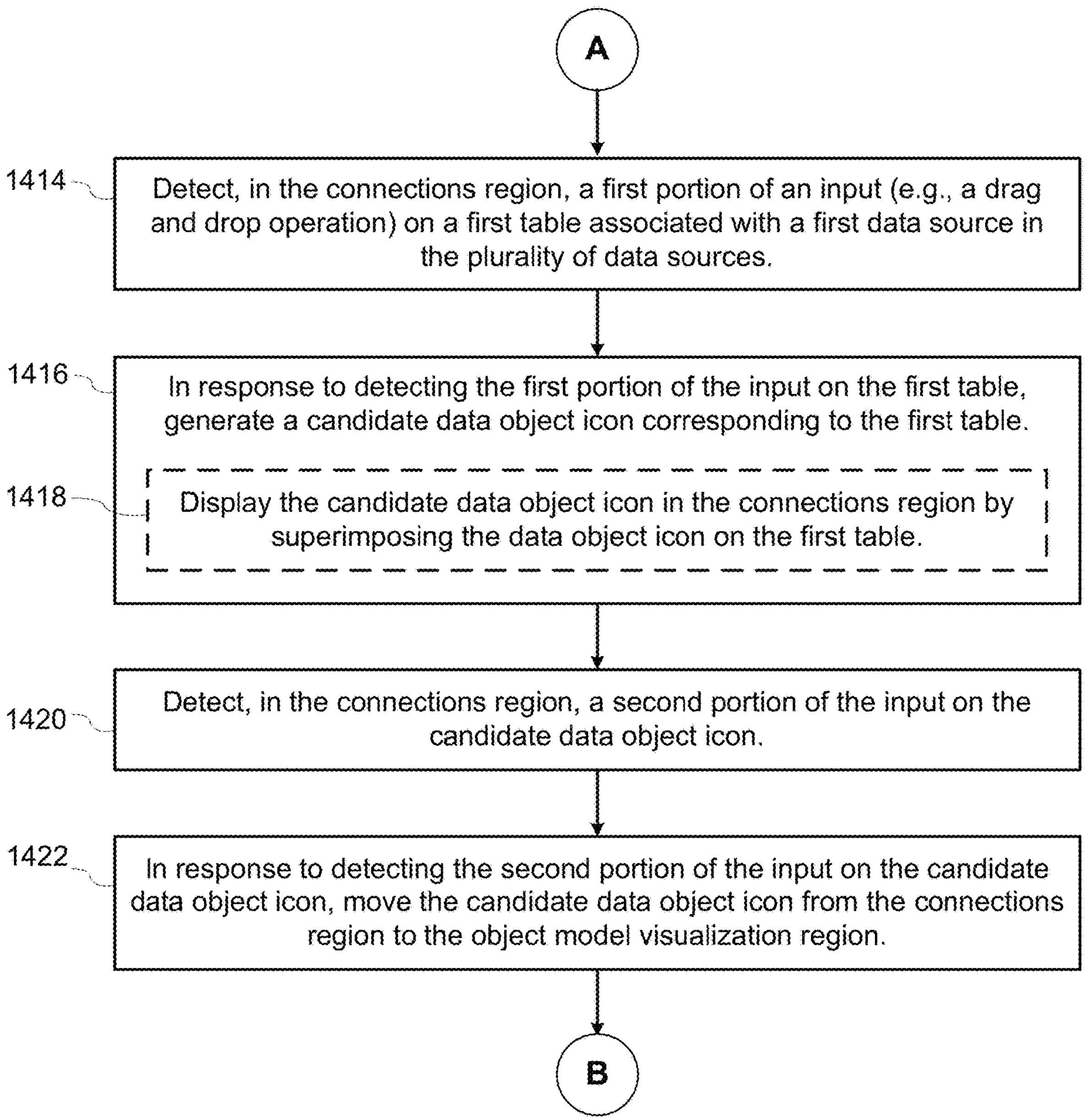

Referring next to FIG. 14B, the computer detects (1414), in the connections region, a first portion of an input on a first table associated with a first data source in the plurality of data sources. In some implementations, the input includes a drag and drop operation. In response to detecting the first portion of the input on the first table, the computer generates (1416) a candidate data object icon corresponding to the first table. In some implementations, the computer generates the candidate data object icon by displaying (1418) the candidate data object icon in the connections region and superimposing the data object icon over the first table.

The computer also detects (1420), in the connections region, a second portion of the input on the candidate data object icon. In response to detecting the second portion of the input on the candidate data object icon, the computer moves (1422) the candidate data object icon from the connections region to the object model visualization region.

Figure 14C:
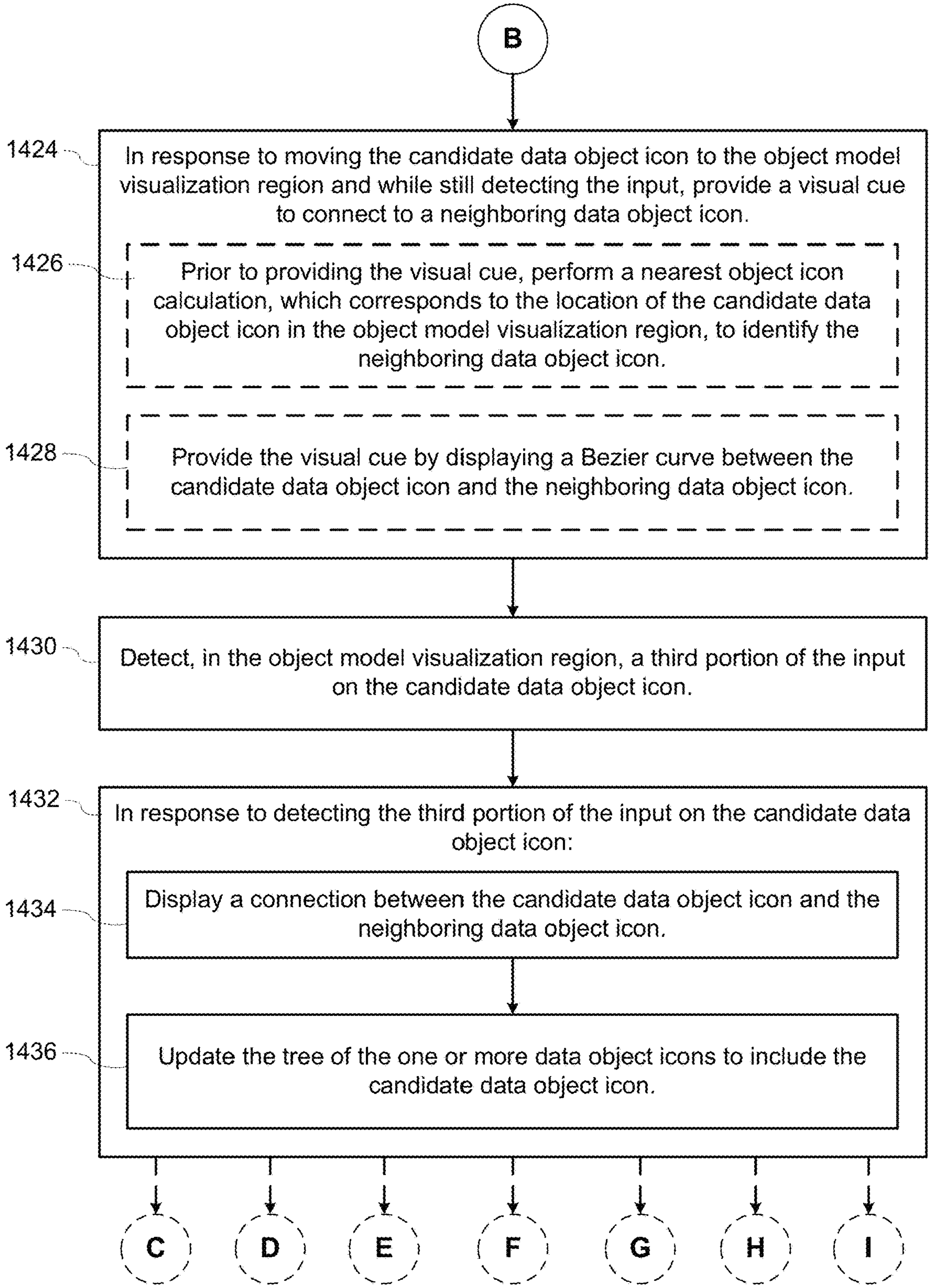

Referring next to FIG. 14C, in response to moving the candidate data object icon to the object model visualization region and while still detecting the input, the computer provides (1424) a visual cue to connect to a neighboring data object icon. In some implementations, prior to providing the visual cue, the computer performs (1426) a nearest object icon calculation, which corresponds to the location of the candidate data object icon in the object model visualization region, to identify the neighboring data object icon. In some implementations, the computer provides the visual cue by displaying (1428) a Bézier curve between the candidate data object icon and the neighboring data object icon.

The computer detects (1430), in the object model visualization region, a third portion of the input on the candidate data object icon. In response (1432) to detecting the third portion of the input on the candidate data object icon, the computer displays (1434) a connection between the candidate data object icon and the neighboring data object icon, and updates (1436) the tree of the one or more data object icons to include the candidate data object icon.

Figure 14D:
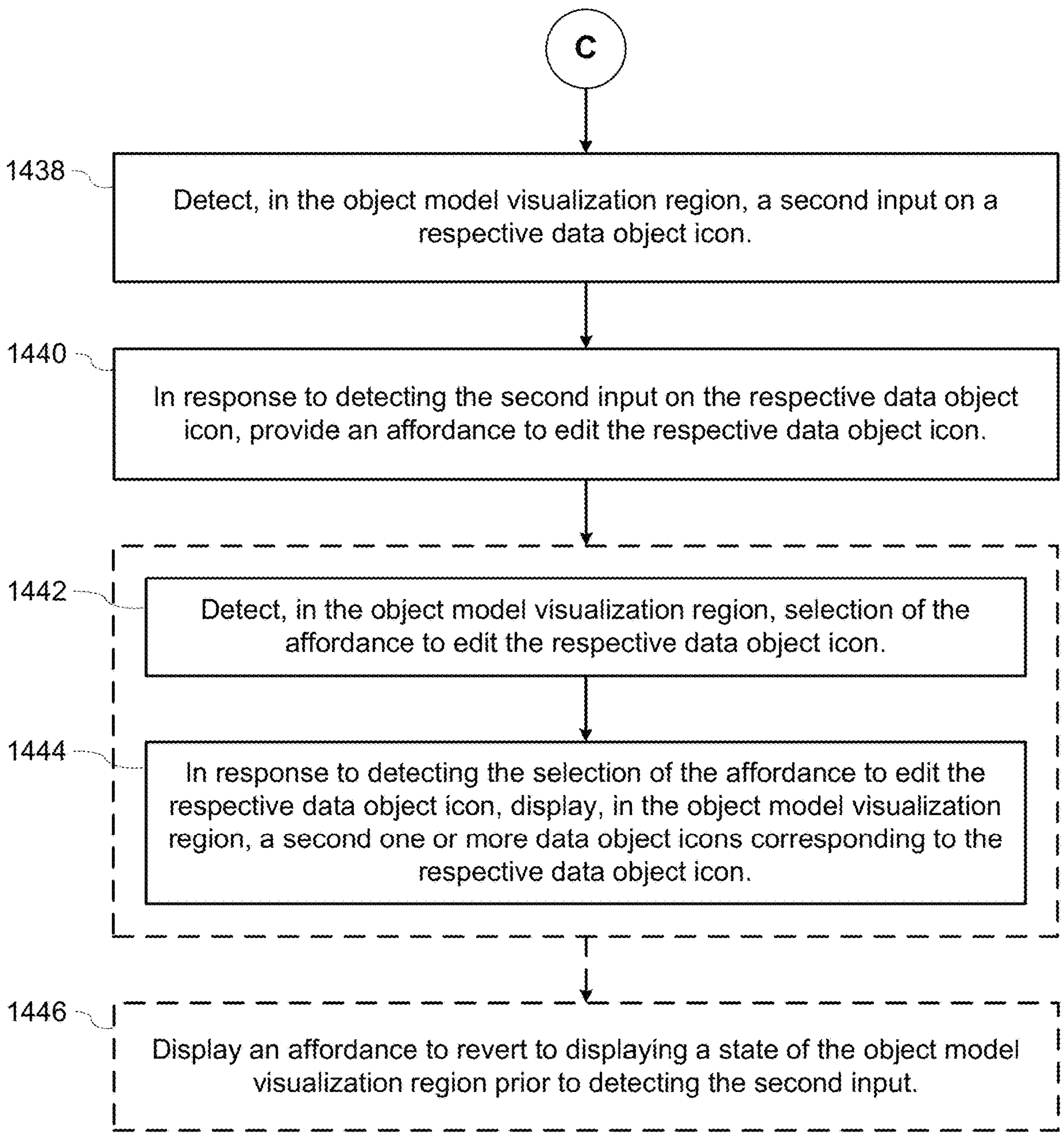

Referring next to FIG. 14D, in some implementations, the computer detects (1438), in the object model visualization region, a second input on a respective data object icon. In response to detecting the second input on the respective data object icon, the computer provides (1440) an affordance to edit the respective data object icon. In some implementations, the computer detects (1442), in the object model visualization region, selection of the affordance to edit the respective data object icon. In response to detecting the selection of the affordance to edit the respective data object icon, the computer displays (1444), in the object model visualization region, a second one or more data object icons corresponding to the respective data object icon. In some implementations, the computer displays (1446) an affordance to revert to displaying the state of the object model visualization region prior to detecting the second input.

Figure 14E:
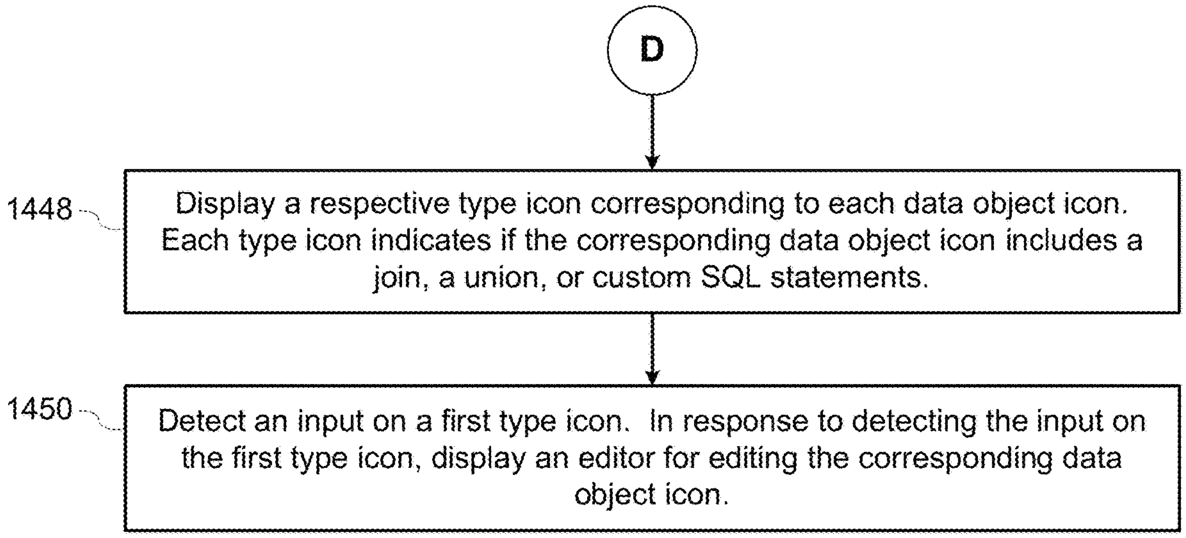

Referring next to FIG. 14E, in some implementations, the computer displays (1448) a respective type icon corresponding to each data object icon. In some implementations, each type icon indicates whether the corresponding data object icon includes a join, a union, or custom SQL statements. In some implementations, the computer detects (1450) an input on a first type icon. In response to detecting the input on the first type icon, the computer displays an editor for editing the corresponding data object icon.

Figure 14F:
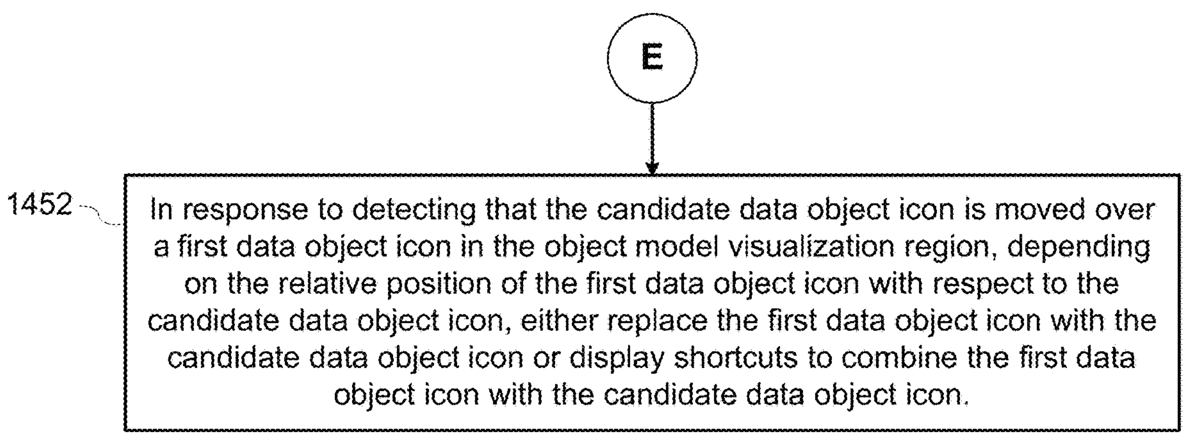

Referring next to FIG. 14F, in some implementations, in response to detecting that the candidate data object icon is moved over a first data object icon in the object model visualization region, depending on the relative position of the first data object icon with respect to the candidate data object icon, the computer either replaces (1452) the first data object icon with the candidate data object icon or displays (1452) shortcuts to combine the first data object icon with the candidate data object icon.

Figure 14G:
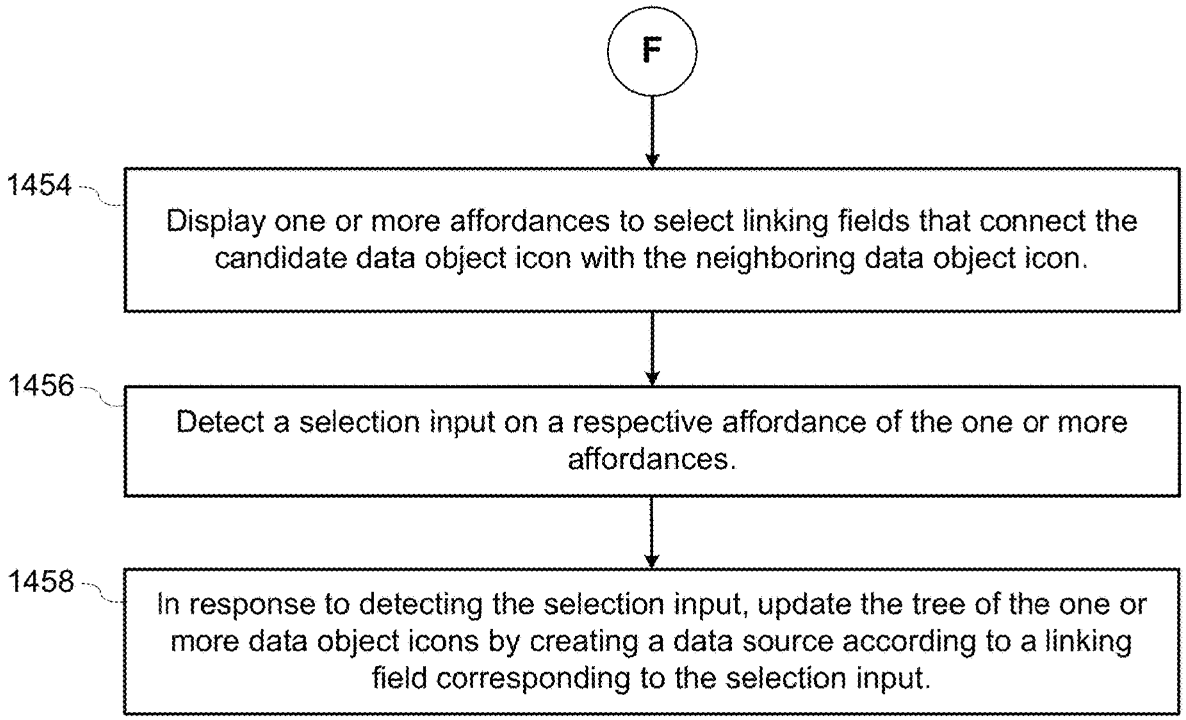

Referring next to FIG. 14G, in some implementations, in response to detecting the third portion of the input on the candidate data object icon, the computer displays (1454) one or more affordances to select linking fields that connect the candidate data object icon with the neighboring data object icon. The computer detects (1456) a selection input on a respective affordance of the one or more affordances. In response to detecting the selection input, the computer updates (1458) the tree of the one or more data object icons by creating a data source according to a linking field corresponding to the selection input.

Figure 14H:
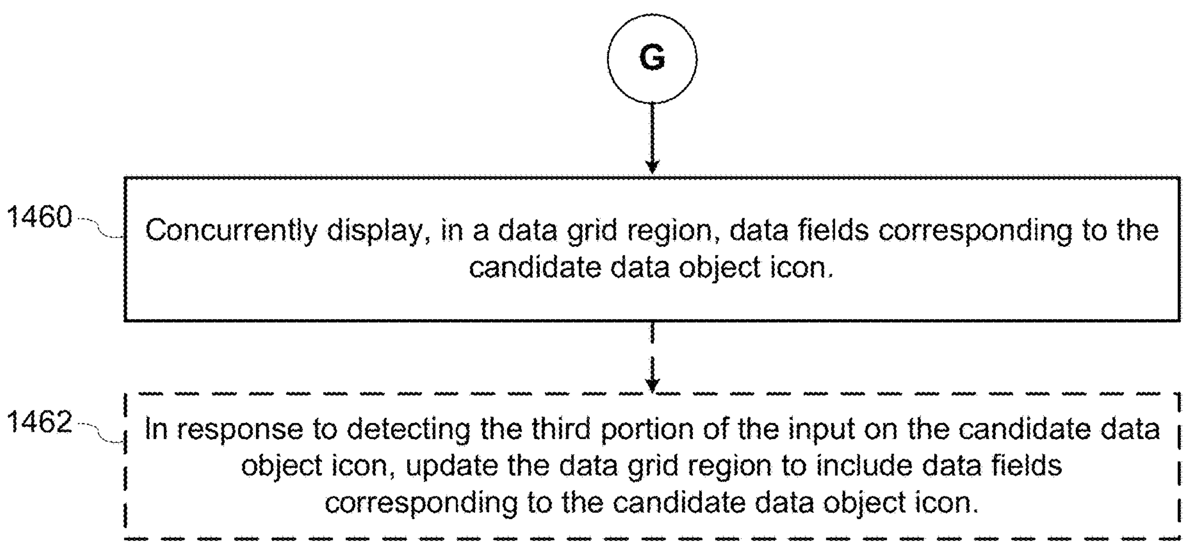

Referring next to FIG. 14H, in some implementations, the computer concurrently displays (1460), in a data grid region, data fields corresponding to the candidate data object icon. In some implementations, in response to detecting the third portion of the input on the candidate data object icon, the computer updates (1462) the data grid region to display data fields corresponding to the updated tree of the one or more data object icons.

Figure 14I:
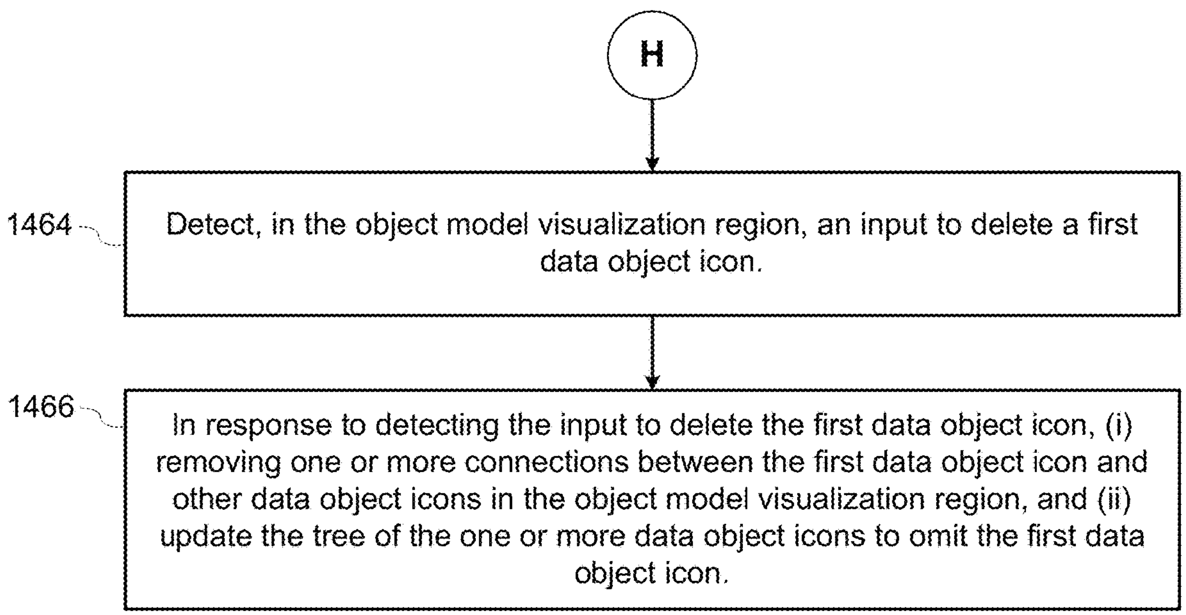

Referring next to FIG. 14I, in some implementations, the computer detects (1464), in the object model visualization region, an input to delete a first data object icon. In response to detecting the input to delete the first data object icon, the computer removes (1466) one or more connections between the first data object icon and other data object icons in the object model visualization region, and updates (1466) the tree of the one or more data object icons to omit the candidate data object icon.

Figure 14J:
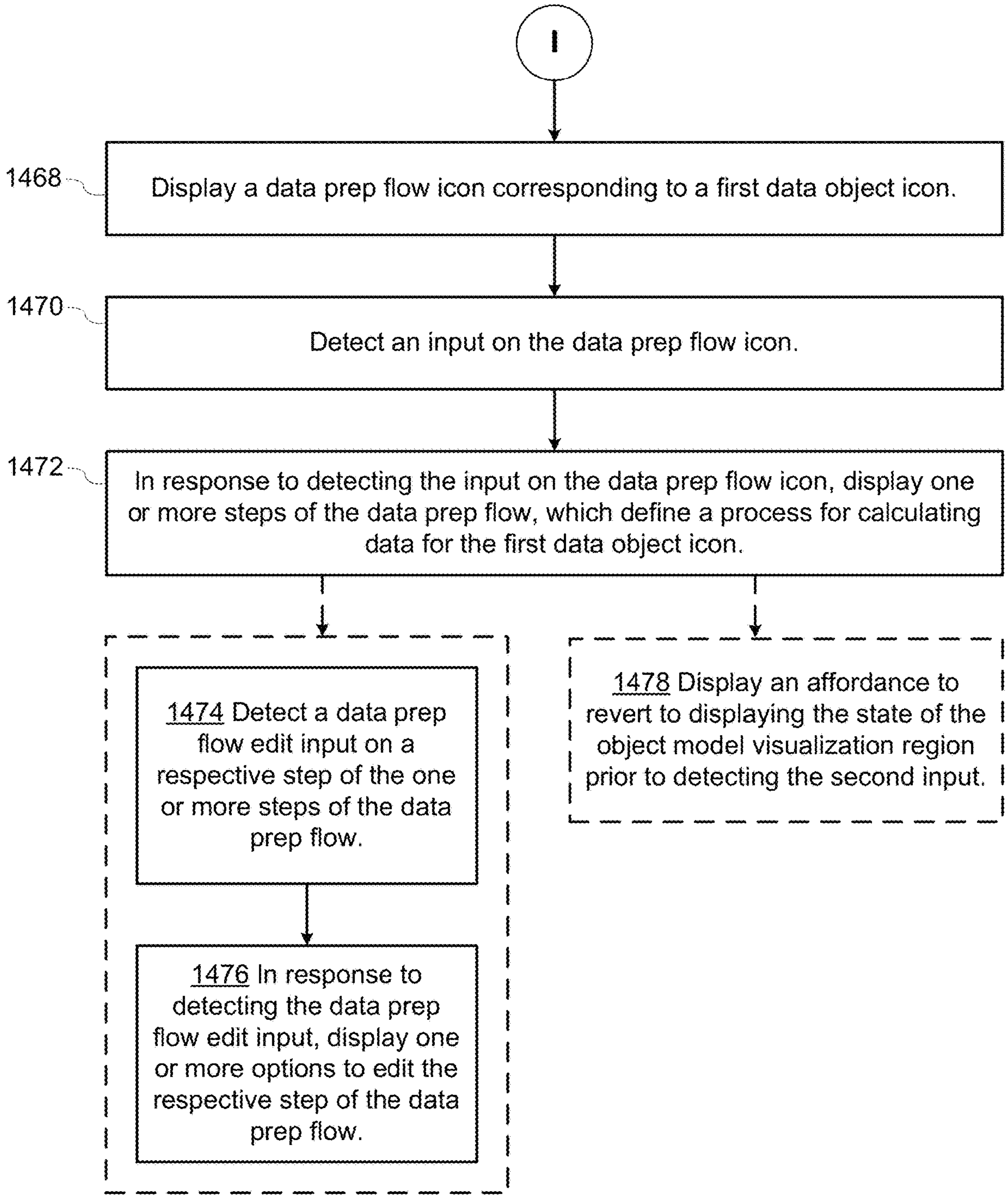

Referring next to FIG. 14J, in some implementations, the computer displays (1468) a data prep flow icon corresponding to a first data object icon, and detects (1470) an input on the data prep flow icon. In response to detecting the input on the data prep flow icon, the computer displays (1472) one or more steps of the data prep flow, which define a process for calculating data for the first data object icon. In some implementations, the computer detects (1474) a data prep flow edit input on a respective step of the one or more steps of data prep flow. In response to detecting the data prep flow edit input, the computer displays (1476) one or more options to edit the respective step of the data prep flow. In some implementations, the computer displays (1478) an affordance to revert to displaying the state of the object model visualization region prior to detecting the input on the prep flow icon.

Figure 15A:
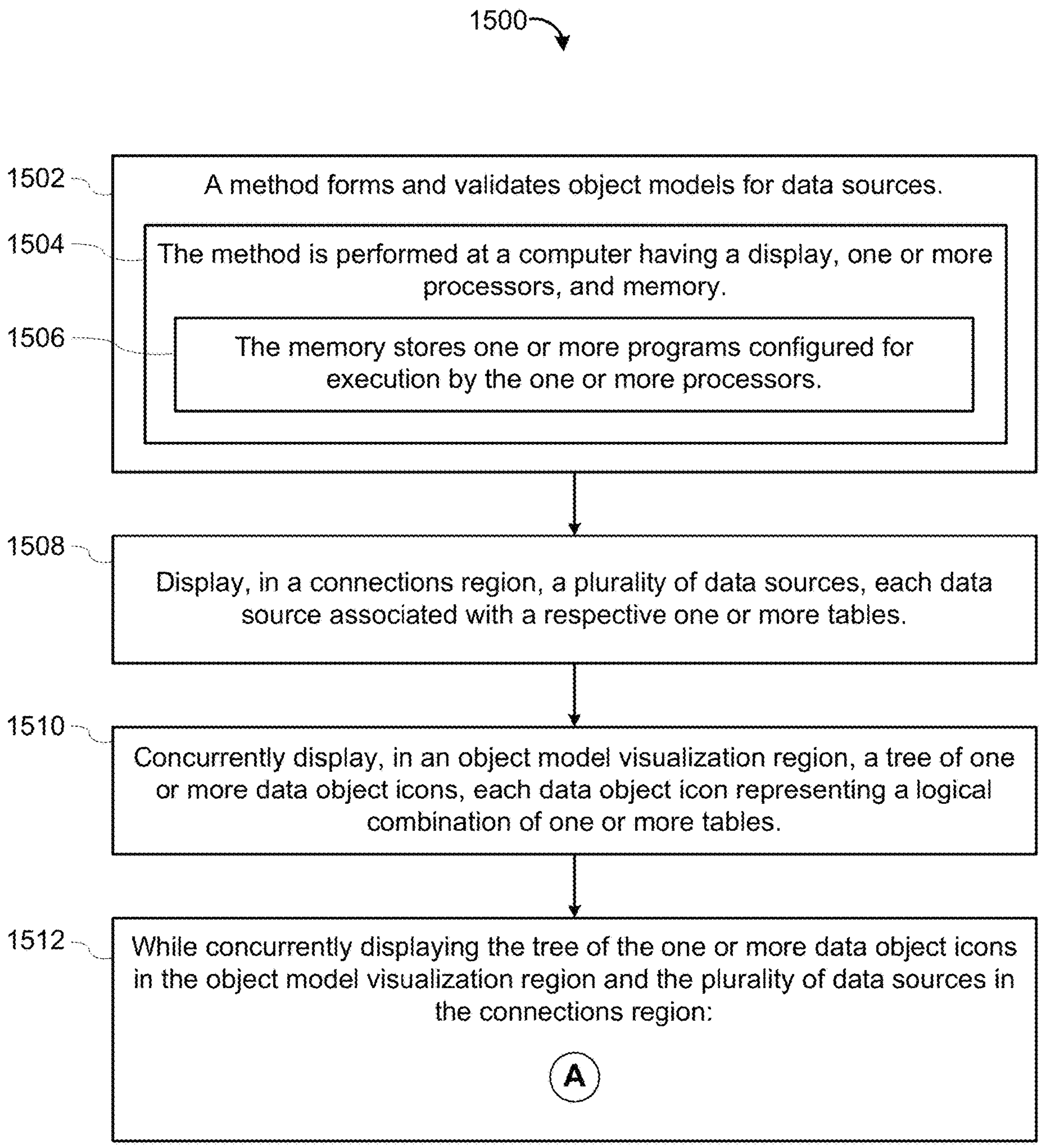
FIGS. 15A and 15B provide a flowchart of a method for forming and validating object models, in accordance with some implementations.
Figure 15B:
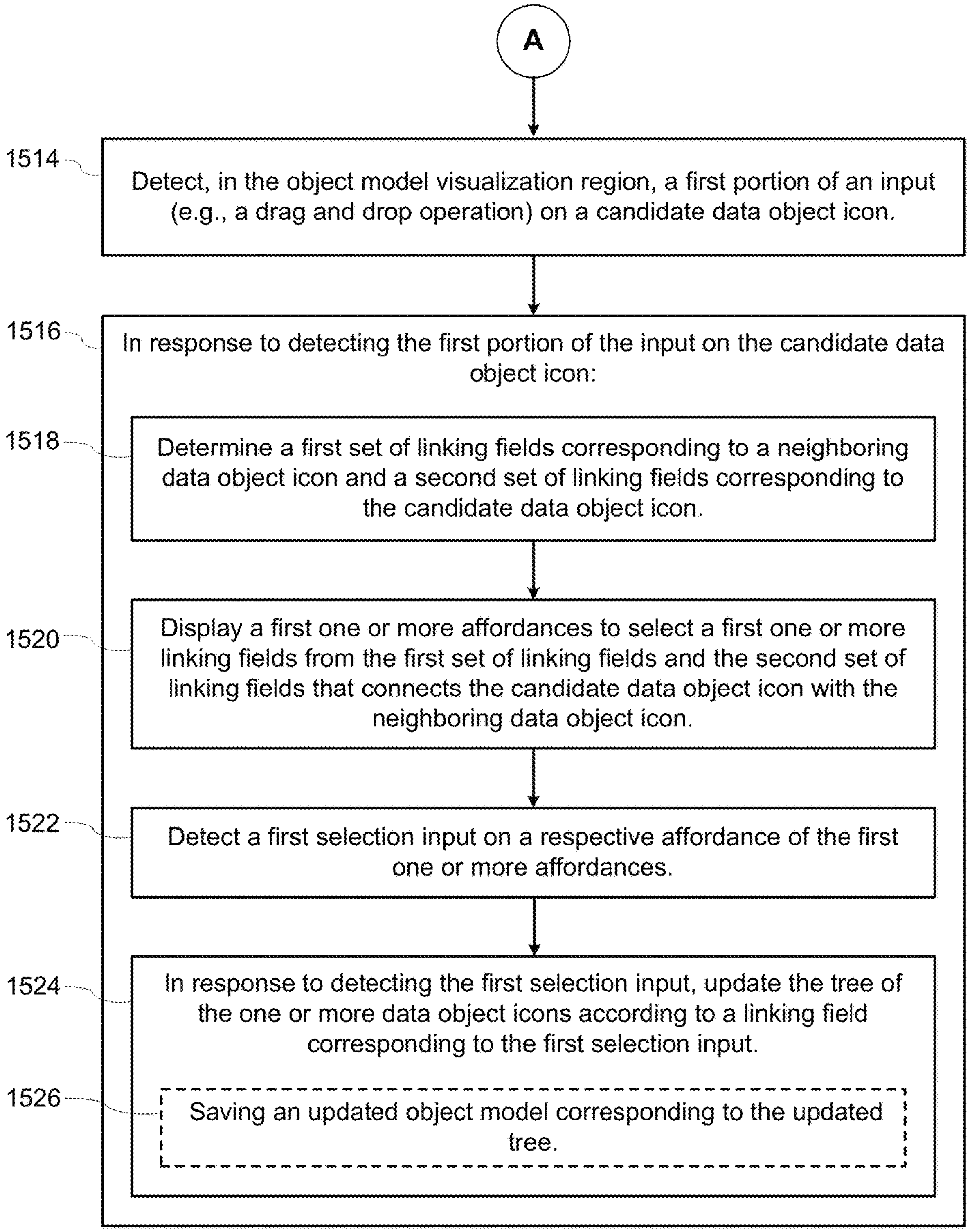

FIGS. 15A-15B provide a flowchart of a method 1500 for forming and validating (1502) object models according to the techniques described above, in accordance with some implementations. The method 1500 is performed (1504) at a computing device 200 having one or more processors and memory. The memory stores (1506) one or more programs configured for execution by the one or more processors.

The computer displays (1508), in a connections region (e.g., the region 318), a plurality of data sources. Each data source is associated (1508) with a respective one or more tables. The computer concurrently displays (1510), in an object model visualization region (e.g., the region 304), a tree of one or more data object icons (e.g., the object icons 320-2, . . . , 320-12 in FIG. 3). Each data object icon represents (1510) a logical combination of one or more tables. In some implementations, the displayed object model icons correspond to nodes in a stored object model 106. While concurrently displaying the tree of the one or more data object icons in the object model visualization region and the plurality of data sources in the connections region, the computer performs (1512) a sequence of operations.

Referring next to FIG. 15B, the computer detects (1514), in the object model visualization region, a first portion of an input on a candidate data object icon. In response (1516) to detecting the first portion of the input on the candidate data object icon, the computer determines (1518) a first set of linking fields corresponding to a neighboring data object icon and a second set of linking fields corresponding to the candidate data object icon. The computer also displays (1520) a first one or more affordances to select a first one or more linking fields from the first set of linking fields and the second set of linking fields that connects the candidate data object icon with the neighboring data object icon. The computer detects (1522) a first selection input on a respective affordance of the first one or more affordances. In response to detecting the first selection input, the computer updates (1524) the tree of the one or more data object icons according to a linking field corresponding to the first selection input. In some implementations, the computer saves an updated object model corresponding to the updated tree.

In some implementations, the computer displays an affordance to revert to displaying a state of the object model visualization region prior to detecting the input.

In some implementations, the input comprises a drag and drop operation.

In some implementations, the computer concurrently displays, in a data grid region, data fields corresponding to one or more data object icons. In some implementations, in response to detecting the first selection input, the computer updates the data grid region to include data fields corresponding to the candidate data object icon and the neighboring data object icon.

In some implementations, the one or more affordances include (i) a first affordance to select linking fields that are calculated using the first set of linking fields and (ii) a second affordance to select linking fields that are calculated using the second set of linking fields.

In some implementations, in response to detecting the first selection input and prior to updating the tree of the one or more data object icons, the computer displays a second one or more affordances to select a second one or more linking fields from the first set of linking fields and the second set of linking fields that connects the candidate data object icon with the neighboring data object icon. The computer also detects a second selection input on a respective affordance of the second one or more affordances. In response to detecting the second selection input, the computer updates the tree of the one or more data object icons according to a linking field corresponding to the second selection input. In some implementations, the computer stores an updated data model corresponding to the updated tree. In some implementations, the computer creates a new data source corresponding to one or more nodes in the updated object model.

In some implementations, in response to detecting the first selection input, the computer displays an indication of the number of records that match when using the linking field corresponding to the first selection input.

In some implementations, in response to detecting the first selection input, the computer displays an indication of the number of matching records that are unique and an indication of the number of matching records that are duplicates when using the linking field corresponding to the first selection input.

The terminology used in the description of the invention herein is for the purpose of describing particular implementations only and is not intended to be limiting of the invention. As used in the description of the invention and the appended claims, the singular forms "a," "an," and "the" are intended to include the plural forms as well, unless the context clearly indicates otherwise. It will also be understood that the term "and/or" as used herein refers to and encompasses any and all possible combinations of one or more of the associated listed items. It will be further understood that the terms "comprises" and/or "comprising," when used in this specification, specify the presence of stated features, steps, operations, elements, and/or components, but do not preclude the presence or addition of one or more other features, steps, operations, elements, components, and/or groups thereof.

The foregoing description, for purpose of explanation, has been described with reference to specific implementations. However, the illustrative discussions above are not intended to be exhaustive or to limit the invention to the precise forms disclosed. Many modifications and variations are possible in view of the above teachings. The implementations were chosen and described in order to best explain the principles of the invention and its practical applications, to thereby enable others skilled in the art to best utilize the invention and various implementations with various modifications as are suited to the particular use contemplated.

What is claimed is:

1. A method of forming and validating object models for data sources, comprising:

at an electronic device with a display:

displaying a tree of class icons, each class icon having a respective plurality of data fields from a selected data source;

while displaying the tree, detecting a first portion of a user input to place a candidate class icon adjacent to the tree;

in response to detecting the first portion of the user input:

(i) identifying a neighboring class icon in the tree nearest to the candidate class icon;

(ii) determining whether the candidate class icon overlaps a predefined revealer region larger than and containing the neighboring class icon;

(iii) when the candidate class icon overlaps the predefined revealer region, displaying an option to form a UNION;

(iv) when the candidate class icon does not overlap the predefined revealer region, displaying a tentative connector curve representing a JOIN; and (v) repeating steps (i)-(iv) in response to user movement of the candidate class icon;

detecting a second portion of the user input to complete placement of the candidate class icon;

when the second portion of the user input is detected inside the predefined revealer region, updating the tree to replace the neighboring class icon with a new class icon representing a UNION between the neighboring class icon and the candidate class icon; and when the second portion of the user input is detected while outside the predefined revealer region, displaying data field selection lists for the candidate class icon and the neighboring class icon, presenting options for user selection of JOIN fields.

2. The method of claim 1, further comprising displaying an affordance to revert to displaying a state of the tree prior to detecting the first portion of the user input.

3. The method of claim 1, wherein the user input comprises a drag and drop operation.

4. The method of claim 1, further comprising concurrently displaying, in a data grid region, data fields corresponding to one or more class icons in the tree.

5. The method of claim 4, further comprising, while displaying the data field selection lists, updating the data grid region to include data fields corresponding to the candidate class icon and the neighboring class icon.

6. The method of claim 1, wherein the data field selection lists enable user selection of two or more data fields from each of the class icons.

7. The method of claim 1, further comprising, in response to user selection of JOIN fields, displaying an indication of a number of records that match when using the selected JOIN fields.

8. The method of claim 1, further comprising, in response to user selection of JOIN fields, displaying an indication of a number of matching records that are unique and an indication of a number of matching records that are duplicates when using the selected JOIN fields.

9. A computer system for forming and validating object models for data sources, comprising:

a display;

one or more processors; and memory;

wherein the memory stores one or more programs configured for execution by the one or more processors, and the one or more programs comprise instructions for:

displaying a tree of class icons, each class icon having a respective plurality of data fields from a selected data source;

while displaying the tree, detecting a first portion of a user input to place a candidate class icon adjacent to the tree;

in response to detecting the first portion of the user input:

(i) identifying a neighboring class icon in the tree nearest to the candidate class icon;

(ii) determining whether the candidate class icon overlaps a predefined revealer region larger than and containing the neighboring class icon;

(iii) when the candidate class icon overlaps the predefined revealer region, displaying an option to form a UNION;

(iv) when the candidate class icon does not overlap the predefined revealer region, displaying a tentative connector curve representing a JOIN; and (v) repeating steps (i)-(iv) in response to user movement of the candidate class icon;

detecting a second portion of the user input to complete placement of the candidate class icon;

when the second portion of the user input is detected inside the predefined revealer region, updating the tree to replace the neighboring class icon with a new class icon representing a UNION between the neighboring class icon and the candidate class icon; and when the second portion of the user input is detected outside the predefined revealer region, displaying data field selection lists for the candidate class icon and the neighboring class icon, presenting options for user selection of JOIN fields.

10. The computer system of claim 9, wherein the one or more programs further comprise instructions for displaying an affordance to revert to displaying a state of the tree prior to detecting the first portion of the user input.

11. The computer system of claim 9, wherein the user input comprises a drag and drop operation.

12. The computer system of claim 9, wherein the one or more programs further comprise instructions for concurrently displaying, in a data grid region, data fields corresponding to one or more class icons in the tree.

13. The computer system of claim 12, wherein the one or more programs further comprise instructions for, while displaying the data field selection lists, updating the data grid region to include data fields corresponding to the candidate class icon and the neighboring class icon.

14. The computer system of claim 9, wherein the data field selection lists enable user selection of two or more data fields from each of the class icons.

15. The computer system of claim 9, wherein the one or more programs further comprise instructions for, in response to user selection of JOIN fields, displaying an indication of a number of records that match when using the selected JOIN fields.

16. The computer system of claim 9, wherein the one or more programs further comprise instructions for, in response to user selection of JOIN fields, displaying an indication of a number of matching records that are unique and an indication of a number of matching records that are duplicates when using the selected JOIN fields.

17. A non-transitory computer readable storage medium storing one or more programs configured for execution by a computer system having a display, one or more processors, and memory, the one or more programs comprising instructions for:

displaying a tree of class icons, each class icon having a respective plurality of data fields from a selected data source;

while displaying the tree, detecting a first portion of a user input to place a candidate class icon adjacent to the tree;

in response to detecting the first portion of the user input:

(i) identifying a neighboring class icon in the tree nearest to the candidate class icon;

(ii) determining whether the candidate class icon overlaps a predefined revealer region larger than and containing the neighboring class icon;

(iii) when the candidate class icon overlaps the predefined revealer region, displaying an option to form a UNION;

(iv) when the candidate class icon does not overlap the predefined revealer region, displaying a tentative connector curve representing a JOIN; and (v) repeating steps (i)-(iv) in response to user movement of the candidate class icon;

detecting a second portion of the user input to complete placement of the candidate class icon;

when the second portion of the user input is detected inside the predefined revealer region, updating the tree to replace the neighboring class icon with a new class icon representing a UNION between the neighboring class icon and the candidate class icon; and when the second portion of the user input is detected outside the predefined revealer region, displaying data field selection lists for the candidate class icon and the neighboring class icon, presenting options for user selection of JOIN fields.

18. The computer readable storage medium of claim 17, wherein the one or more programs further comprise instructions for:

concurrently displaying, in a data grid region, data fields corresponding to one or more class icons; and while displaying the data field selection lists, updating the data grid region to include data fields corresponding to the candidate class icon and the neighboring class icon.

* * * * *